US012538470B2

(12) United States Patent
Ma et al.

(10) Patent No.: US 12,538,470 B2
(45) Date of Patent: Jan. 27, 2026

(54) STRUCTURES AND METHODS FOR MEMORY CELLS

(71) Applicant: Intel Corporation, Santa Clara, CA (US)

(72) Inventors: Sean T. Ma, Portland, OR (US); Aaron D. Lilak, Beaverton, OR (US); Abhishek A. Sharma, Hillsboro, OR (US); Van H. Le, Beaverton, OR (US); Seung Hoon Sung, Portland, OR (US); Gilbert W. Dewey, Beaverton, OR (US); Benjamin Chu-Kung, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 551 days.

(21) Appl. No.: 17/981,561

(22) Filed: Nov. 7, 2022

(65) Prior Publication Data

US 2023/0057464 A1 Feb. 23, 2023

Related U.S. Application Data

(63) Continuation of application No. 16/124,877, filed on Sep. 7, 2018, now Pat. No. 11,538,808.

(51) Int. Cl.

| | |
|---|---|
| ***H01L 27/108*** | (2006.01) |
| ***H01L 21/822*** | (2006.01) |
| ***H01L 23/528*** | (2006.01) |
| ***H01L 29/06*** | (2006.01) |
| ***H01L 49/02*** | (2006.01) |
| ***H10B 12/00*** | (2023.01) |
| ***H10D 1/68*** | (2025.01) |
| ***H10D 62/10*** | (2025.01) |
| ***H10D 84/03*** | (2025.01) |
| ***H10D 88/00*** | (2025.01) |

(Continued)

(52) U.S. Cl.

CPC ........... *H10B 12/30* (2023.02); *H01L 23/528* (2013.01); *H10B 12/03* (2023.02); *H10B 12/05* (2023.02); *H10B 12/482* (2023.02); *H10B 12/488* (2023.02); *H10D 1/714* (2025.01); *H10D 62/115* (2025.01); *H10D 84/038* (2025.01); *H10D 88/01* (2025.01); *H01L 21/0228* (2013.01); *H10D 64/021* (2025.01)

(58) Field of Classification Search

CPC ... H10B 12/30; H10B 12/02; H10D 88/00–01

See application file for complete search history.

(56) References Cited

U.S. PATENT DOCUMENTS

| | | | |
|---|---|---|---|
| 9,698,272 | B1 | 7/2017 | Ikeda et al. |
| 9,842,839 | B1 | 12/2017 | Sills et al. |
| 2010/0052029 | A1 | 3/2010 | Huang |

(Continued)

*Primary Examiner* — John A Bodnar

(74) *Attorney, Agent, or Firm* — Akona IP PC

(57) ABSTRACT

Disclosed herein are memory cells and memory arrays, as well as related methods and devices. For example, in some embodiments, a memory device may include: a support having a surface; and a three-dimensional array of memory cells on the surface of the support, wherein individual memory cells include a transistor and a capacitor, and a channel of the transistor in an individual memory cell is oriented parallel to the surface.

20 Claims, 75 Drawing Sheets

(51) Int. Cl.
*H01L 21/02* (2006.01)
*H10D 64/01* (2025.01)

(56) References Cited

U.S. PATENT DOCUMENTS

| | | | |
|---|---|---|---|
| 2015/0279842 | A1 | 10/2015 | Komeda |
| 2017/0221884 | A1* | 8/2017 | Machkaoutsan ..... H10D 84/038 |
| 2019/0074277 | A1* | 3/2019 | Ramaswamy ......... H10B 99/00 |
| 2020/0185385 | A1 | 6/2020 | Juengling |
| 2021/0202485 | A1 | 7/2021 | Inaba |
| 2021/0296556 | A1 | 9/2021 | Hsu et al. |
| 2022/0189913 | A1 | 6/2022 | Atanasov et al. |
| 2022/0189957 | A1 | 6/2022 | Atanasov et al. |

* cited by examiner

STRUCTURES AND METHODS FOR MEMORY CELLS

CROSS-REFERENCE TO RELATED APPLICATIONS

This application is a continuation (and claims the benefit of priority under 35 U.S.C. § 120) of U.S. patent application Ser. No. 16/124,877, filed Sep. 7, 2018, and titled "STRUCTURES AND METHODS FOR MEMORY CELLS," the disclosure of which is incorporated by reference herein in its entirety.

BACKGROUND

Some memory cells may include a capacitor whose charge state (i.e., charged or discharged) indicates the bit stored in the cell (i.e., a '0' or '1').

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
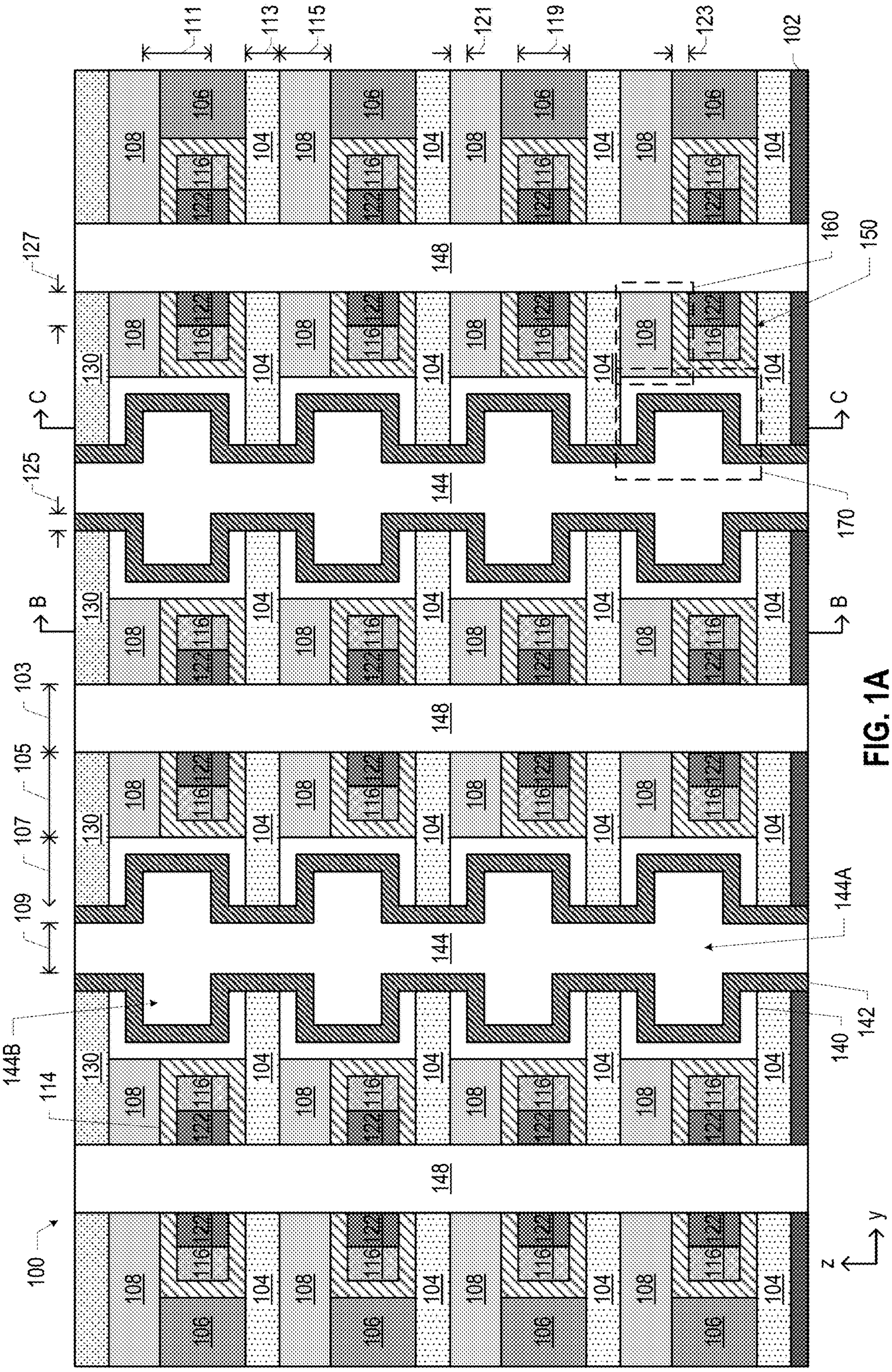
FIGS. 1A-1F are various views of a memory array, in accordance with various embodiments.
Figure 1B:
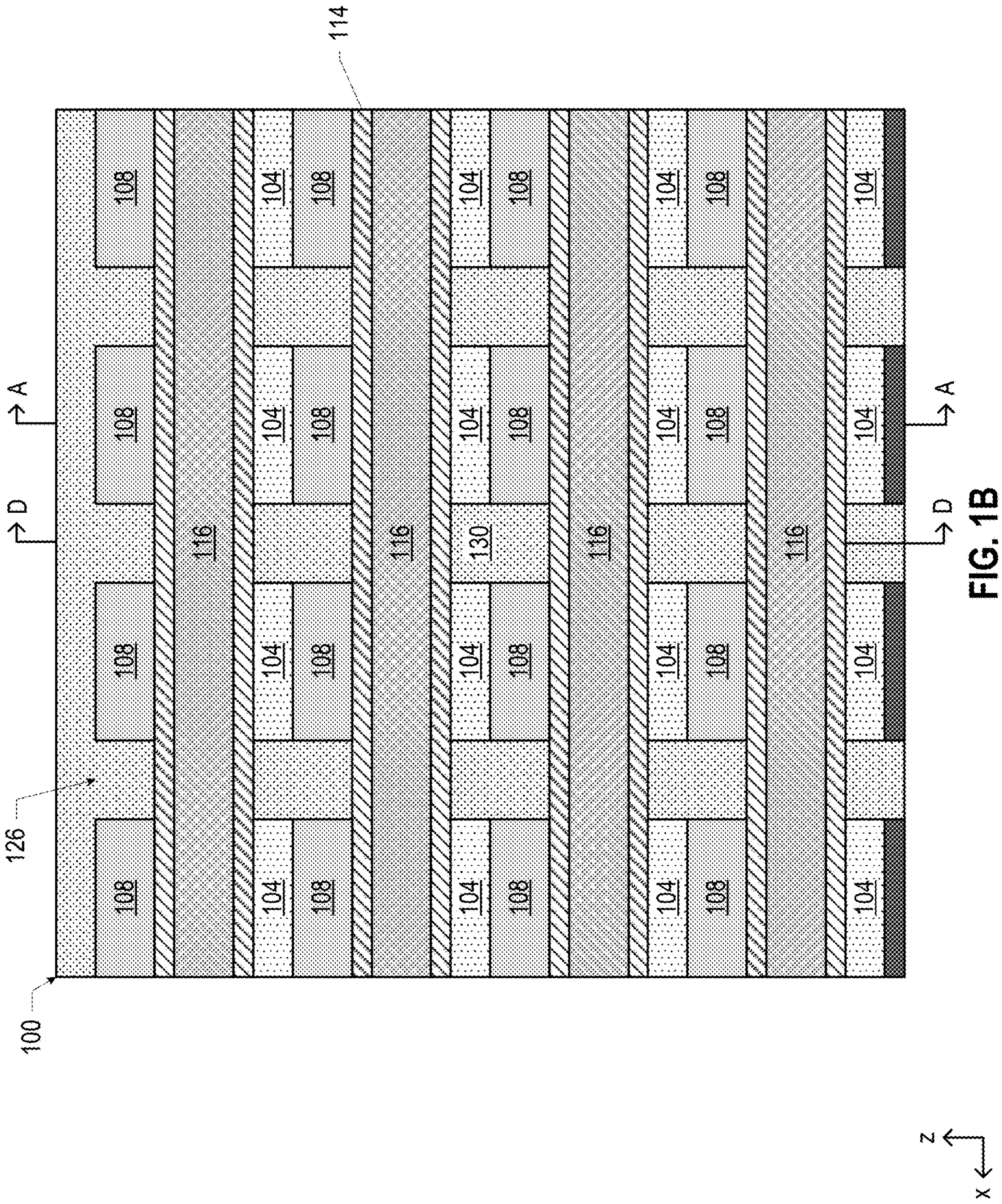
Figure 1C:
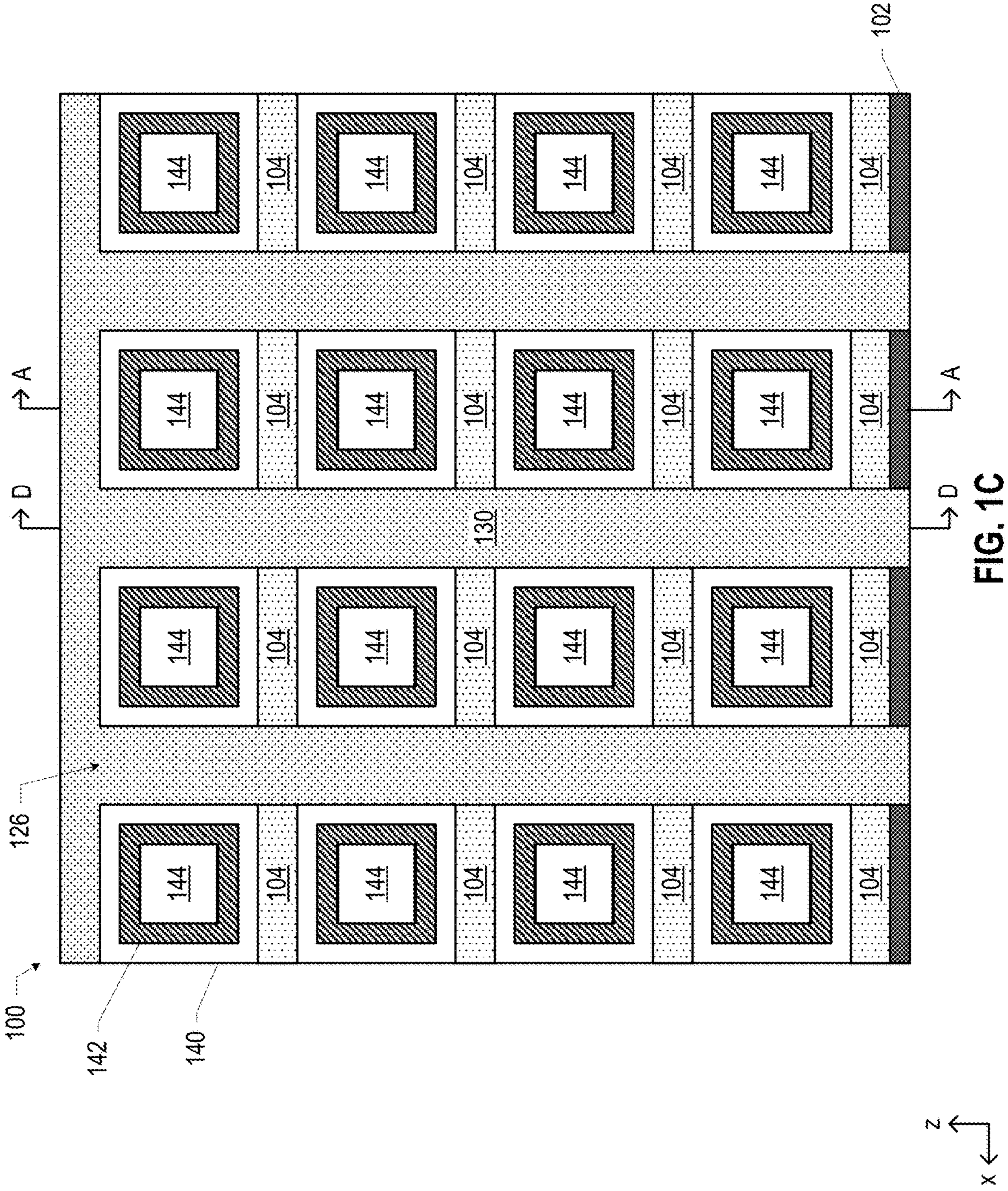
Figure 1D:
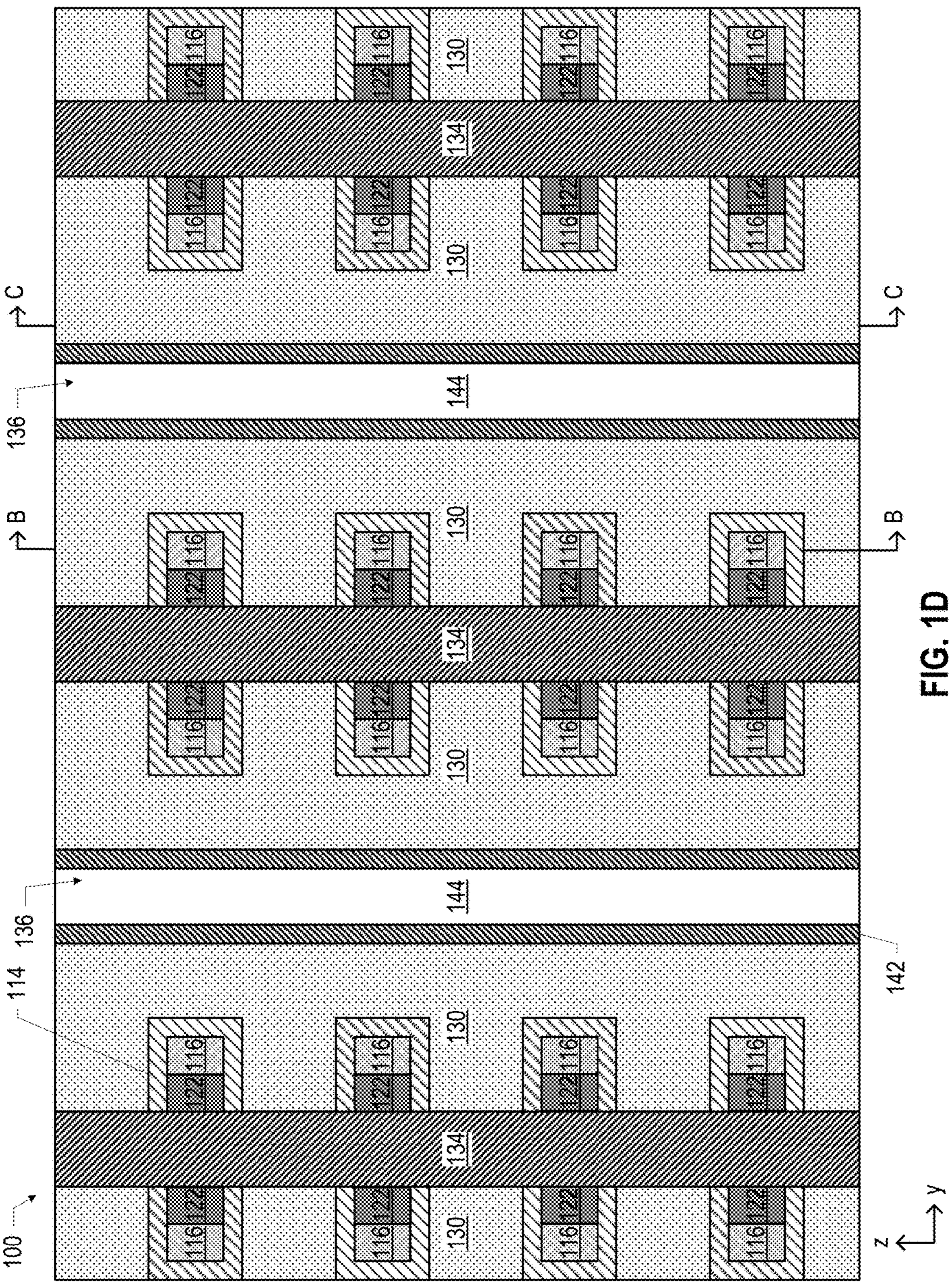

Disclosed herein are memory cells and memory arrays, as well as related methods and devices. For example, in some embodiments, a memory device may include: a support having a surface; and a three-dimensional array of memory cells on the surface of the support, wherein individual memory cells include a transistor and a capacitor, and a channel of the transistor in an individual memory cell is oriented parallel to the surface.

Different types of conventional memory devices may exhibit different relative strengths and weaknesses. For example, some conventional dynamic random access memory (DRAM) devices may achieve a higher read/write speed than 3D NAND devices, but may have a smaller achievable packing density (the number of memory cells per unit of volume). Some of these DRAM devices include memory cells having one transistor and one capacitor oriented and arranged vertically with respect to an underlying substrate. In such devices, the channel of the transistor is oriented vertically (i.e., perpendicular to a surface of an underlying support), and thus increases in x-y density may be achieved without having to reduce the length of the channel. However, such designs have been limited in their manufacturability; many stacks of such memory cells cannot be practically stacked due to constraints and costs associated with lithography, alignment tolerances, and the complexity of manufacturing process integration.

Disclosed herein are memory arrays in which a memory cell includes a transistor and a capacitor arranged horizontally (e.g., the channel of the transistor is oriented parallel to a surface of an underlying support), and methods of manufacturing such memory arrays that exhibit significantly reduced integration complexity relative to some existing methods. As discussed further below, the memory arrays disclosed herein may be manufactured using many uniformly deposited stacks of three high etch-selectivity layers, selective cavity etches, and cavity fills, along with readily performable photolithographic patterning operations, to form as many tiers of "horizontal" memory cells as desired. The memory arrays disclosed herein may exhibit a greater packing density than achievable in conventional DRAM devices (approaching or exceeding the packing density of 3D NAND devices, for example) while preserving the fast read/write speed of DRAM.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1F, the phrase "FIG. 2" may be used to refer to the collection of drawings of FIGS. 2A-2B, etc. As used herein, two or more materials are said to be "etch-selective" or to have "sufficient etch selectivity" when etchants used to etch one material do not substantially etch another, enabling selective etching of one material but not another.

FIG. 1 illustrates an example memory array 100 from a variety of perspectives. FIG. 1A represents a side, cross-sectional view through the section A-A of the other sub-figures, FIG. 1B represents a side, cross-sectional view through the section B-B of the other sub-figures, FIG. 1C represents a side, cross-sectional view through the section C-C of the other sub-figures, FIG. 1D represents a side, cross-sectional view through the section D-D of the other sub-figures, FIG. 1E represents a top view, and FIG. 1F includes the view of FIG. 1A with circuit symbols super-imposed on various structures to indicate the functional structure of the memory array 100.

The memory array 100 may include a three-dimensional array of memory cells 150 on a surface of the support 102. Each memory cell 150 may include a transistor 160 and a capacitor 170; the memory cells 150 of FIG. 1 may thus be referred to as one transistor-one capacitor (1T-1C) memory cells, and may be examples of DRAM cells (in which the bit value stored in a memory cell is represented by whether the capacitor is charged or discharged). The memory cells 150 may be arranged in columns (extending in the z-direction) and rows (extending in the x-direction). Adjacent memory cells 150 in a particular column may be spaced apart by an isolation material 104, and adjacent memory cells 150 in a particular row may be spaced apart by an isolation material 130, as shown. The memory cells 150 in a particular column may share a bit line 148; as discussed further below, the bit line 148 may be electrically coupled to a source/drain end of the transistor 160 in an associated memory cell 150. Further, each bit line 148 may be shared by memory cells 150 in two adjacent columns (arranged in a mirror-image manner around the bit line 148 in the y-direction, as shown in FIG. 1A); thus, the number of memory cells 150 per bit line 148 is twice the number of memory cells 150 in a particular column of memory cells 150. Multiple different bit lines in an array of bit lines that extends in the x-direction may be spaced apart from each other by an isolation material 134.

The transistor 160 and the capacitor 170 of a particular memory cell 150 may be arranged "side-by-side" in the y-direction. In particular, the channel 108 of the transistor 160 may be oriented parallel to the Y-axis, extending between the capacitor 170 of the memory cell 150 and an associated bit line 148. As shown in FIG. 1, the channel 108 of a transistor 160 of a memory cell 150 may be oriented perpendicular to the associated bit line 148 (which may extend in the z-direction).

The transistor 160 of a memory cell 150 may be gated by an associated (e.g., a voltage applied to a particular word line 116 may control the longitudinal conductivity of the channel 108 of an associated transistor 160, as known in the art). The word line 116 may be oriented perpendicular to the longitudinal direction of the channel 108 of a memory cell 150, and also perpendicular to the bit line 148 associated with the memory cell 150; in FIG. 1, the word lines 116 extend in the x-direction. The memory cells 150 in a particular row may share a word line 116 (i.e., the word line 116 may gate the transistors 160 of the memory cells 150 in an associated row).

A word line 116 may be spaced apart from a proximate bit line 148 by a spacer 122, and may be spaced apart from the channel 108 of an associated transistor 160 by an intervening gate dielectric 114. As shown in FIG. 1A, an individual portion of the gate dielectric 114 may have a C-shaped cross-section, wrapping around the word line 116 and the adjacent spacer 122. A continuous portion of the gate dielectric 114 may be disposed between a spacer 122 and an associated proximate channel 108, a word line 116 and the proximate channel 108, the word line 116 and the associated capacitor 170 (discussed further below), the word line 116 and the underlying isolation material 104, and the spacer 122 and the underlying isolation material 104.

An isolation material 106 may be present at the perimeter of the memory array 100, proximate to the gate dielectric 114. This isolation material 106 may be disposed between a "channel 108" and a portion of the isolation material 104; although labeled as a "channel 108" in the accompanying drawings, the channels 108 at the perimeter of the memory array 100 may be a dummy channels, sharing a material composition with the channels 108 of the memory cells 150 but not serving as a part of a transistor 160 used in a memory cell 150. Similarly, the "word lines 116" proximate to these dummy channels 108 at the perimeter of the memory array 100 may be dummy word lines, sharing a material composition with the active word lines 116 associated with various ones of the memory cells 150, but not serving as functional word lines during the operation of the memory array 100.

As noted above, each memory cell 150 may include a capacitor 170. The capacitor 170 in a particular memory cell 150 may include a first capacitor plate 140, a second capacitor plate 144, and a capacitor dielectric 142 between the first capacitor plate 140 and the second capacitor plate 144. The first capacitor plate 140 of a capacitor 170 in a memory cell 150 may be electrically coupled to a source/drain end of the transistor 160 (the opposite source/drain and to which the bit line 148 is electrically coupled). Each different memory cell 150 in a particular column (row) may have a different first capacitor plate 140 as part of its capacitor 170, but may share the second capacitor plate 144 with the capacitors 170 of the other memory cells 150 in that particular column (row). The first capacitor plates 140 may have a C-shaped cross-section, as illustrated in FIG. 1A. The second capacitor plate 144 may have a trunk portion 144A and multiple branch portions 144B. Each branch portion 144B may extend laterally from the trunk portion 144A and may extend into the "pocket" provided by an associated first capacitor plate 140 (with a layer of the capacitor dielectric 142 therebetween). Branch portions 144B may be distributed in a mirror-image manner around the central x-z plane of the trunk portion 144A, as shown.

Figure 1E:
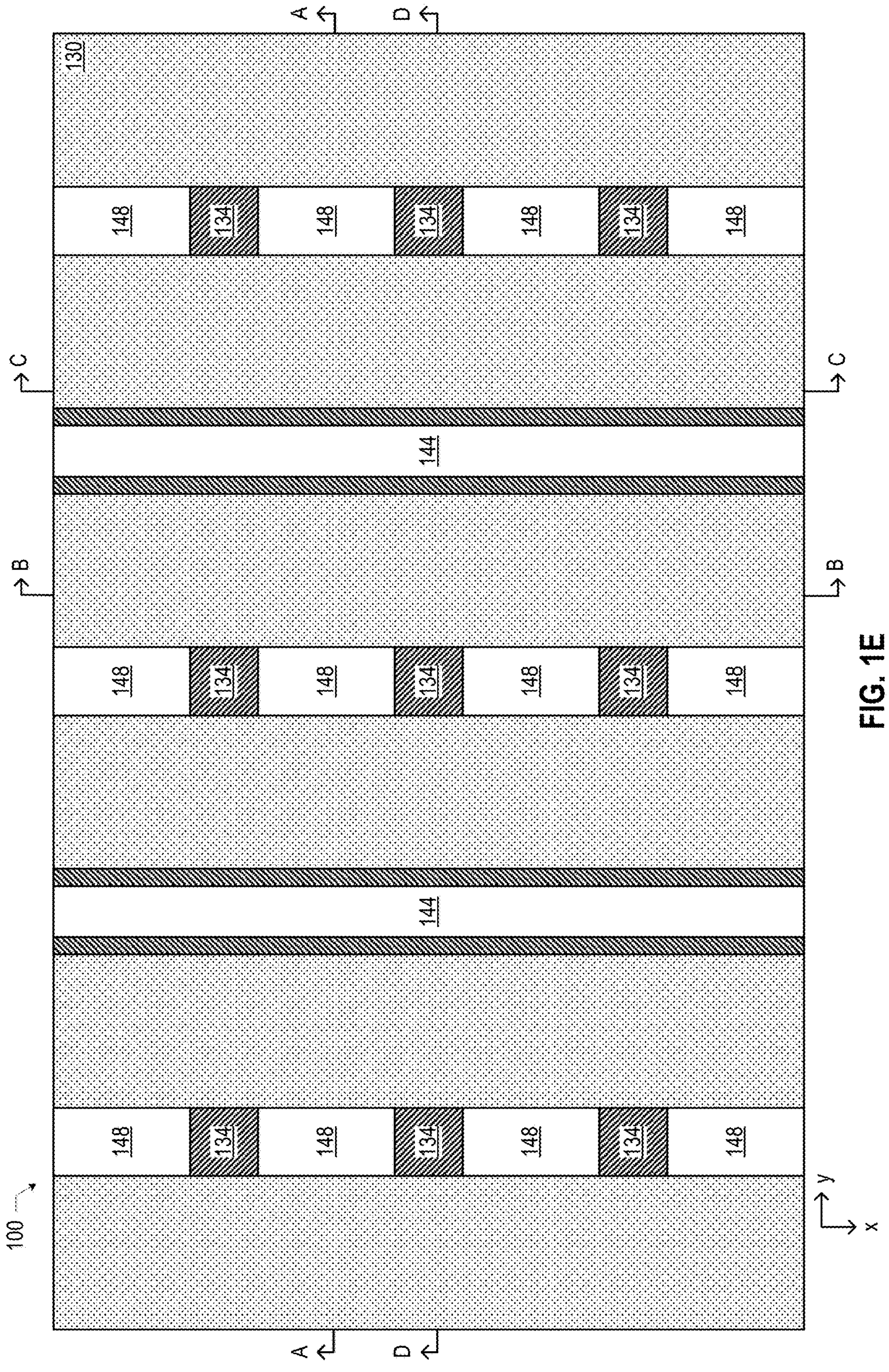
Figure 1F:
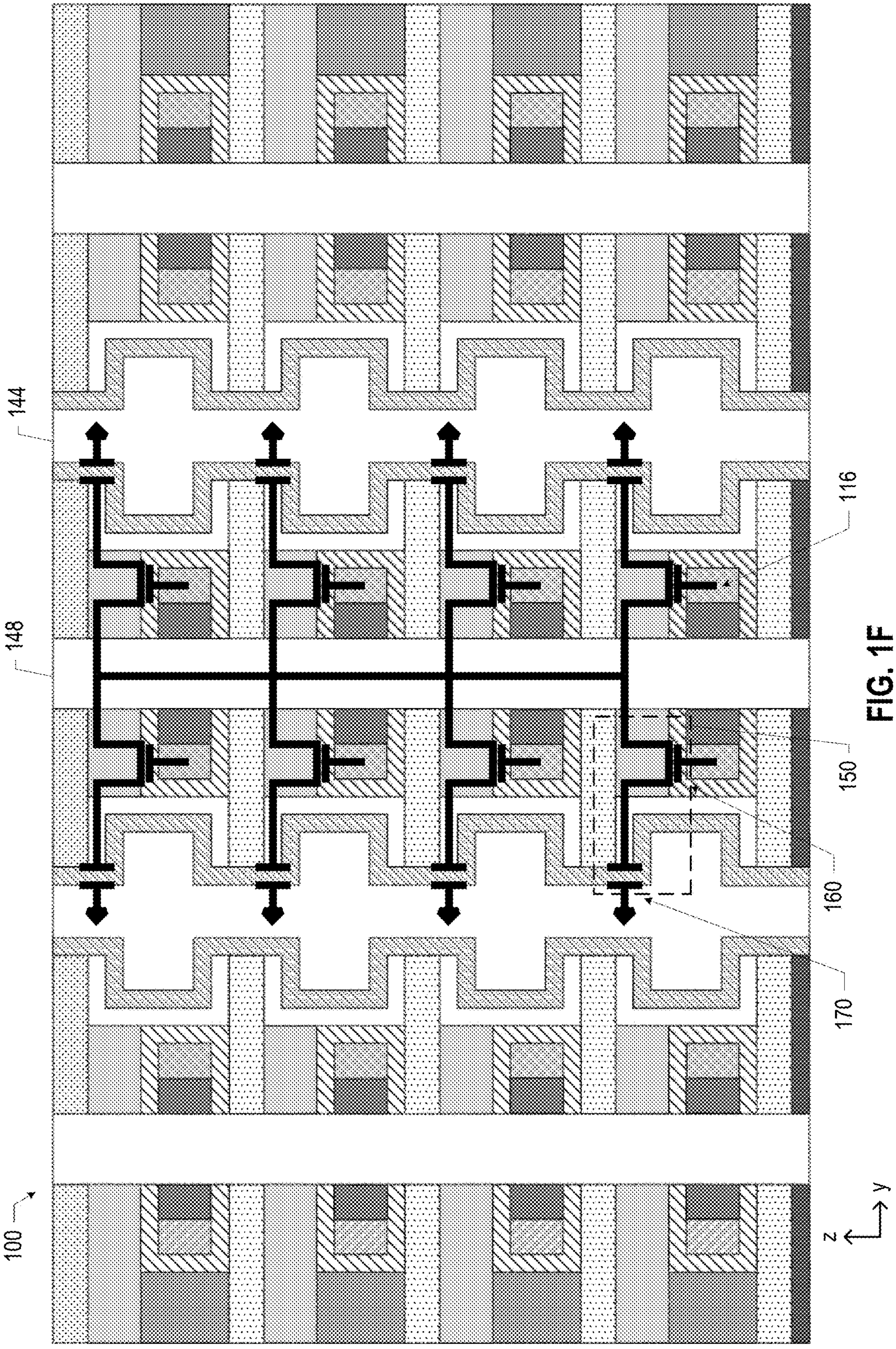

The capacitor dielectric 142 of a capacitor 170 in a particular memory cell 150 may be materially continuous with the capacitor dielectric 142 of the capacitors 170 of the memory cells 150 sharing a row or column with the particular memory cell 150. In some embodiments, the second capacitor plate 144 may be grounded during operation. FIG. 1E depicts the view of FIG. 1A with circuit symbols superimposed, illustrating how the memory array 100 may be operated.

FIG. 1 depicts the memory array 100 is disposed on a surface of a support 102. As used herein, a "support" may refer to any underlying structural materials on which the memory array 100 is disposed. In some embodiments, the memory array 100 may be part of the device layer of an integrated circuit (IC) device (e.g., the device layer 1604 of the IC device 1600 of FIG. 26, discussed below); in some such "front-end" embodiments, the support 102 may include a semiconductor or other material substrate (e.g., the substrate 1602 of FIG. 26), and the axis of the channel 108 of the transistor 160 may be oriented parallel to the surface of the substrate. In some embodiments, the memory array 100 may be disposed in a metallization stack of an IC device (e.g., the metallization stack 1619 of the IC device 1600 of FIG. 26); in some such "back-end" embodiments, the support 102 may include a semiconductor or other material substrate, a device layer, as well as one or more layers of the metallization stack, and the axis of the channel 108 of the transistor 160 may be oriented parallel to the plane of a layer of the metallization stack.

As shown in FIG. 1, the transistor 160 and the capacitor 170 of a particular memory cell 150 may be distributed along the y-direction, with the axis of the channel 108 of the transistor 160 oriented parallel to the surface of the support 102. As discussed above, this arrangement may be in contrast to previous DRAM structures, in which the channel of a transistor of a memory cell may be oriented in the z-direction.

The dimensions of the elements of the memory arrays 100 disclosed herein may take any suitable values. In some embodiments, a width 103 of a bit line 148 may be between 10 nanometers and 50 nanometers. In some embodiments, a length 105 of a channel 108 may be between 30 nanometers and 100 nanometers. In some embodiments, a width 107 of a first capacitor plate 140 (as indicated in FIG. 1A) may be between 50 nanometers and 400 nanometers (e.g., between 100 nanometers and 400 nanometers). In some embodiments, a width 109 of a trunk portion 144A of a second capacitor plate 144 may be between 1 nanometer and 20 nanometers. In some embodiments, a height 111 of a branch portion 144B of a second capacitor plate 144 may be between 10 nanometers and 100 nanometers. In some embodiments, a height 113 of the isolation material 104 may be between 10 nanometers and 20 nanometers. In some embodiments, a height 115 of the channel 108 may be between 5 nanometers and 50 nanometers. In some embodiments, a thickness 121 of a first capacitor plate 140 may be between 2 nanometers and 5 nanometers. In some embodiments, the height 119 of a word line 116 (or a spacer 122) may be between 5 nanometers and 20 nanometers. In some embodiments, a thickness 123 of a gate dielectric 114 may be between 2 nanometers and 20 nanometers. In some embodiments, a thickness 125 of the capacitor dielectric 142 may be between 2 nanometers and 5 nanometers. In some embodiments, a width 127 of a spacer 122 may be between 5 nanometers and 20 nanometers.

The elements of the memory arrays 100 disclosed herein may include any suitable materials. In some embodiments, the channel 108 may be formed of a thin film material. Some such materials may be deposited at relatively low temperatures, which makes them depositable within the thermal budgets imposed on back-end fabrication to avoid damaging the front-end components. In some embodiments, the channel 108 may be formed of an amorphous, polycrystalline, or crystalline semiconductor, or an amorphous, polycrystalline, or crystalline semiconducting oxide. In some embodiments, the channel 108 may be formed of an amorphous, polycrystalline, or crystalline group III-V material; amorphous, polycrystalline, or crystalline silicon; amorphous, polycrystalline, or crystalline germanium; amorphous, polycrystalline, or crystalline silicon germanium; amorphous, polycrystalline, or crystalline gallium arsenide; amorphous, polycrystalline, or crystalline indium antimonide; amorphous, polycrystalline, or crystalline indium gallium arsenide; amorphous, polycrystalline, or crystalline gallium antimonide; amorphous, polycrystalline, or crystalline tin oxide; amorphous, polycrystalline, or crystalline indium gallium oxide (IGO); or amorphous, polycrystalline, or crystalline indium gallium zinc oxide (IGZO).

The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, the gate dielectric 114 may be a multilayer gate dielectric including multiple different materials.

The spacers 122 may be formed of any suitable material, such as a carbon-doped oxide, silicon nitride, silicon oxide, or other carbides or nitrides (e.g., silicon carbide, silicon nitride doped with carbon, and silicon oxynitride). The word lines 116, the bit lines 148, the first capacitor plates 140, and the second capacitor plates 144 may be formed of any suitable conductive material, such as a metal (e.g., copper, cobalt, tungsten, titanium, aluminum, ruthenium, etc.). The capacitor dielectric 142 may include any of the materials discussed above with reference to the gate dielectric 114. For example, in some embodiments, the capacitor dielectric 142 may include hafnium oxide or aluminum oxide. The isolation materials 104, 106, 130, and 134 may include any suitable electrical insulators (e.g., that may be selectively etched, as discussed below with reference to FIGS. 2-22), such as any suitable oxide or nitride. In some embodiments, the isolation material 104 may be an interlayer dielectric (ILD) material, which may be doped or undoped.

Although a particular number of memory cells 150, and arrangement of those memory cells 150, as illustrated in FIG. 1, a memory array 100 may include any suitable number and arrangement of memory cells 150. For example, in some embodiments, a memory array 100 may include between 20 and 64 memory cells in a column of memory cells. In some embodiments, a memory array 100 may include columns arranged in a 16 by 16, 32 by 32, or other array.

FIGS. 2-22 illustrate stages in an example process of manufacturing the memory array 100 of FIG. 1, in accordance with various embodiments. In FIGS. 2-22, the "A" sub-figures represent a side, cross-sectional view through the section A-A of the other sub-figures, the "B" sub-figures represent a side, cross-sectional view through the section B-B of the other sub-figures, the "C" sub-figures (when present) represent a side, cross-sectional view through the section C-C of the other sub-figures, the "D" sub-figures (when present) represent a side, cross-sectional view through the section D-D of the other sub-figures, and the "E" sub-figures (when present) represent a top view. The A, B, C, D, and E sub-figures of FIGS. 2-22 are analogous to the A, B, C, D, and E sub-figures of FIG. 1, respectively. When no "A" sub-figure is present (e.g., in FIGS. 7-10), the figure represents a side, cross-sectional view through the section A-A. The elements of FIGS. 2-22 may take the form of any of the embodiments of those elements disclosed herein (e.g., material compositions, dimensions, etc.). Reference numerals previously discussed above with reference to particular elements of FIG. 1 may be used below with reference to FIGS. 2-22 to refer to the materials used to form these elements, for ease of exposition. For example, reference may be made below to a "channel material 108"; subsequent to the manufacturing operations discussed below, the "channel material 108" may be formed into the channels 108 discussed above with reference to FIG. 1.

Figure 2A:
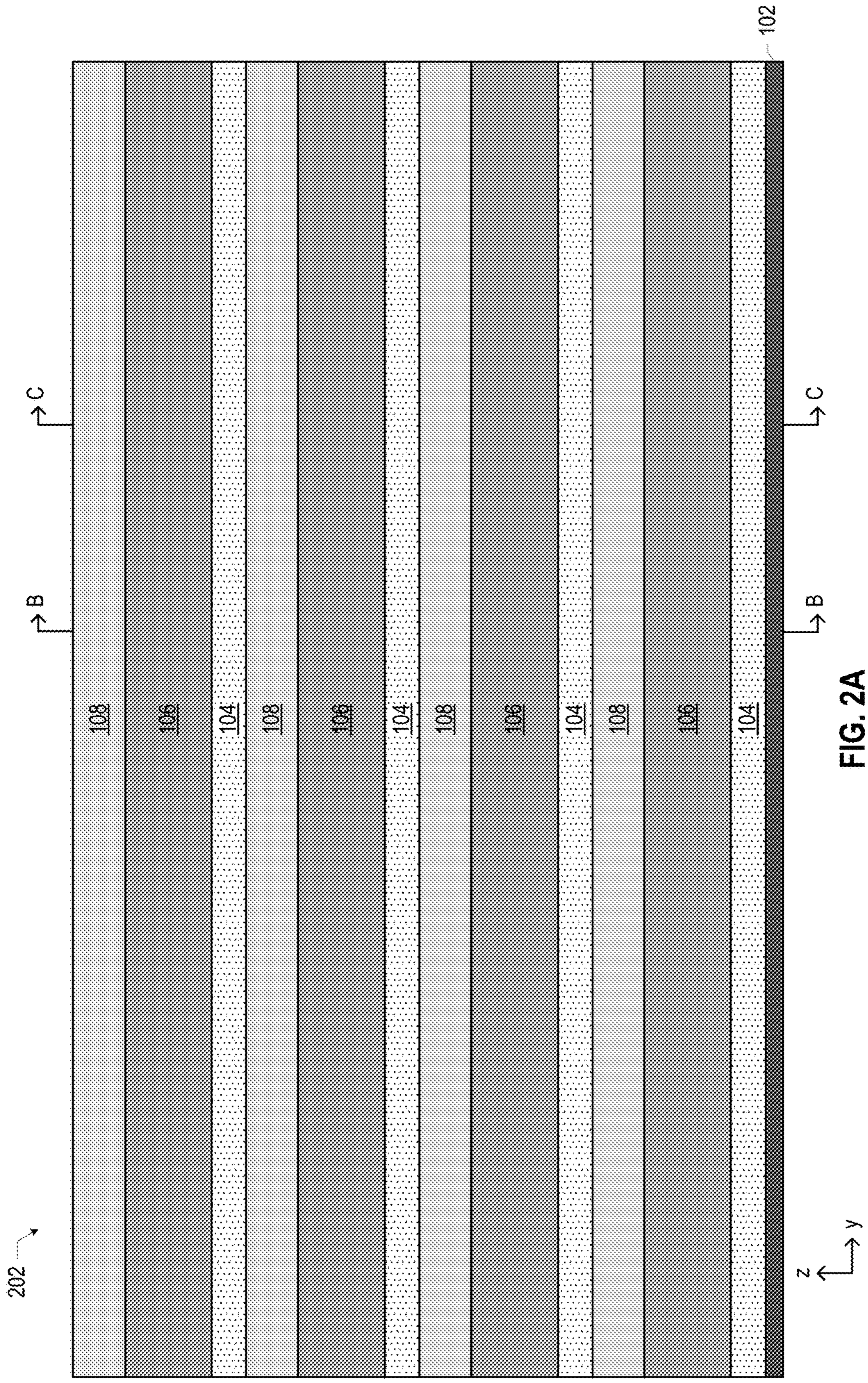
FIGS. 2A-2B, 3A-3B, 4A-4C, 5A-5B, 6A-6B, 7-10, 11A-11D, 12A-12D, 13A-13D, 14A-14D, 15A-15D, 16A-16D, 17A-17D, 18A-18D, 19A-19D, 20A-20D, 21A-21E, and 22A-22E illustrate stages in an example process of manufacturing the memory array of FIG. 1, in accordance with various embodiments.
Figure 2B:
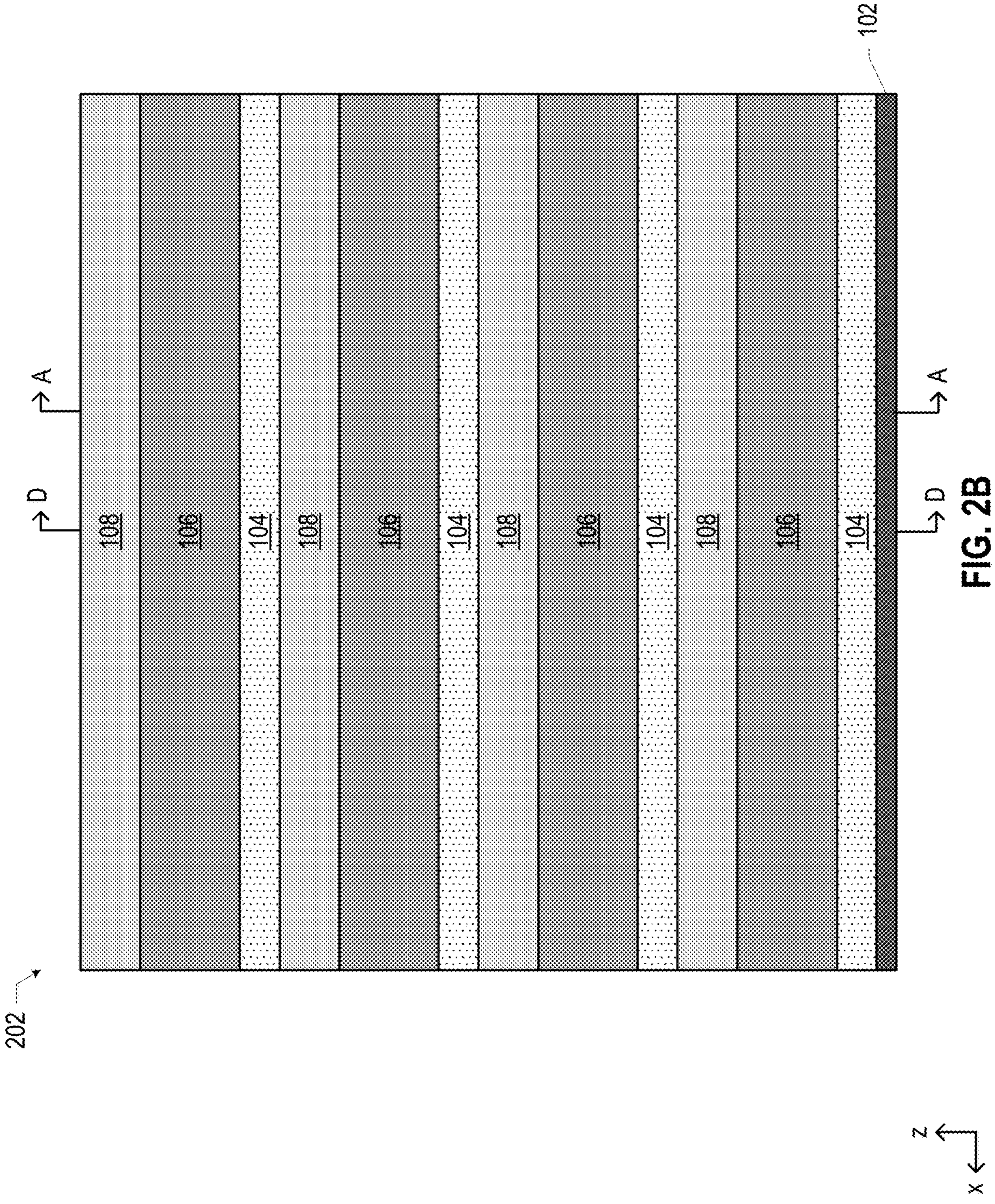

FIG. 2 illustrates an assembly 202. The cross-sectional view through the section C-C of the assembly 202 is the same as that shown in FIG. 2B, and the cross-sectional view through the section D-D of the assembly 202 is the same as that shown in FIG. 2A. The assembly 202 includes a repeating stack of three materials on a support 102: an isolation material 104, an isolation material 106, and a channel material 108. The number of repetitions of the 3-material stack included in the assembly 202 may depend on the number of memory cells 150 desired in a particular column of memory cells; each set of 3 material layers may correspond to a single memory cell 150 in a particular column. The isolation material 104, the isolation material 106, and the channel material 108 may be deposited using any suitable techniques (e.g., physical vapor deposition (PVD), chemical vapor deposition (CVD), plasma-enhanced CVD (PECVD), and/or atomic layer deposition (ALD)).

Figure 3A:
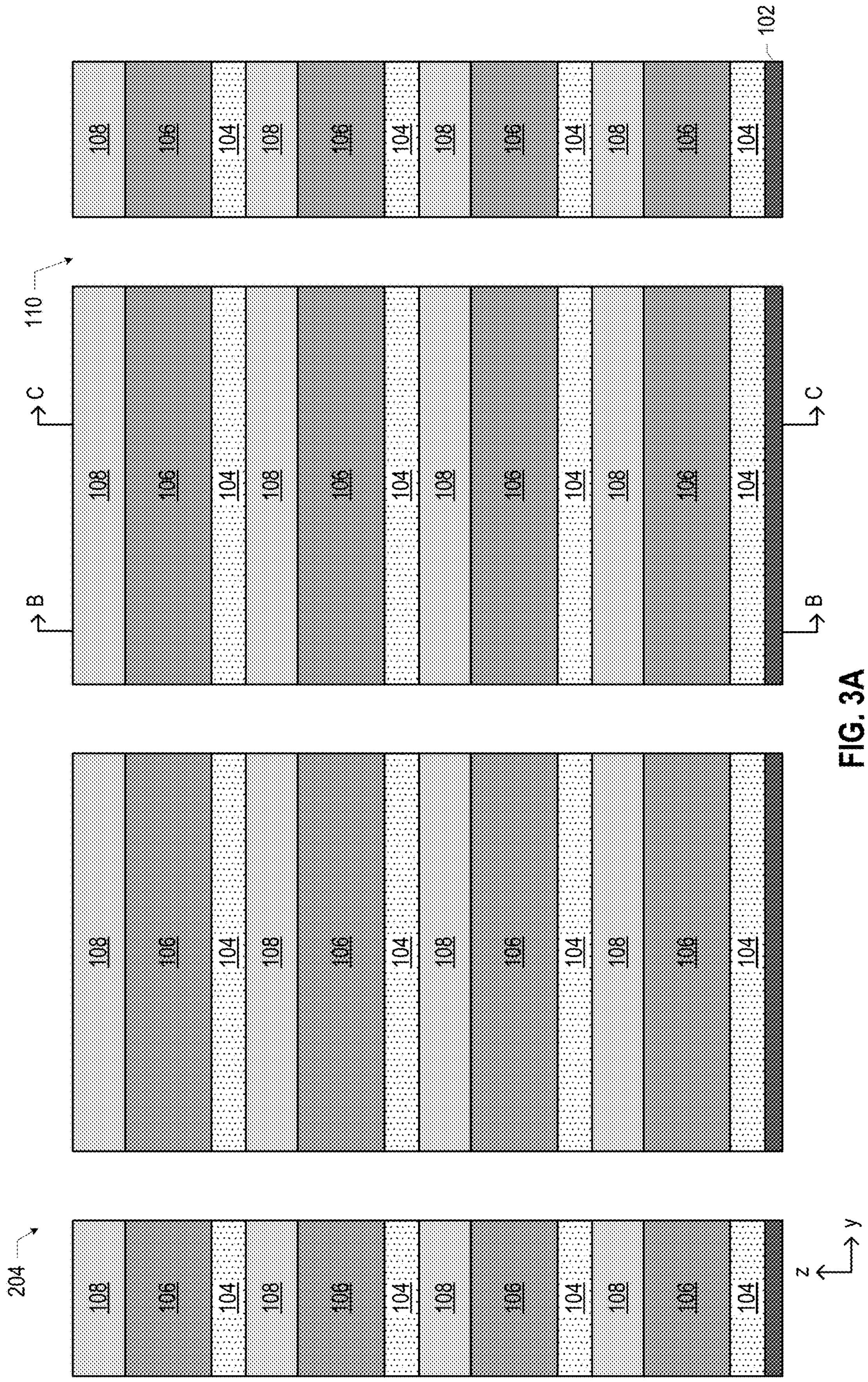
Figure 3B:
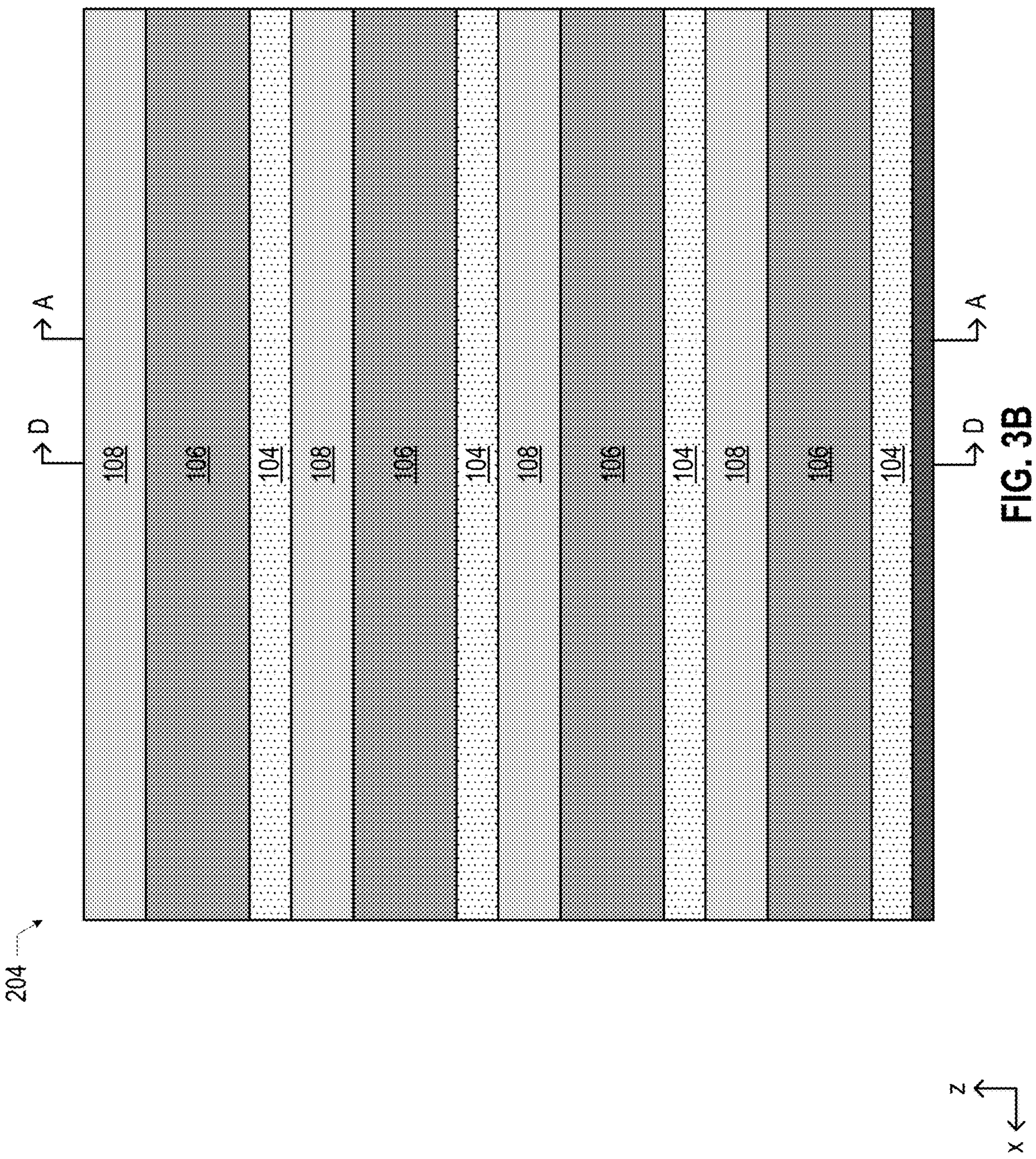

FIG. 3 illustrates an assembly 204 subsequent to forming trenches 110 in the assembly 202 (FIG. 2). The cross-sectional view through the section C-C of the assembly 204 is the same as that shown in FIG. 3B, and the cross-sectional view through the section D-D of the assembly 204 is the same as that shown in FIG. 3A. The trenches 110 may extend through the assembly 204 in the z-direction, and may be parallel to the X-Z plane. As discussed further below, the trenches 110 may include the volumes in which the bit lines 148 will be located in the memory array 100. Any suitable etch technique may be used to form the trenches 110 (e.g., a photolithographic patterning), as well as any of the other trenches disclosed herein.

Figure 4A:
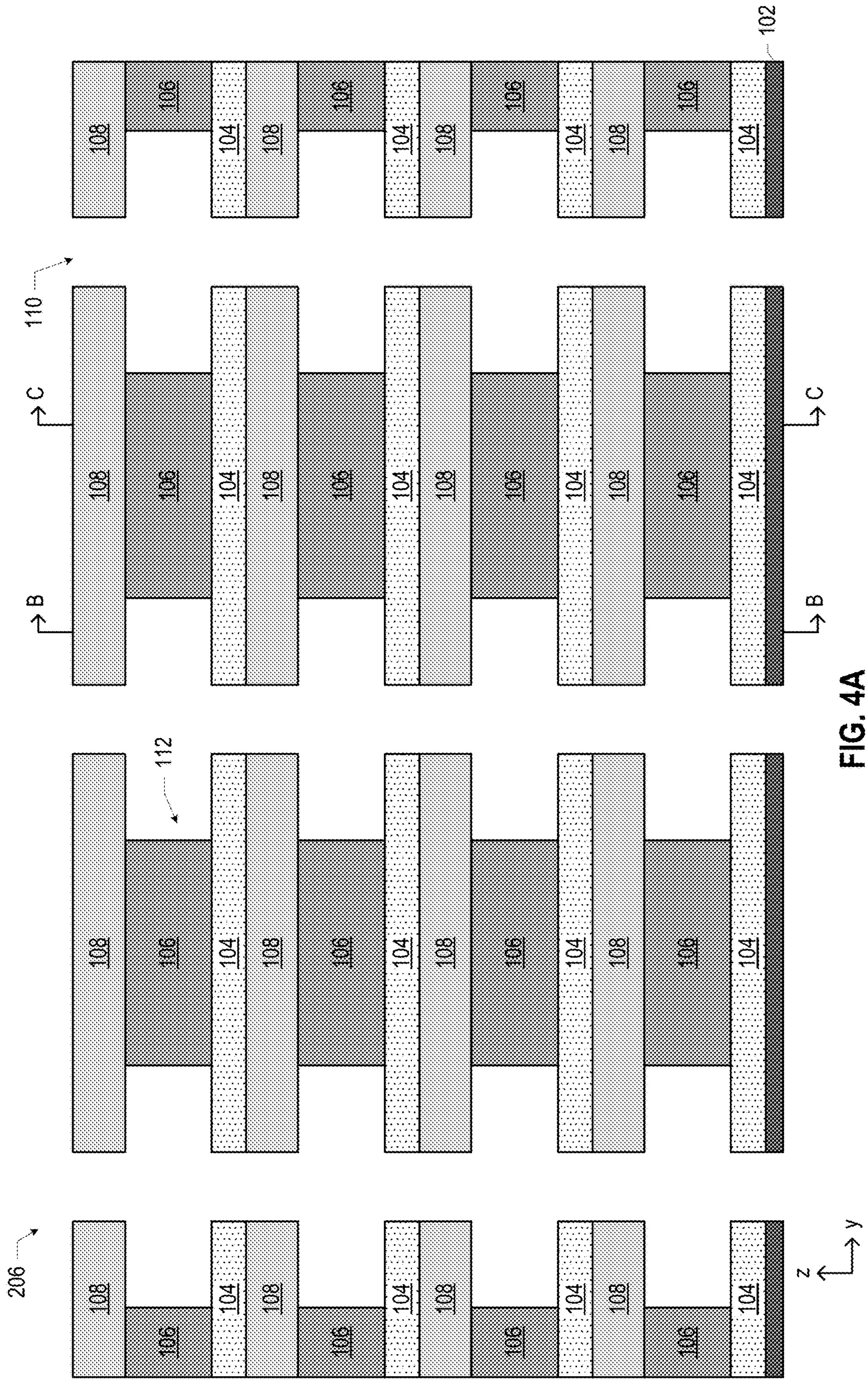
Figure 4B:
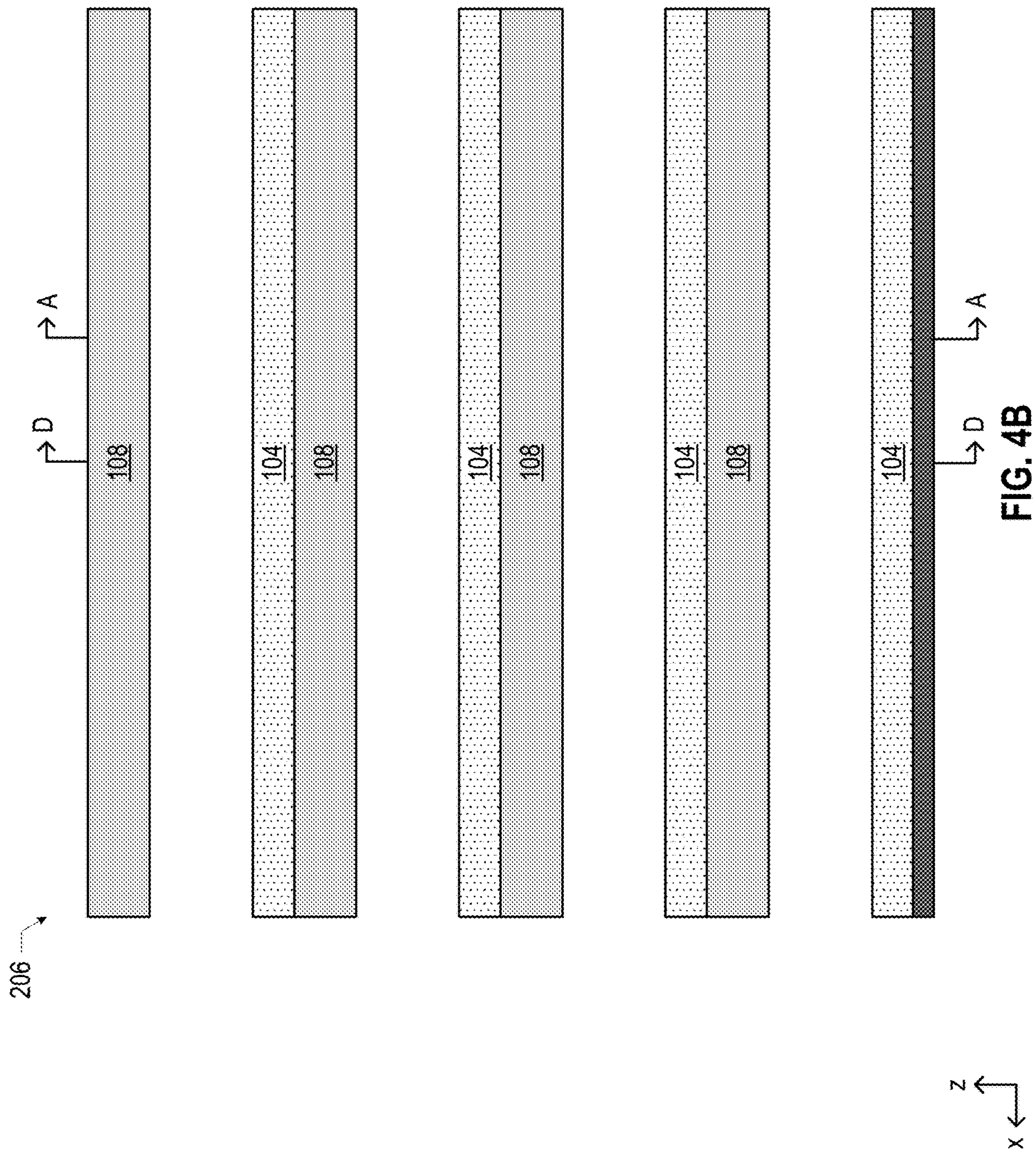

FIG. 4 illustrates an assembly 206 subsequent to performing a cavity etch on the assembly 204 (FIG. 3) to remove some of the isolation material 106 exposed at the sidewalls of the trenches 110. The cross-sectional view through the section D-D of the assembly 206 is the same as that shown in FIG. 4A. The cavity etch may form recesses 112, and the timing of the cavity etch (among other variables) may determine how much of the isolation material 106 is removed (and therefore the depth of the recesses 112).

Figure 4C:
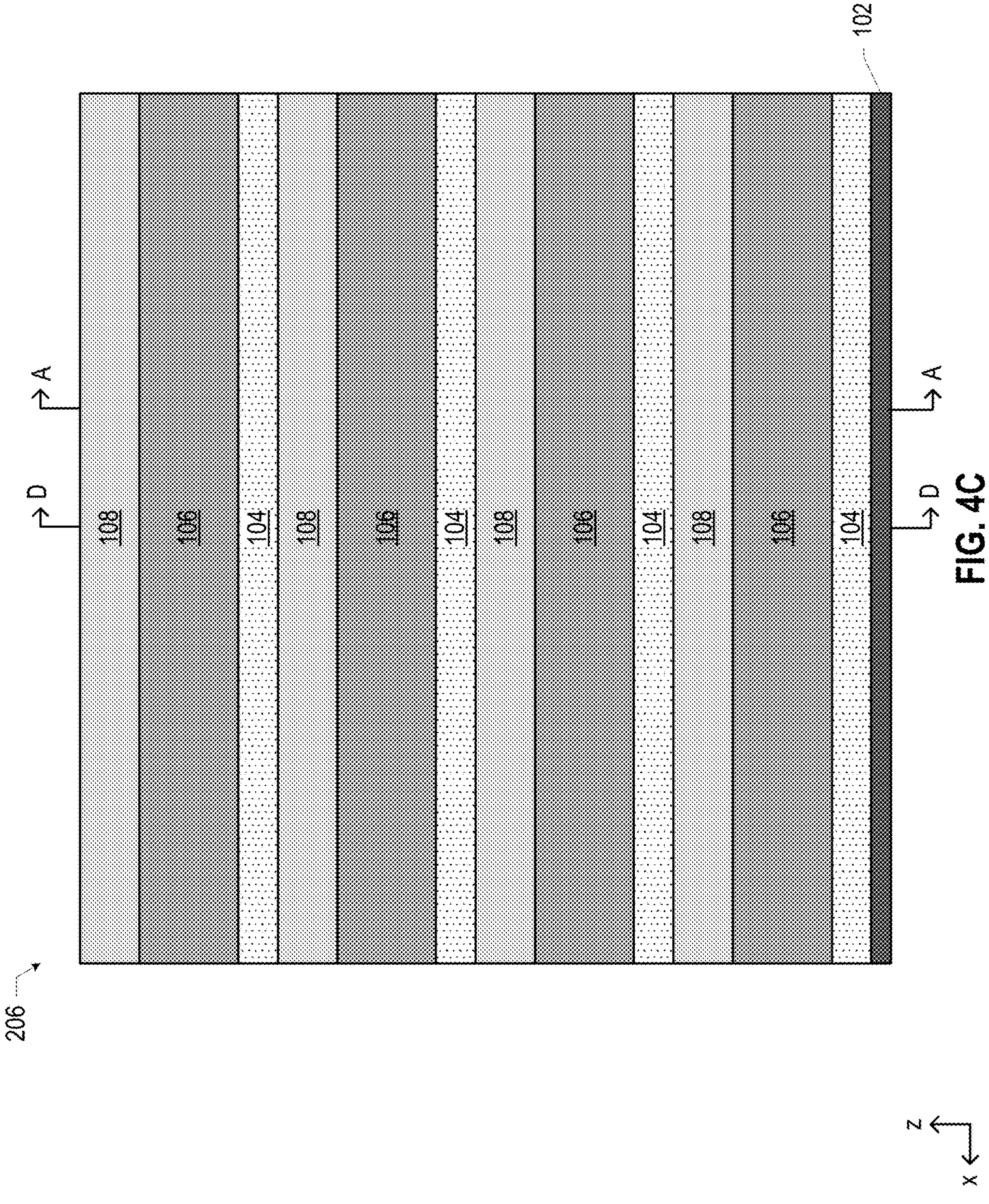
Figure 5A:
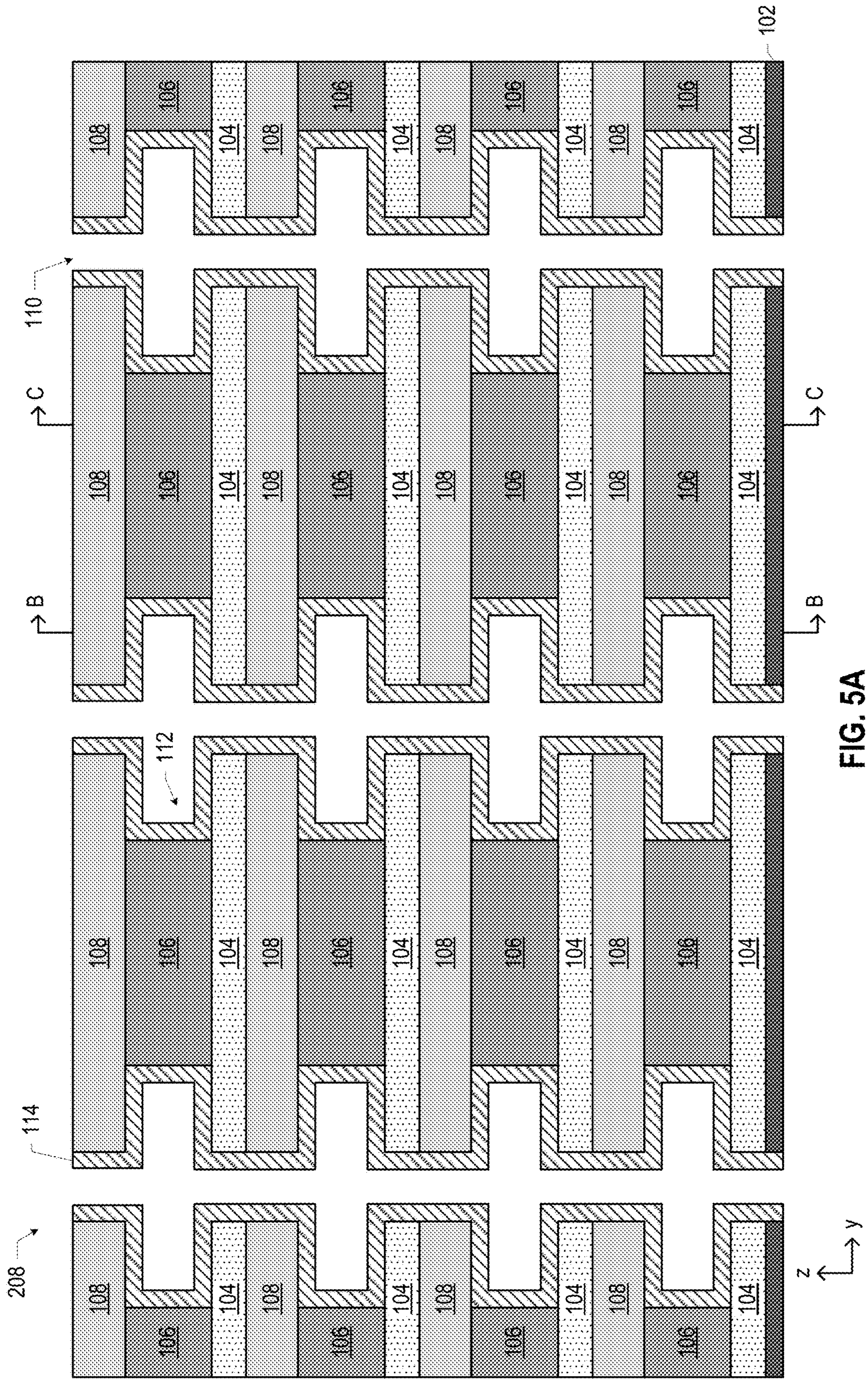
Figure 5B:
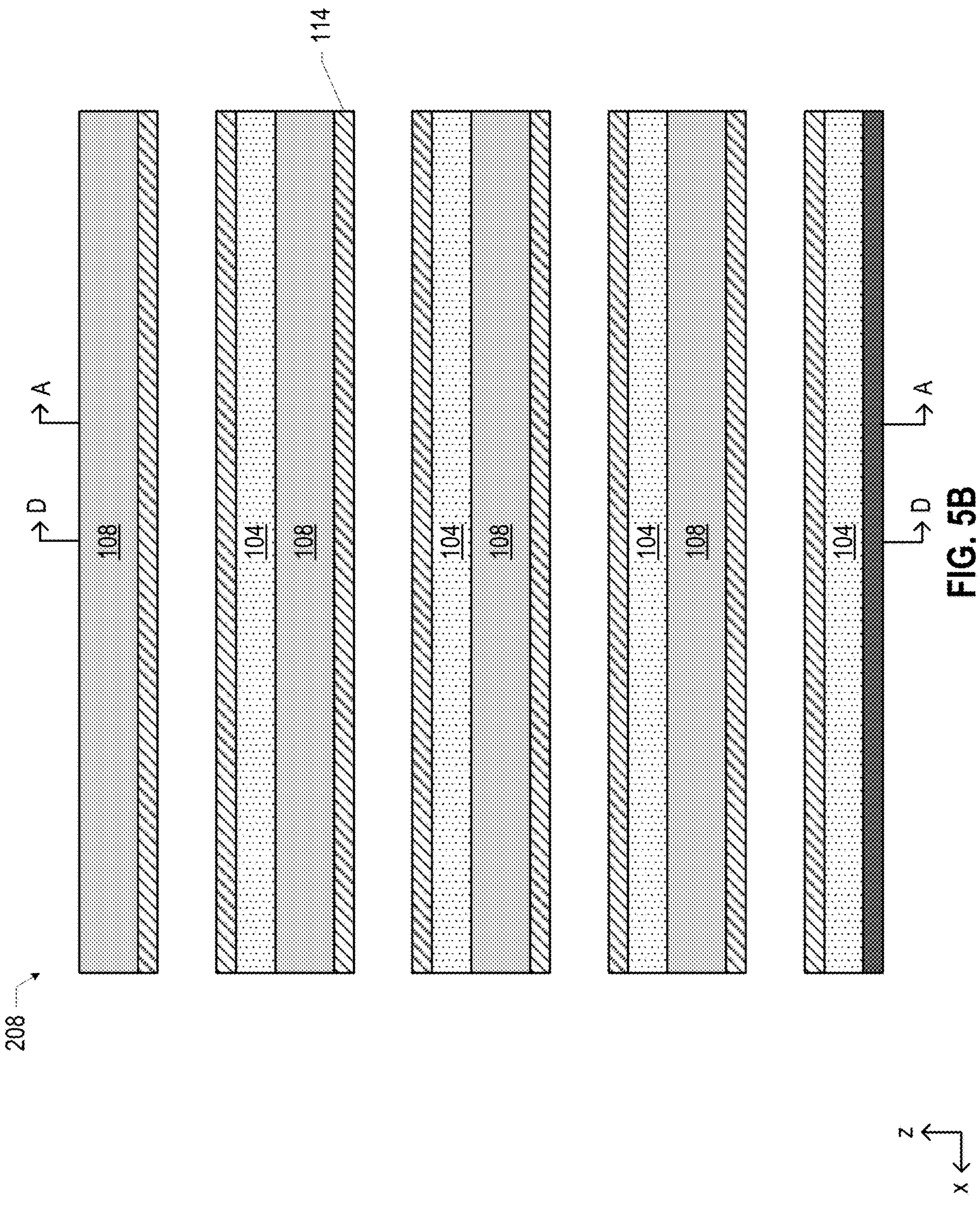

FIG. 5 illustrates an assembly 208 subsequent to conformally depositing the gate dielectric 114 on the sidewalls of the recessed trenches 110 of the assembly 206 (FIG. 4). The cross-sectional view through the section C-C of the assembly 208 is the same as that shown in FIG. 4C, and the cross-sectional view through the section D-D of the assembly 208 is the same as that shown in FIG. 5A. The gate dielectric 114 may cover the walls of the recesses 112, and may extend along the side faces of the isolation material 104 and the channel material 108 between adjacent recesses 112, as shown. The thickness of the deposition of the gate dielectric 114 in the assembly 208 may take the form of any of the embodiments of the thickness 123 disclosed herein. In some embodiments, the gate dielectric 114 may be deposited using an ALD technique.

Figure 6A:
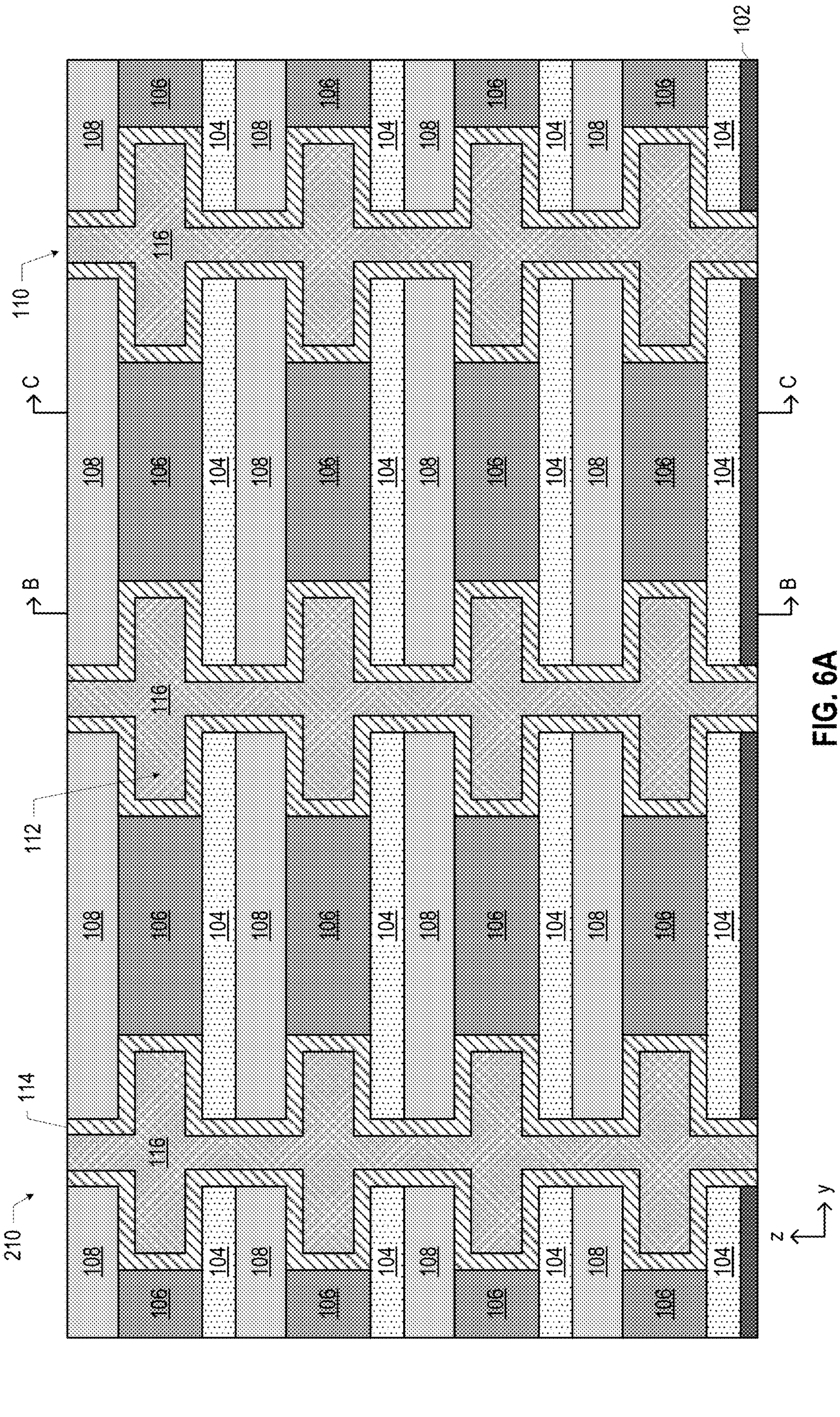

FIG. 6 illustrates an assembly 210 subsequent to filling the recessed trenches 110 of the assembly 208 (FIG. 5) with a word line material 116. The cross-sectional view through the section C-C of the assembly 210 is the same as that shown in FIG. 4C, and the cross-sectional view through the section D-D of the assembly 210 is the same as that shown in FIG. 6A. The word line material 116 may extend into the recesses 112, as shown.

Figure 6B:
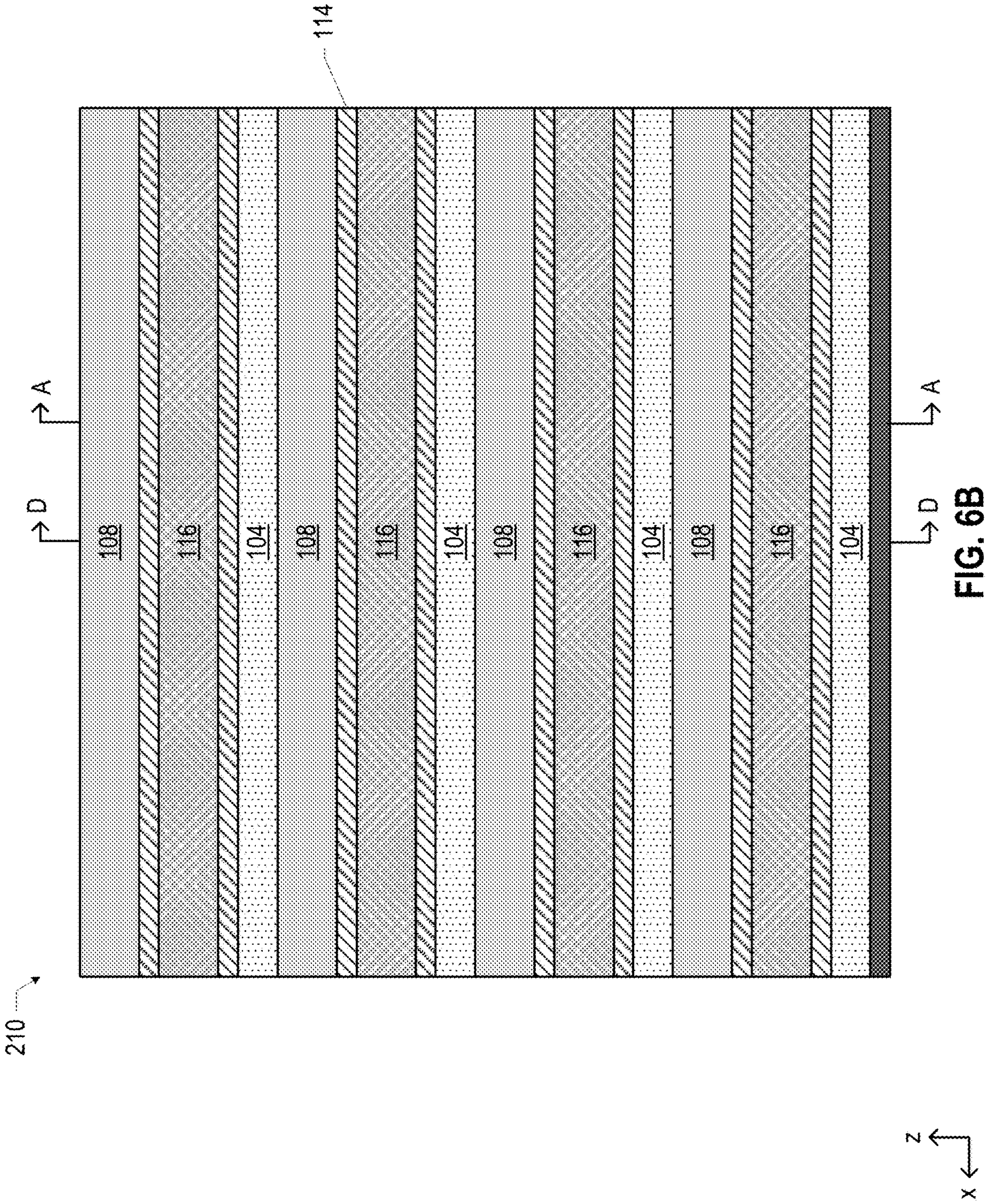
Figure 7:
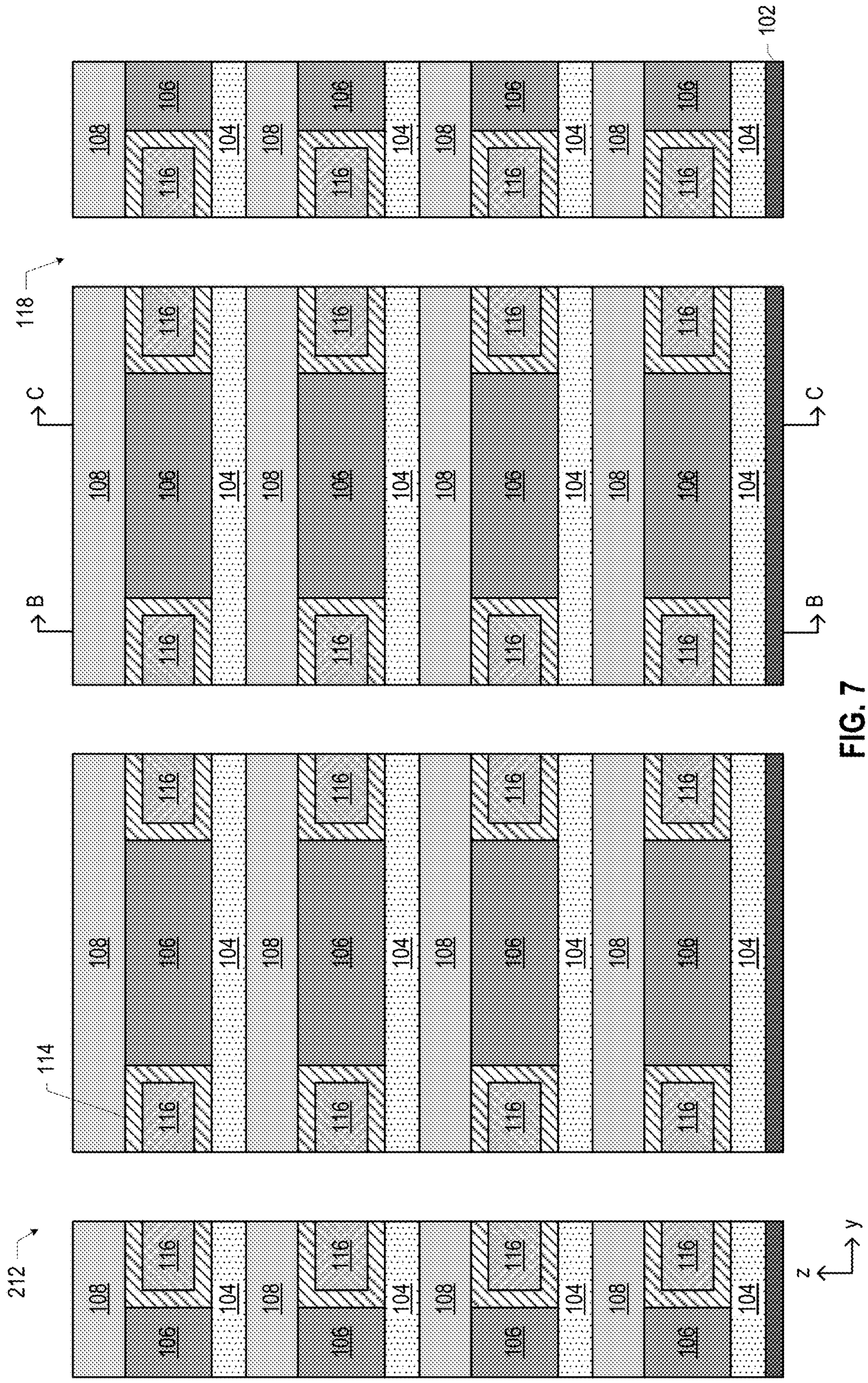

FIG. 7 illustrates an assembly 212 subsequent to forming trenches 118 in the assembly 210 (FIG. 6). The cross-sectional view through the section B-B of the assembly 212 is the same as that shown in FIG. 6B, the cross-sectional view through the section C-C of the assembly 212 is the same as that shown in FIG. 4C, and the cross-sectional view through the section D-D of the assembly 212 is the same as that shown in FIG. 7. The trenches 118 may extend through the assembly 212 in the z-direction, and may be parallel to the x-z plane. Like the trenches 110, the trenches 118 may include the volumes in which the bit lines 148 will be located in the memory array 100 (as discussed further below). The trenches 118 may remove the word line material 116 that is outside of the recesses 112, leaving isolated portions of the word line material 116 in different ones of the recesses 112, as shown. The remaining word line material 116 may provide the word lines 116 discussed above with reference to FIG. 1.

Figure 8:
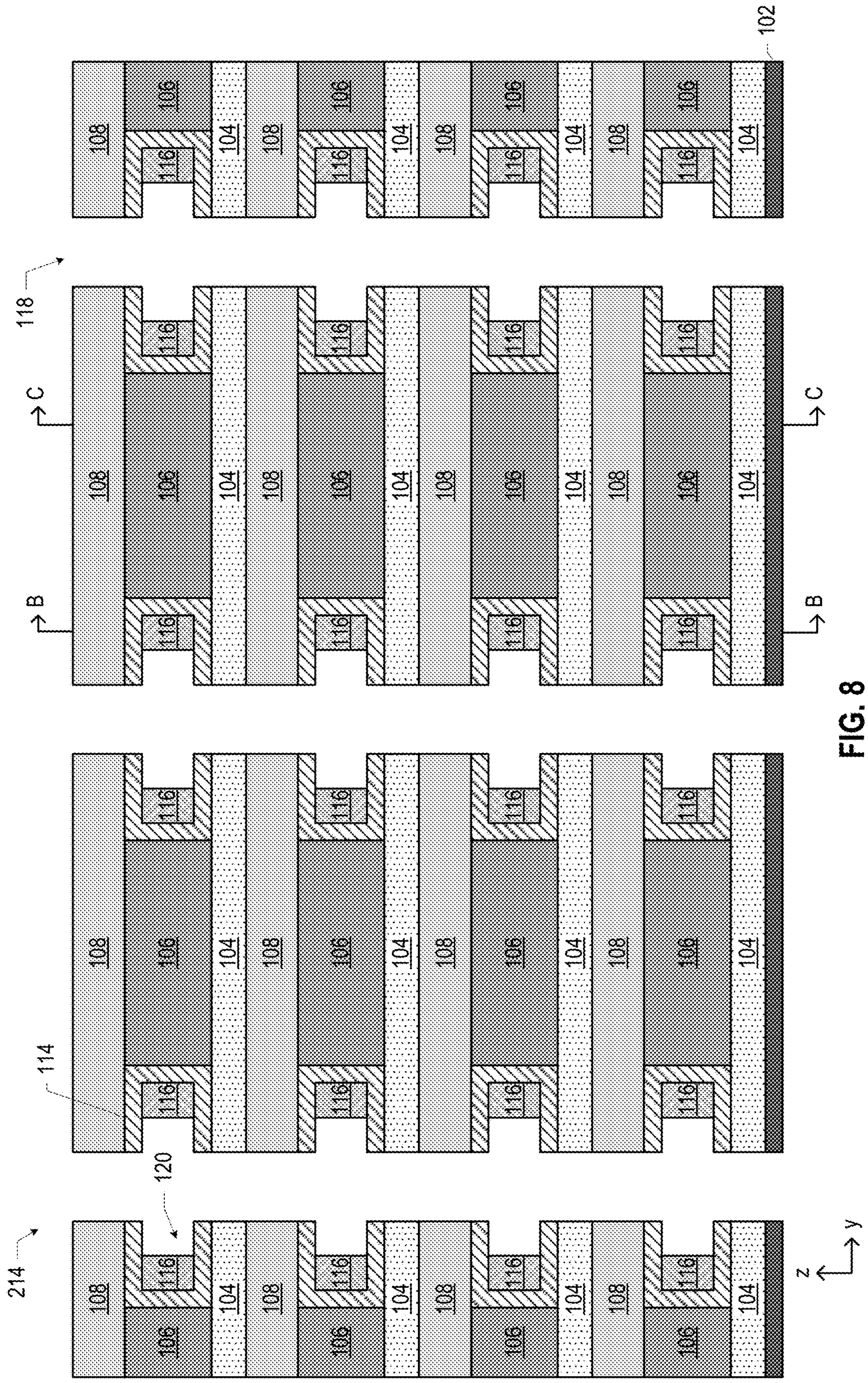

FIG. 8 illustrates an assembly 214 subsequent to performing a cavity etch on the assembly 212 (FIG. 7) to remove some of the word line material 116 exposed at the sidewalls of the trenches 118. The cross-sectional view through the section B-B of the assembly 214 is the same as that shown in FIG. 6B, the cross-sectional view through the section C-C of the assembly 214 is the same as that shown in FIG. 4C, and the cross-sectional view through the section D-D of the assembly 214 is the same as that shown in FIG. 8. The cavity etch may form recesses 120, and the timing of the cavity etch (among other variables) may determine how much of the word line material 116 is removed (and therefore the depth of the recesses 120).

Figure 9:
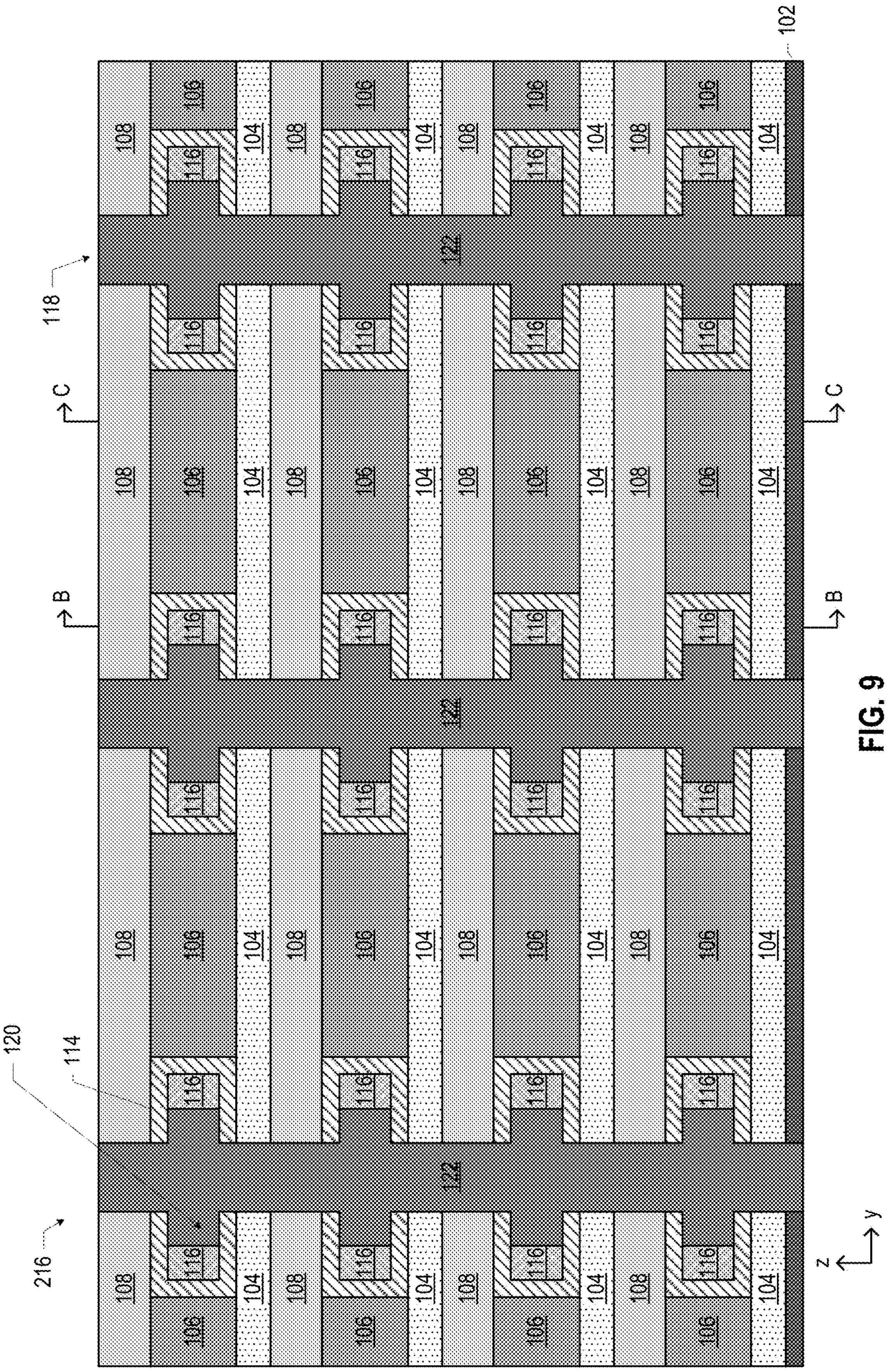

FIG. 9 illustrates an assembly 216 subsequent to filling the recessed trenches 118 of the assembly 214 (FIG. 8) with a spacer material 122. The cross-sectional view through the section B-B of the assembly 216 is the same as that shown in FIG. 6B, the cross-sectional view through the section C-C of the assembly 216 is the same as that shown in FIG. 4C, and the cross-sectional view through the section D-D of the assembly 216 is the same as that shown in FIG. 9. The spacer material 122 may extend into the recesses 120, as shown.

Figure 10:
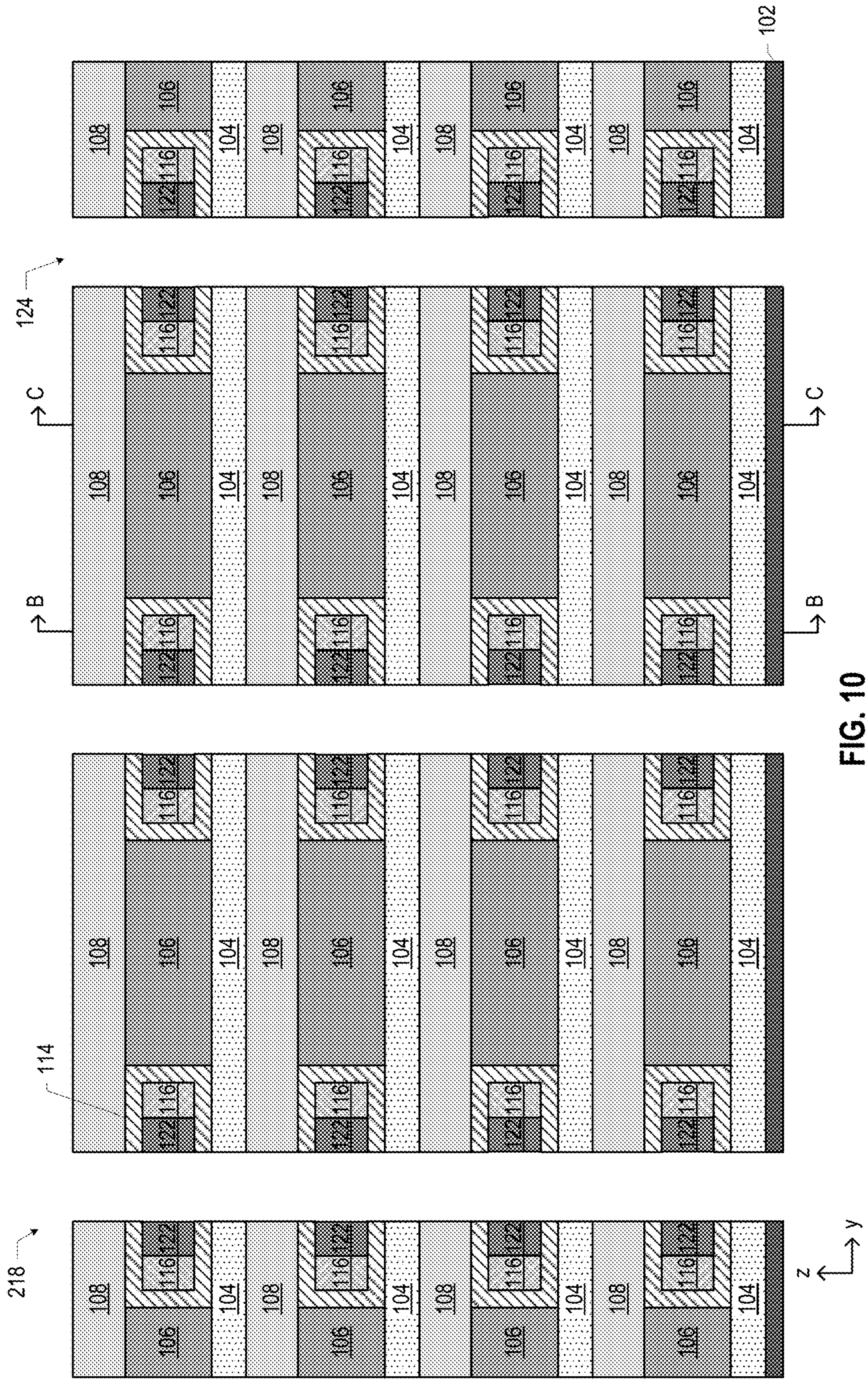
Figure 11A:
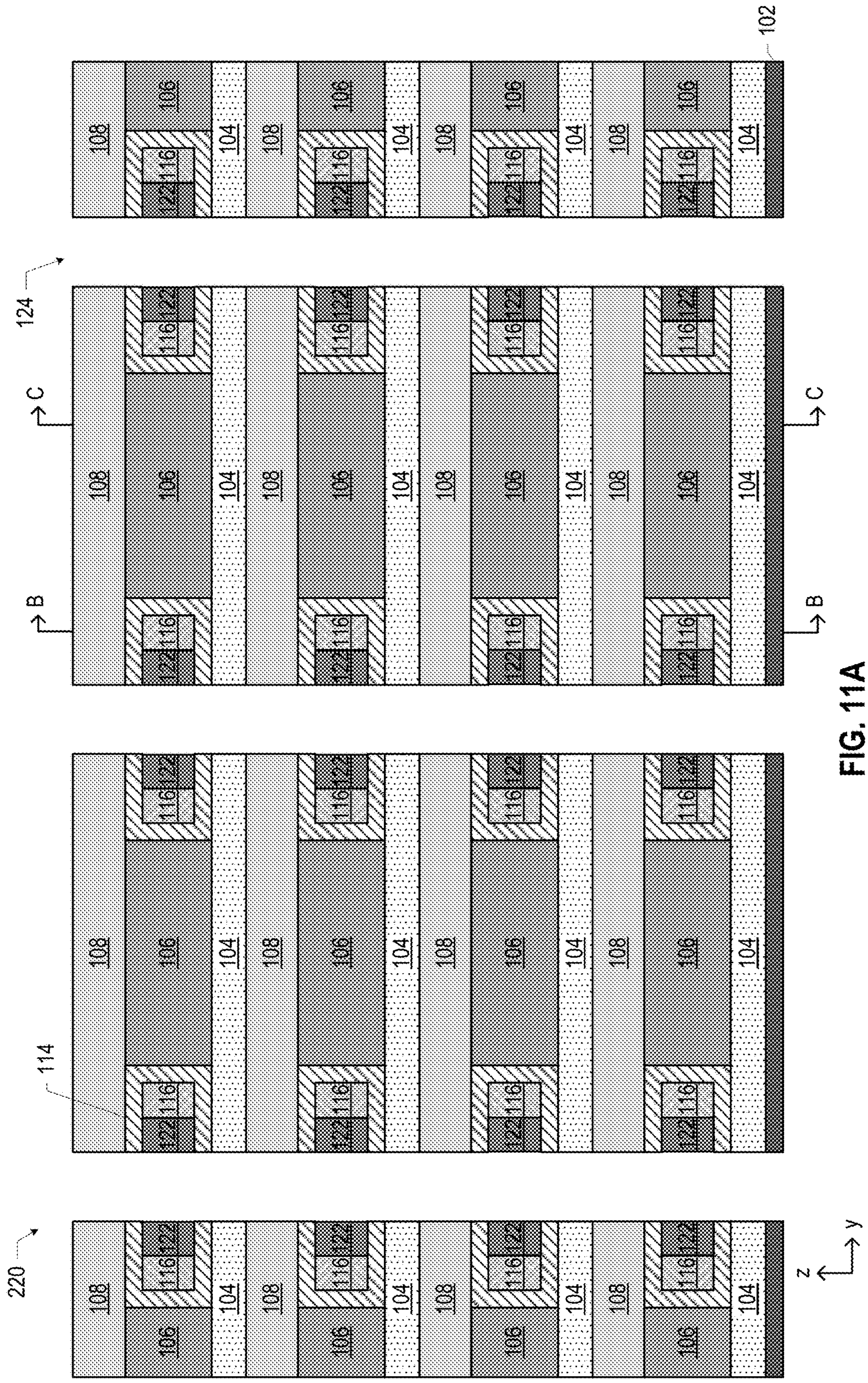
Figure 11B:
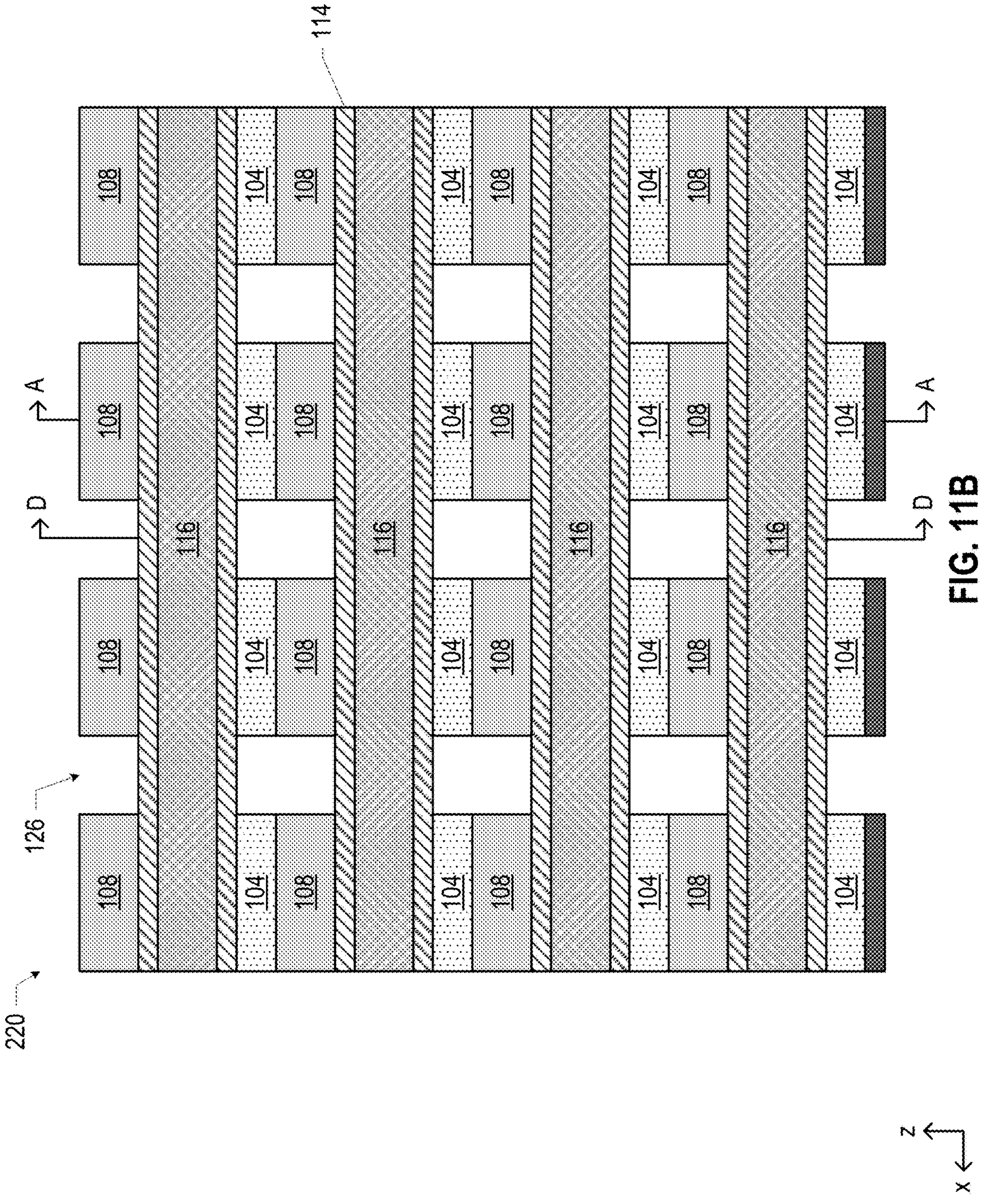
Figure 11C:
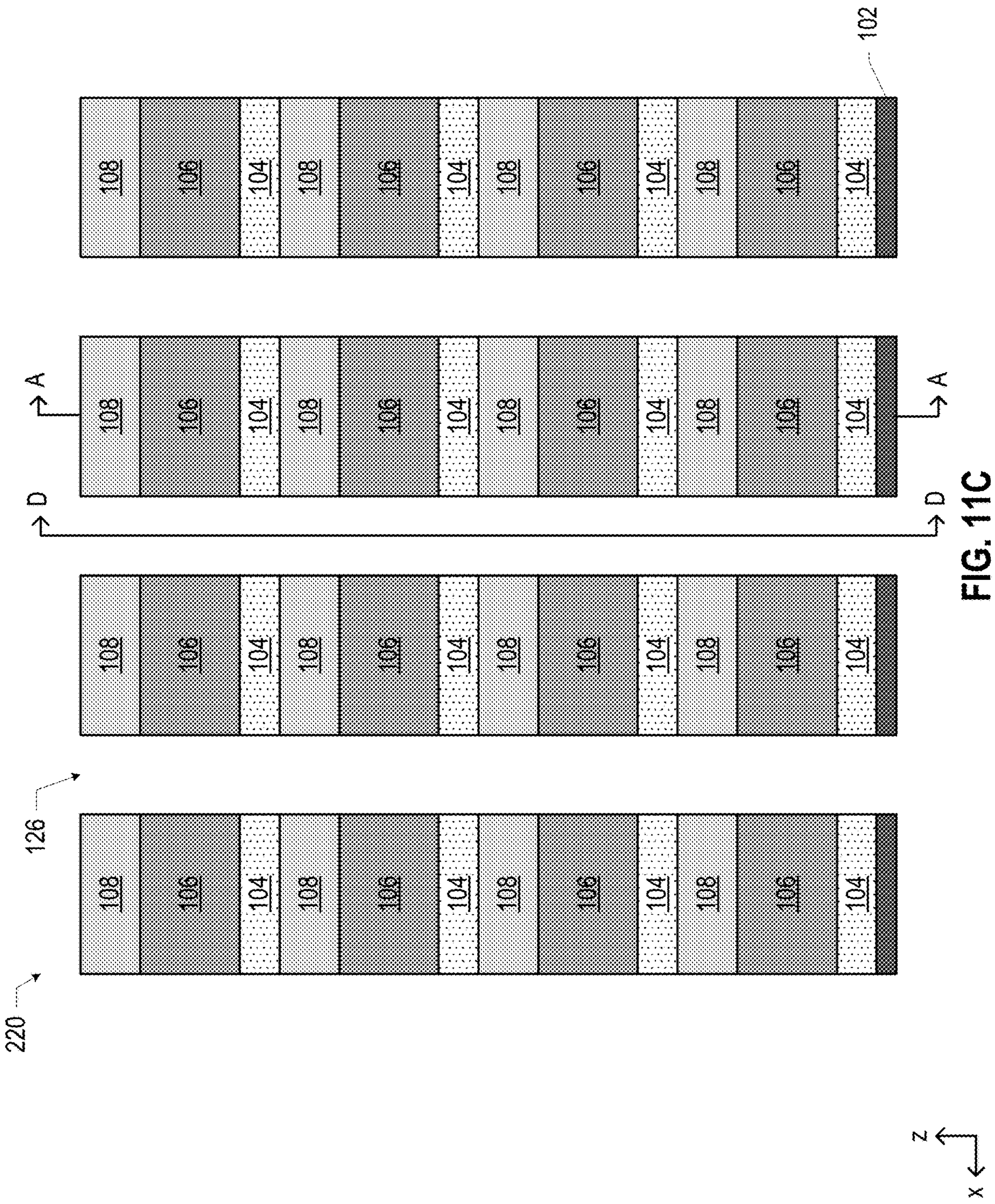
Figure 11D:
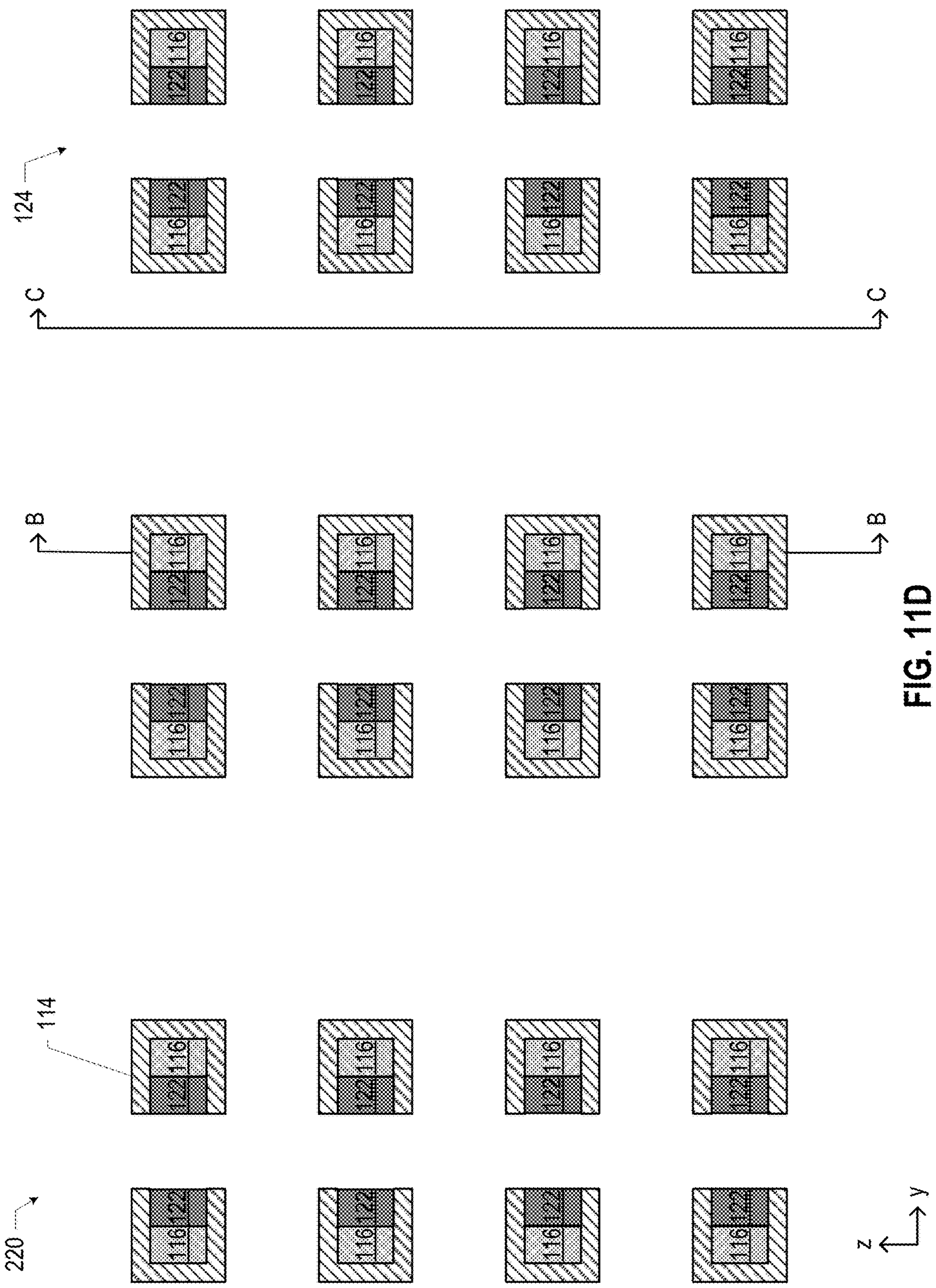
Figure 12A:
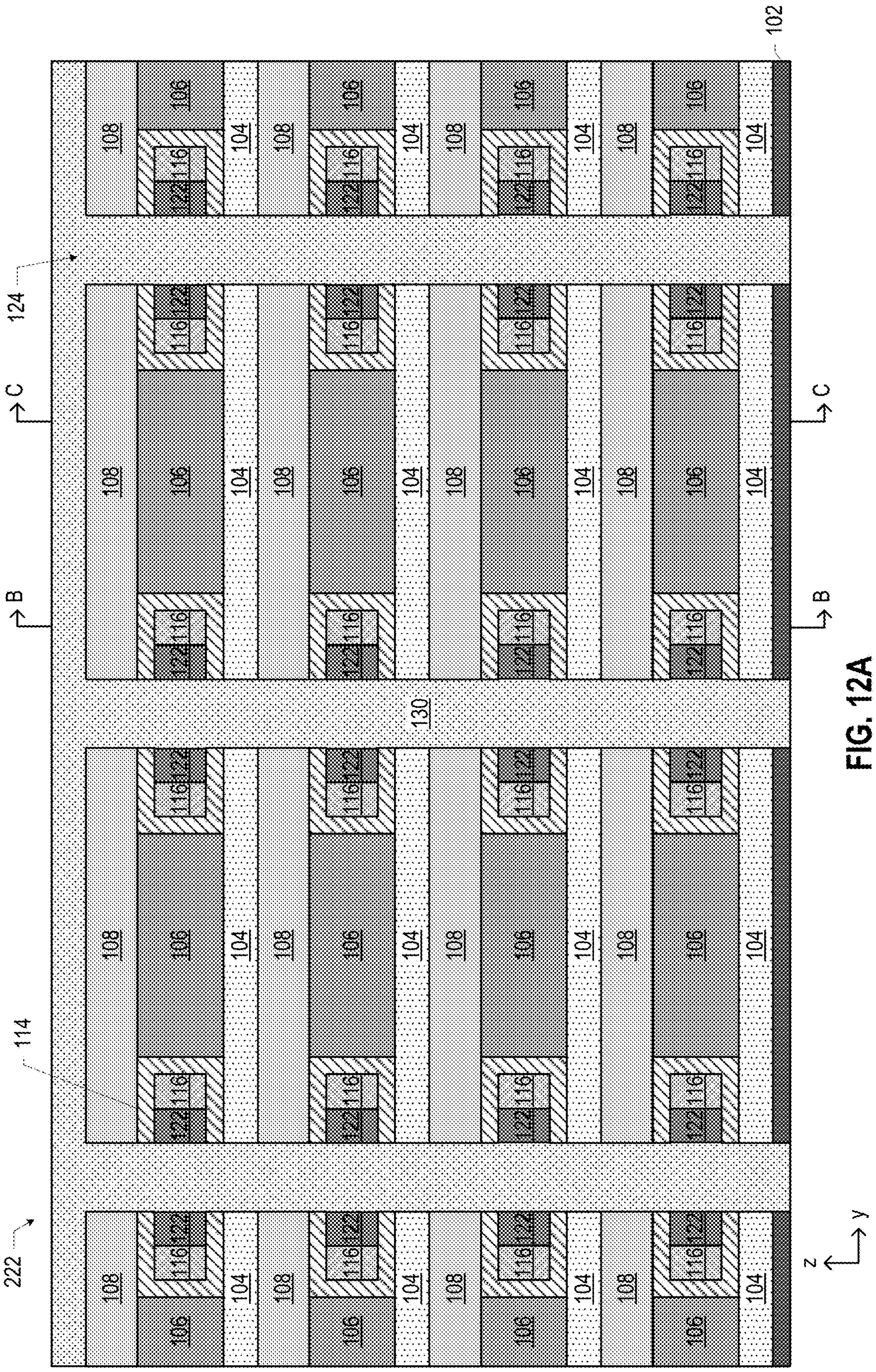
Figure 12B:
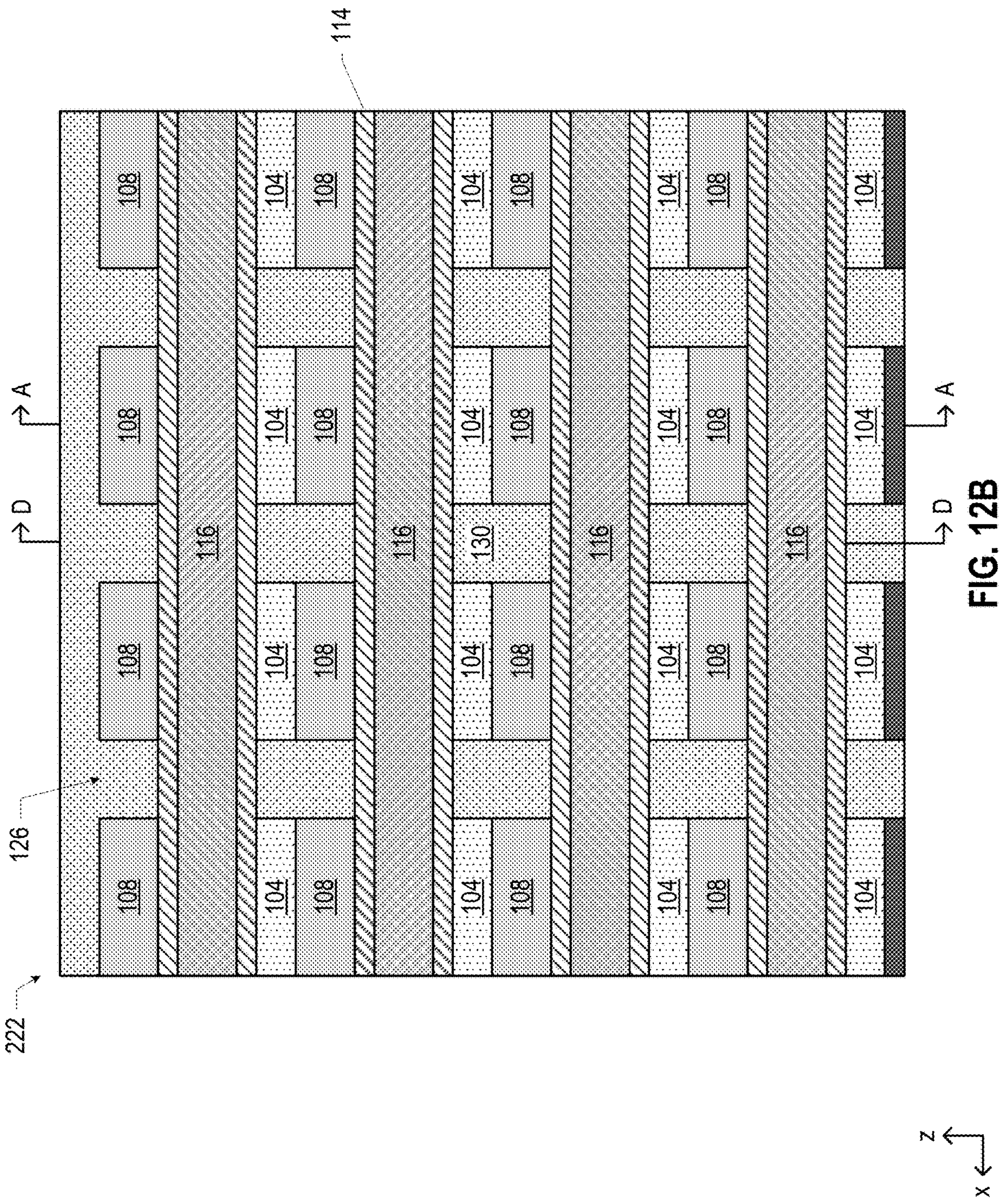
Figure 12C:
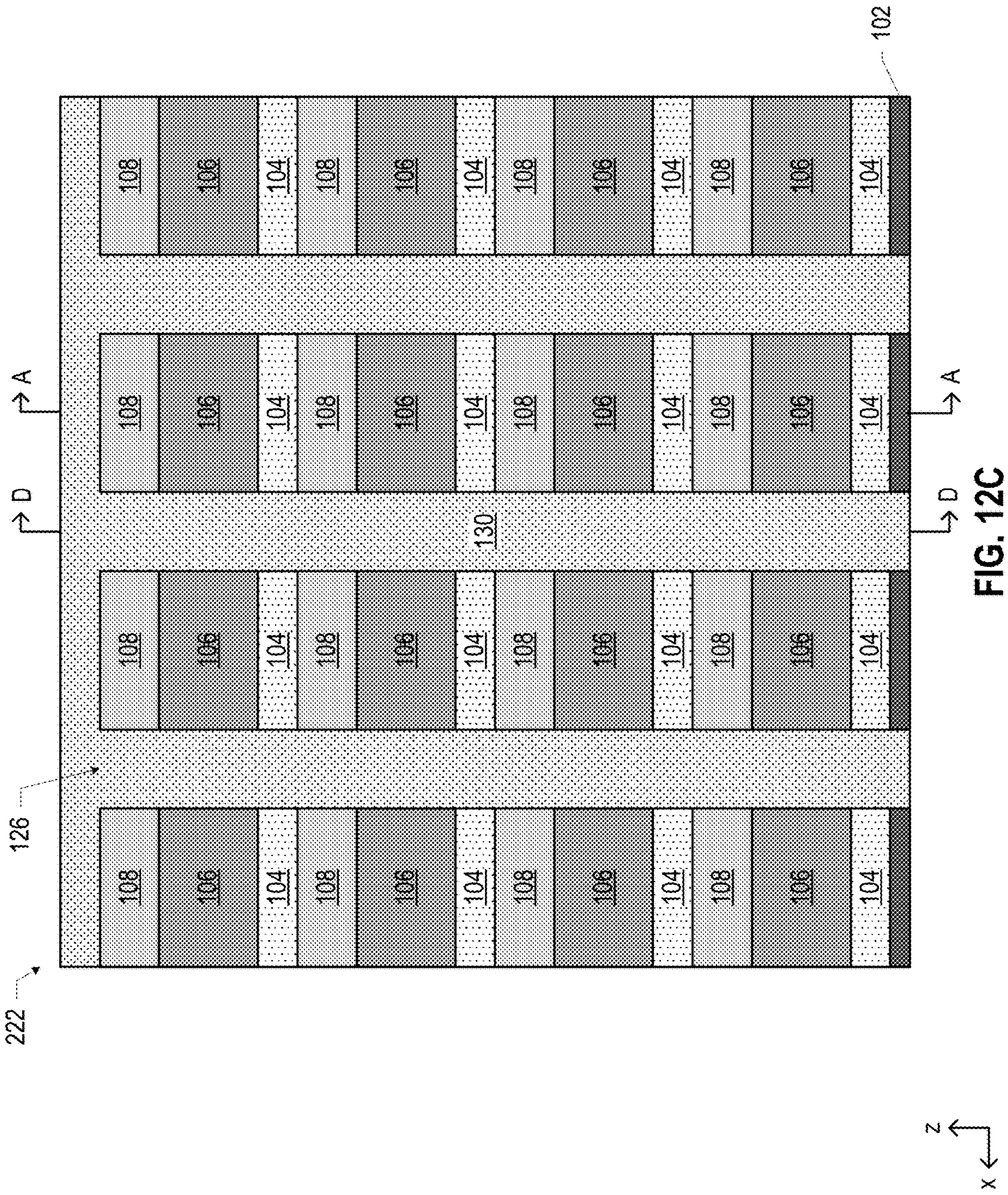
Figure 12D:
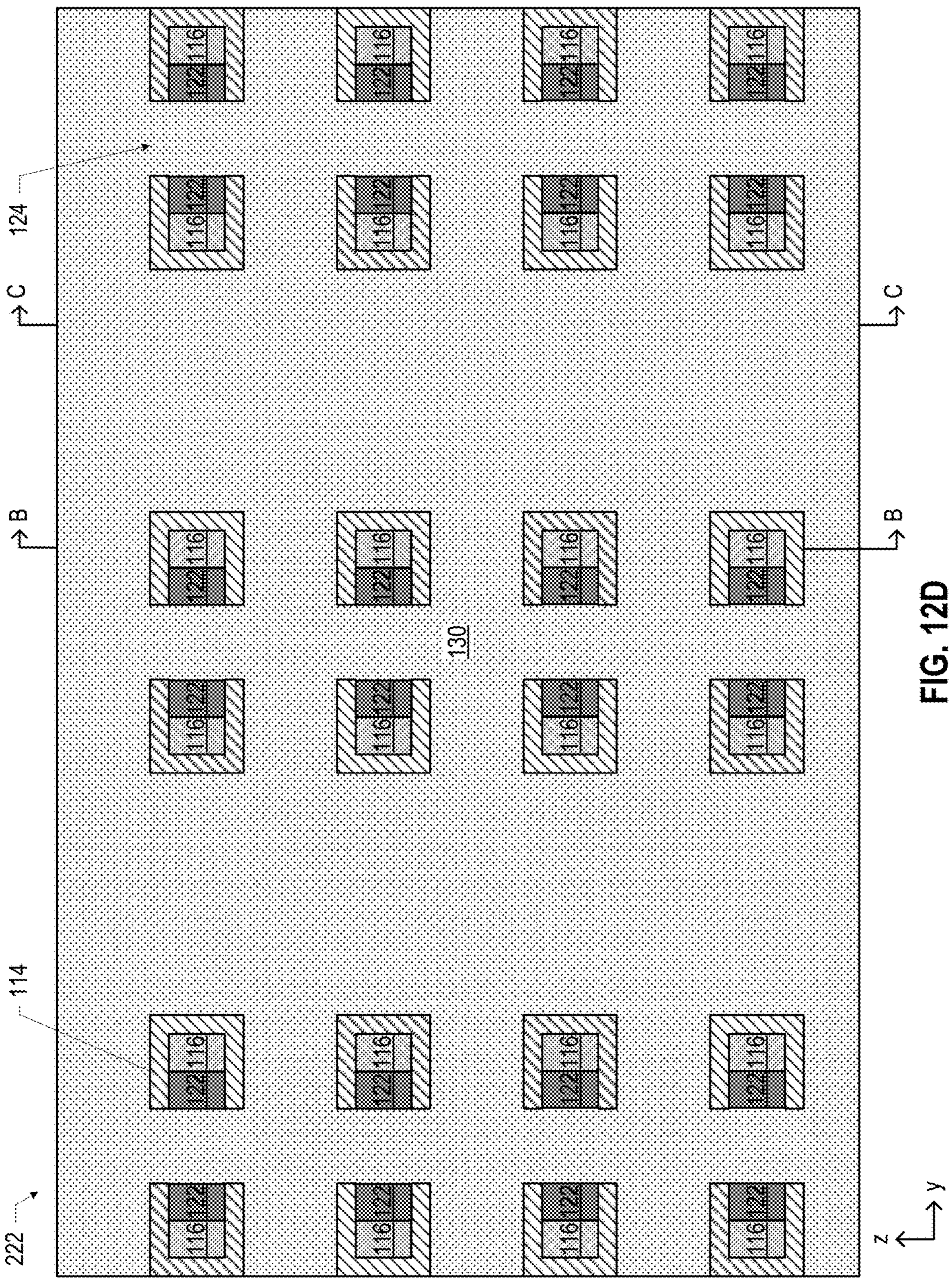
Figure 13A:
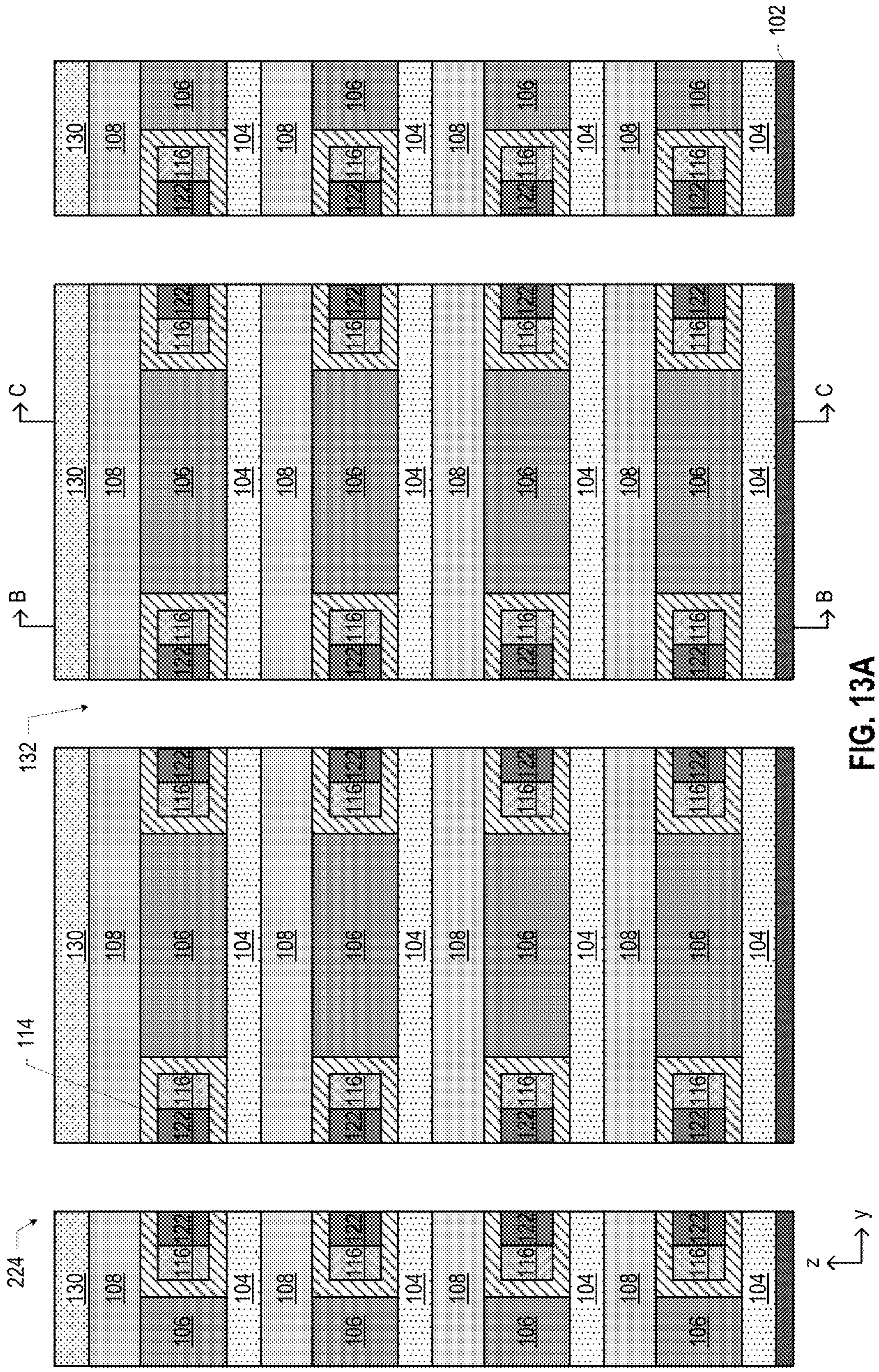
Figure 13B:
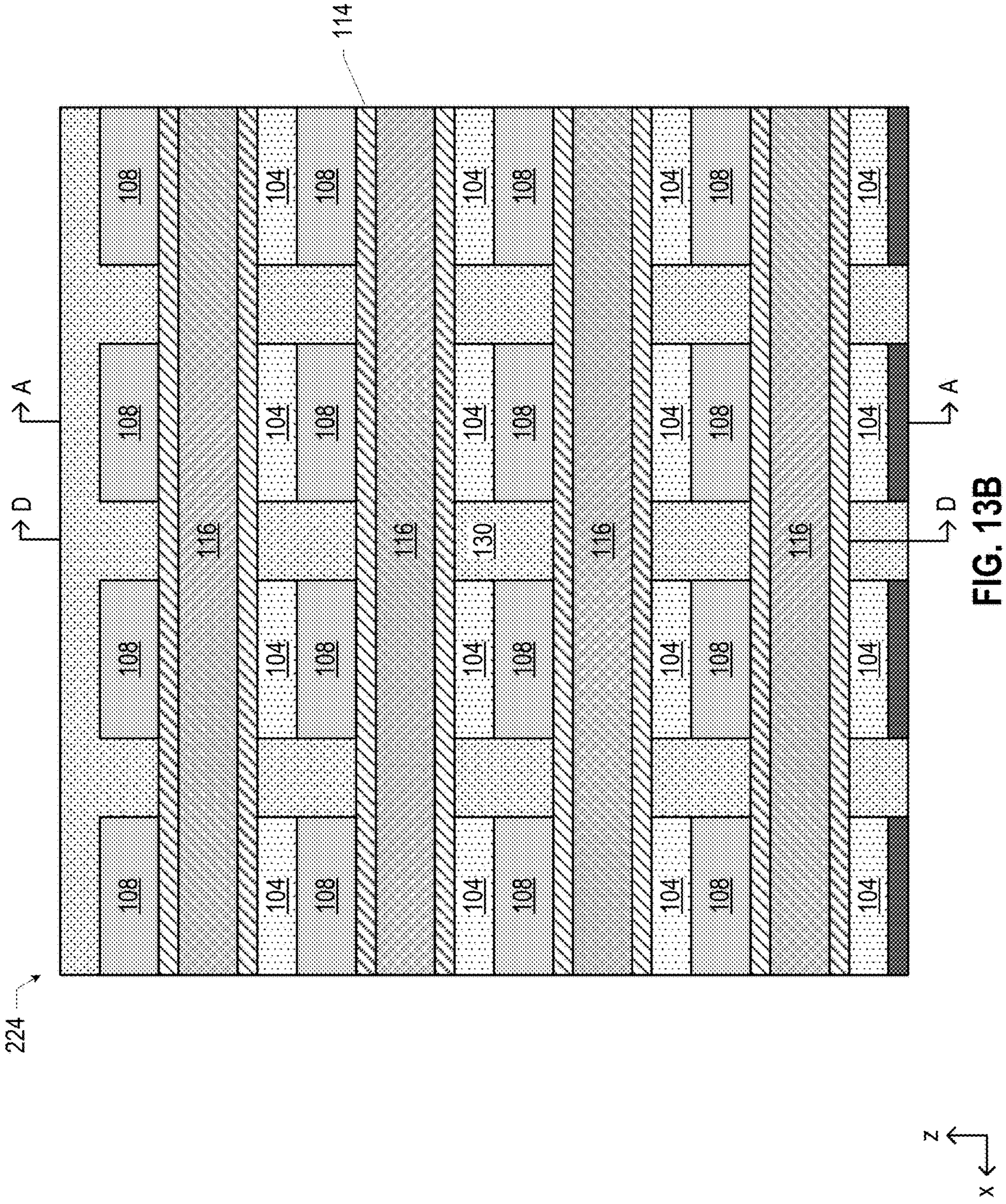
Figure 13C:
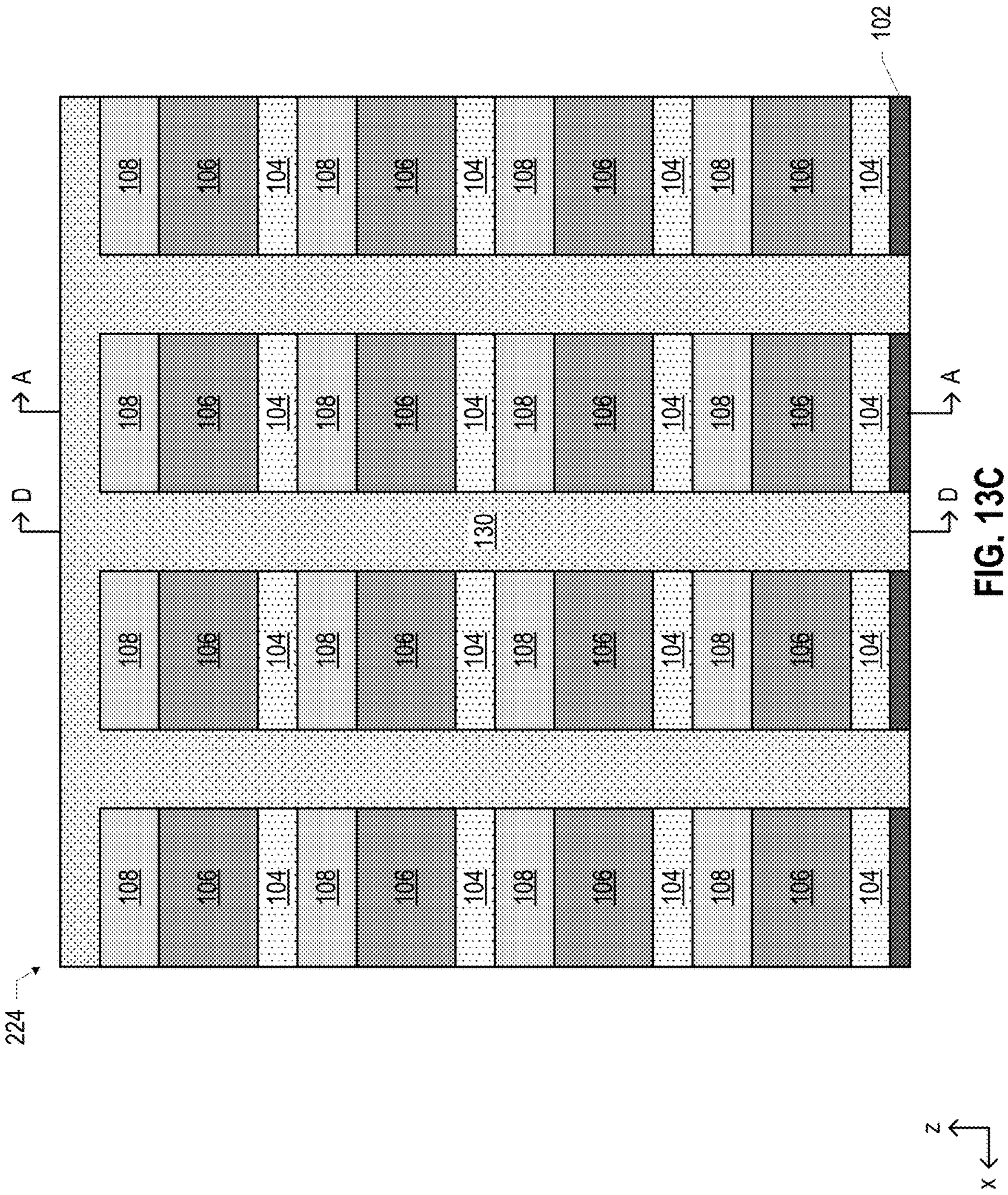
Figure 13D:
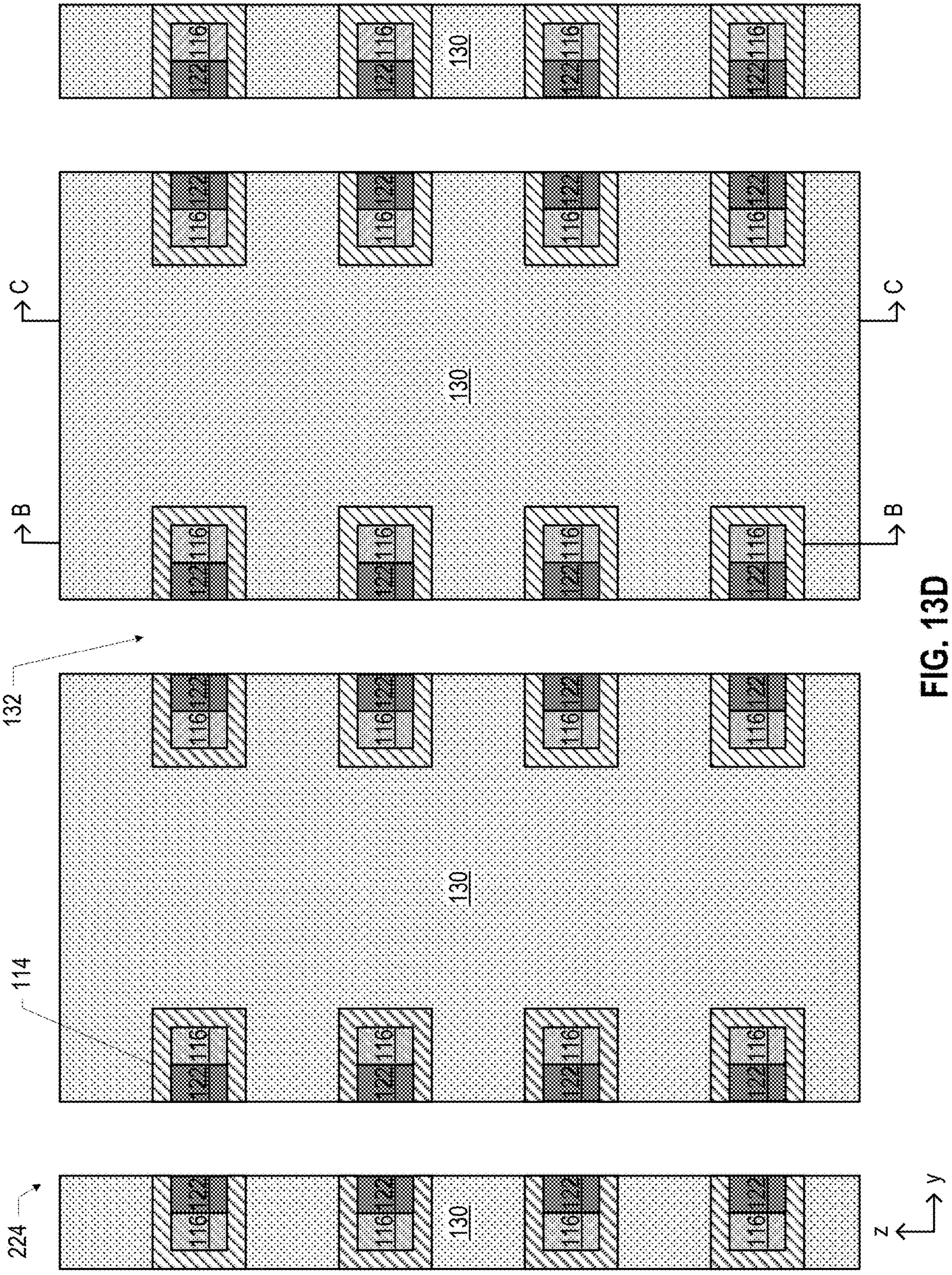
Figure 14A:
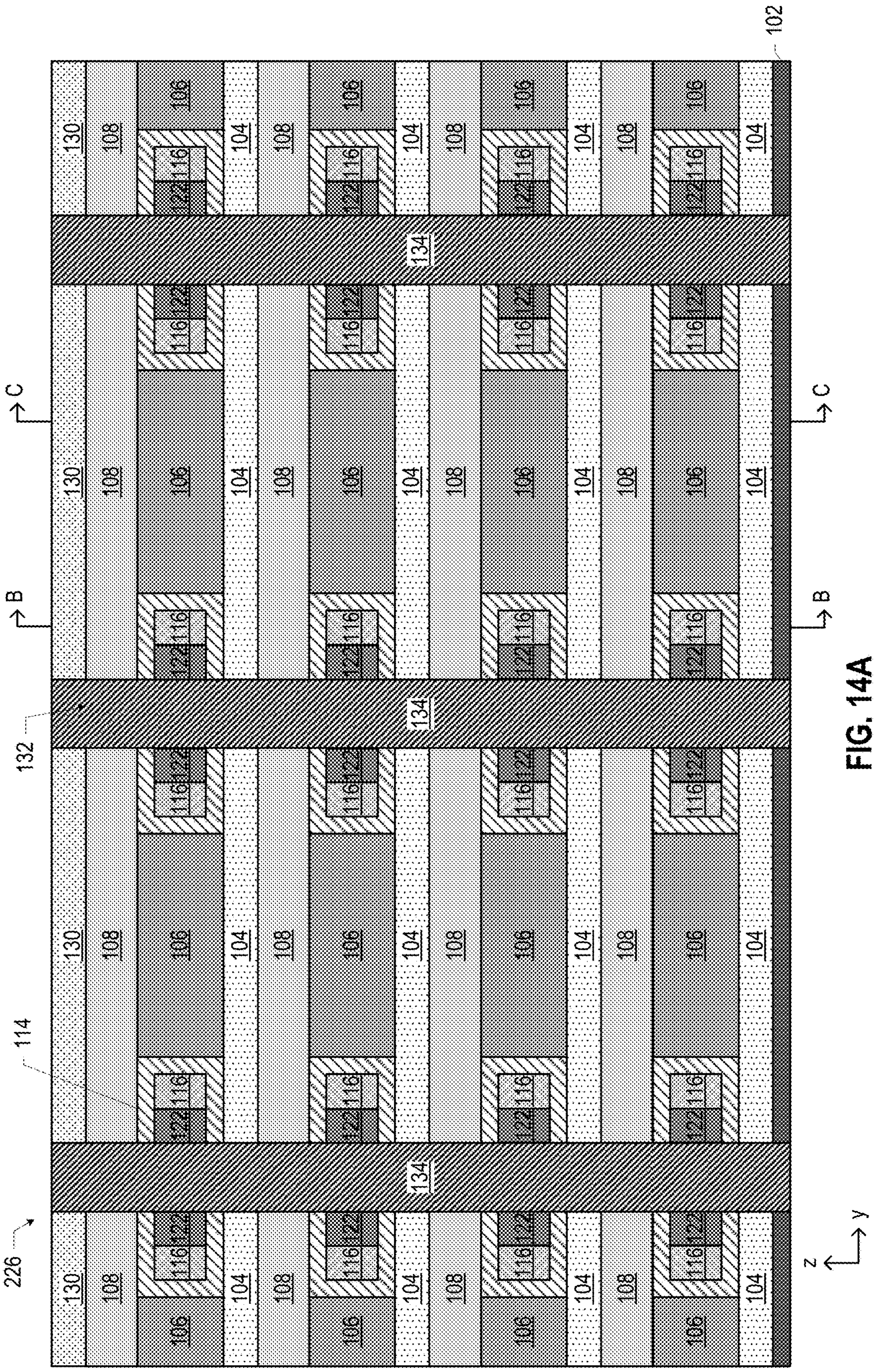
Figure 14B:
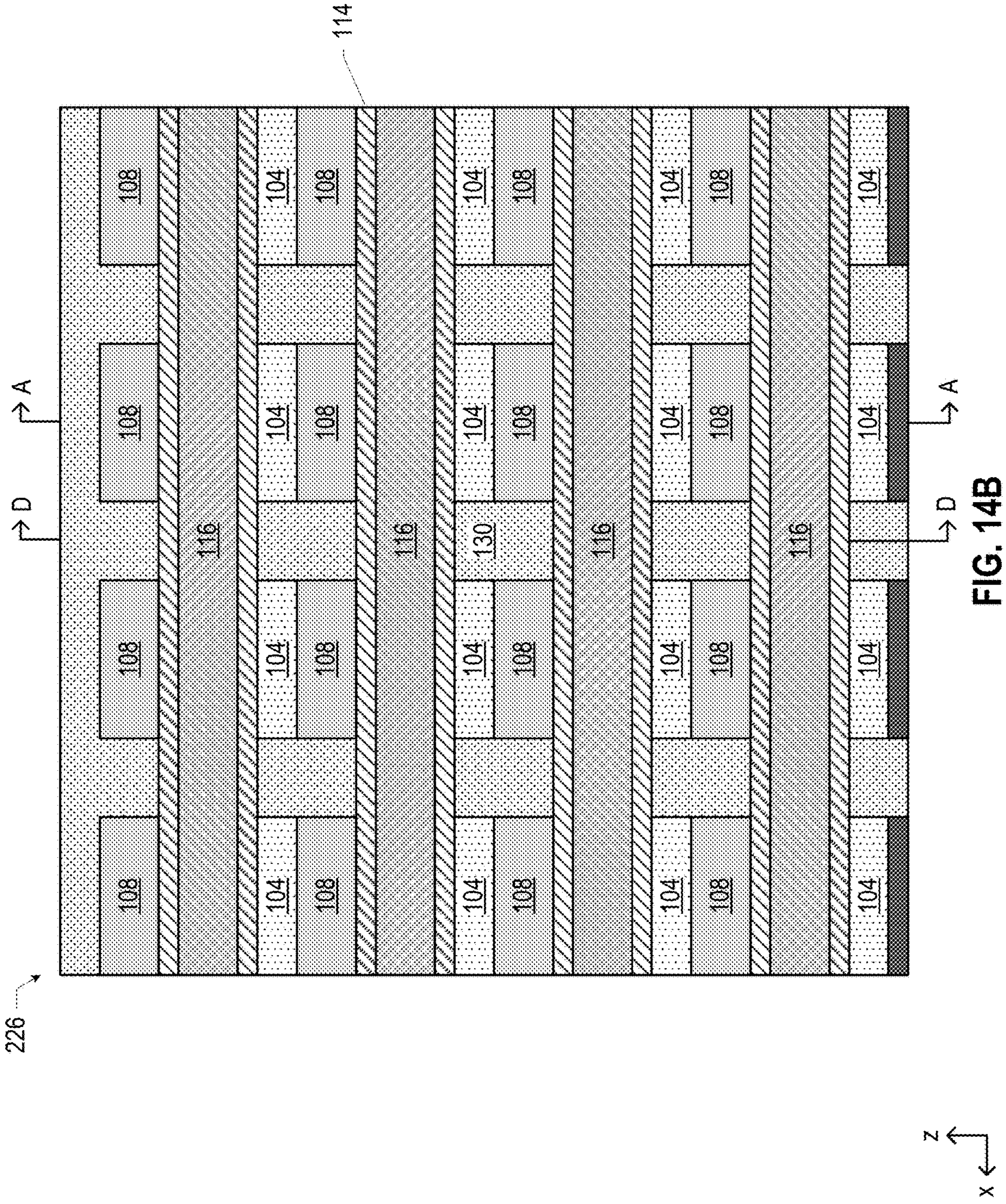
Figure 14C:
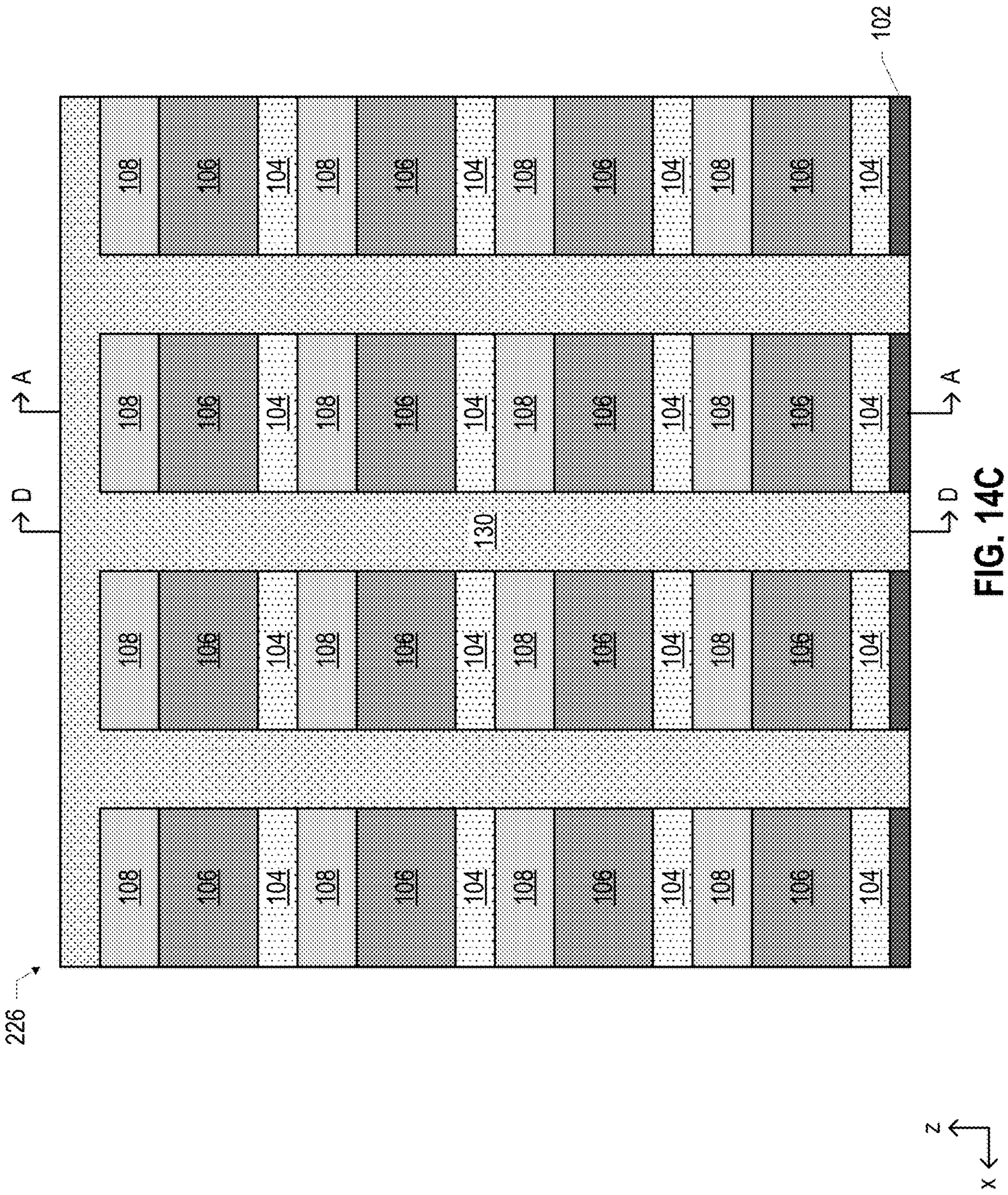
Figure 14D:
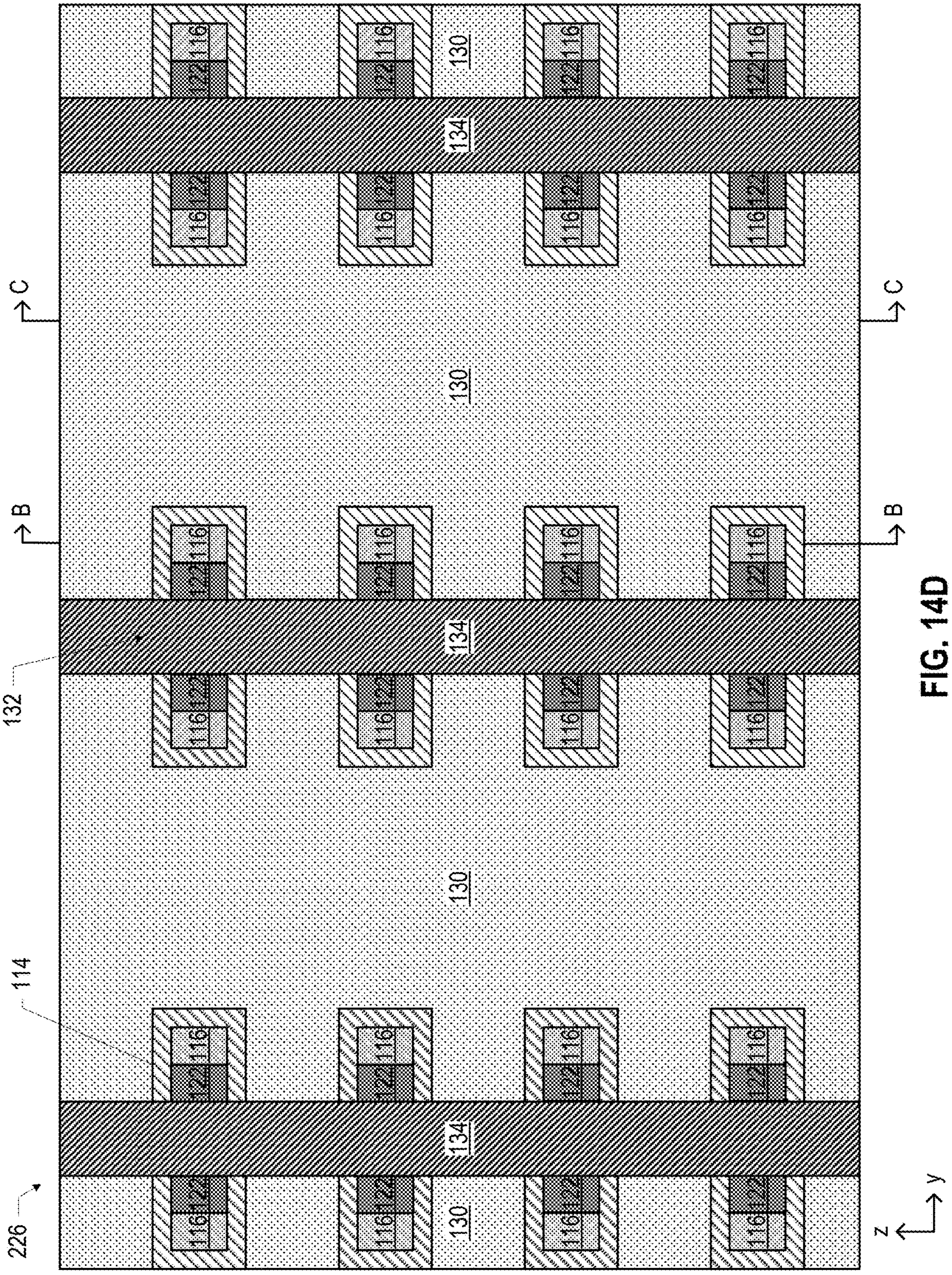
Figure 15A:
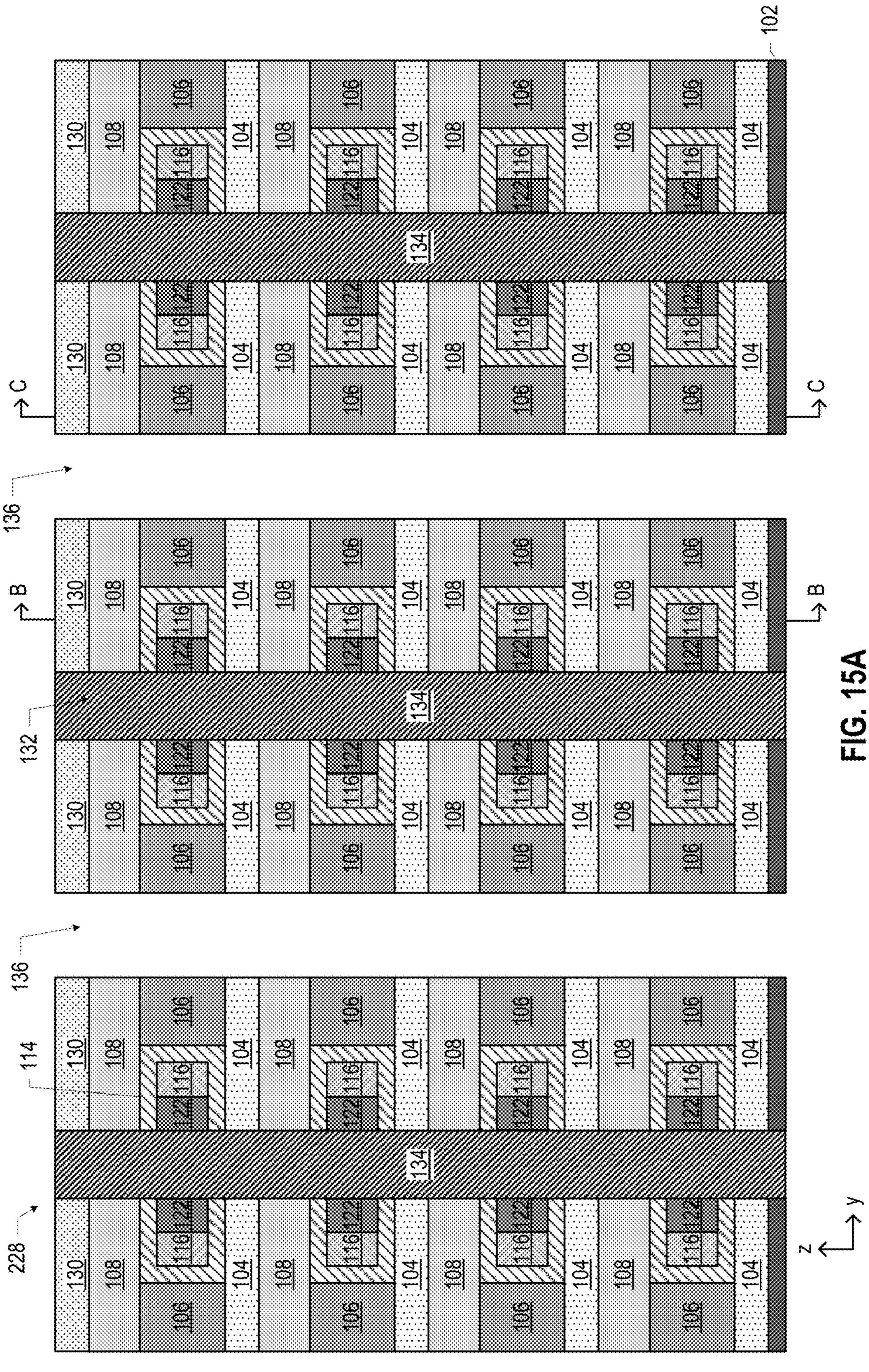
Figure 15B:
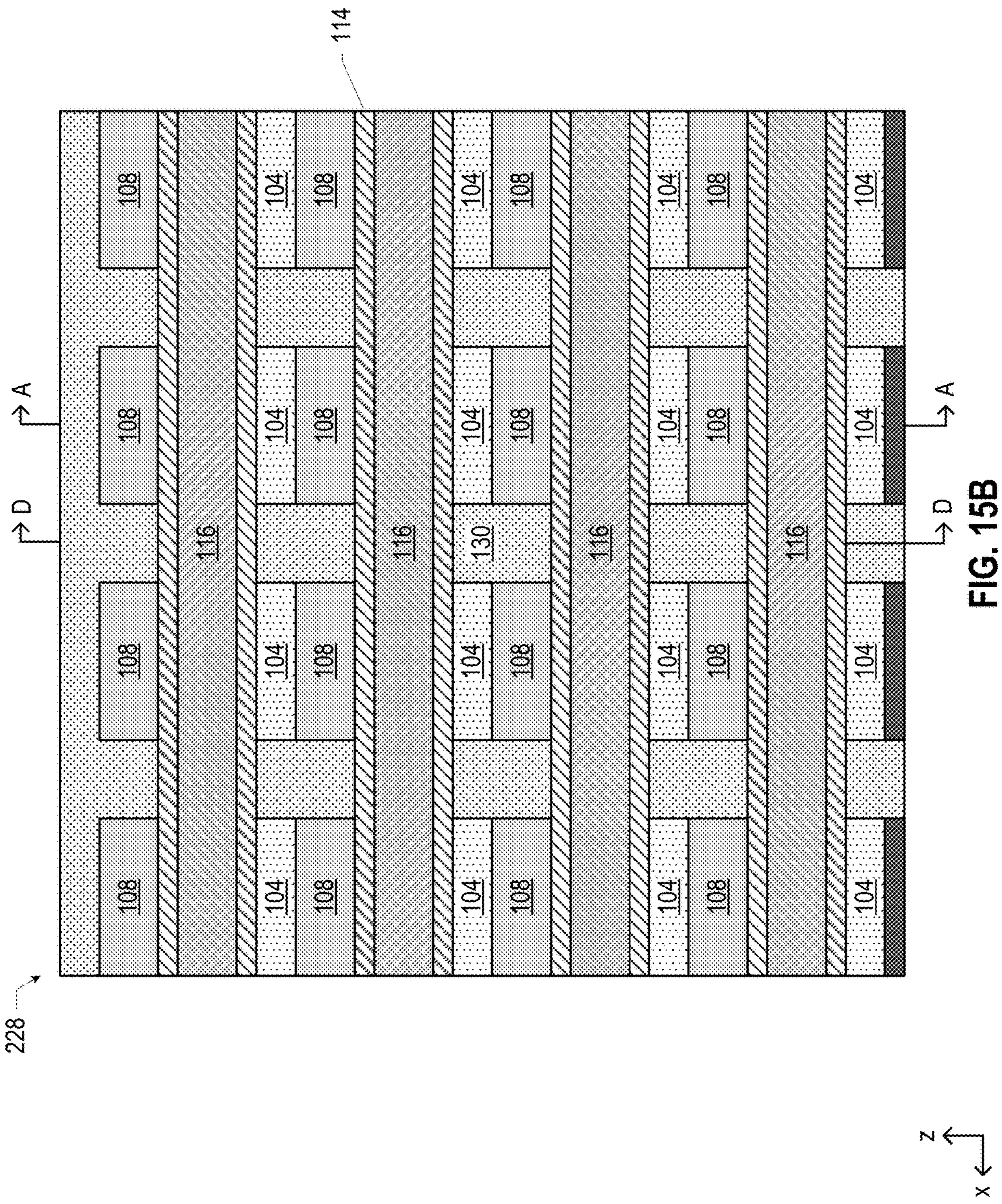
Figure 15C:
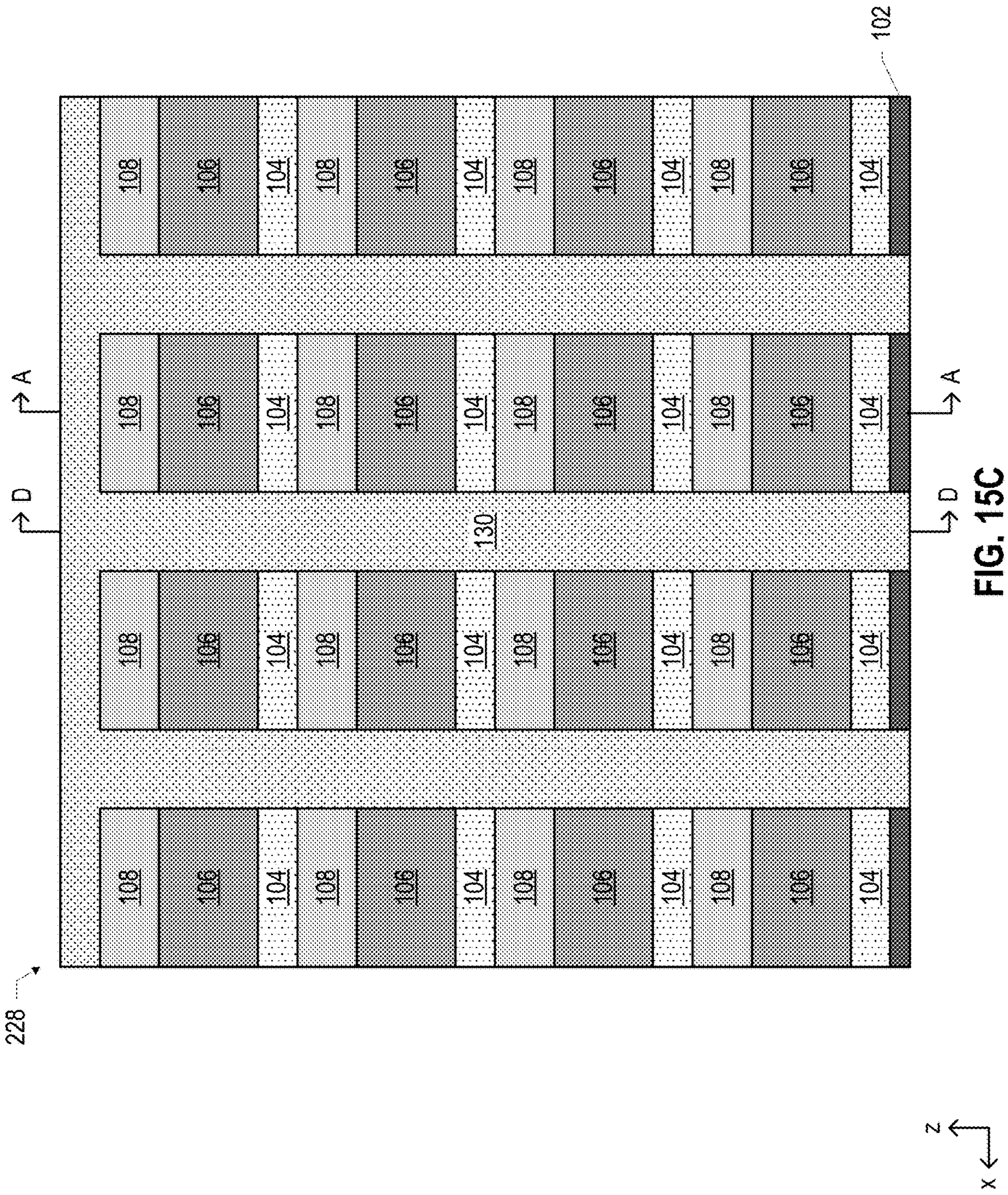
Figure 15D:
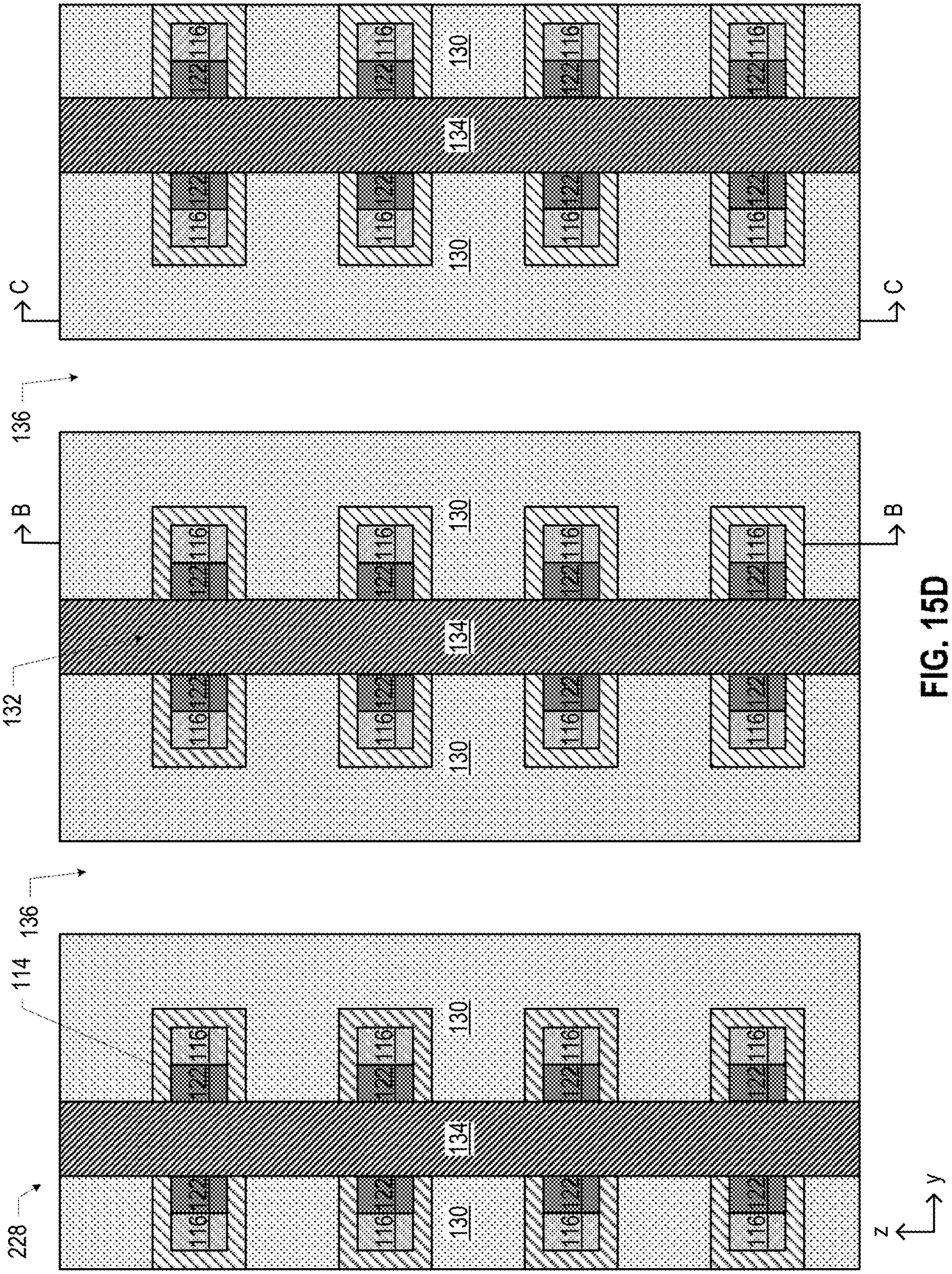
Figure 16A:
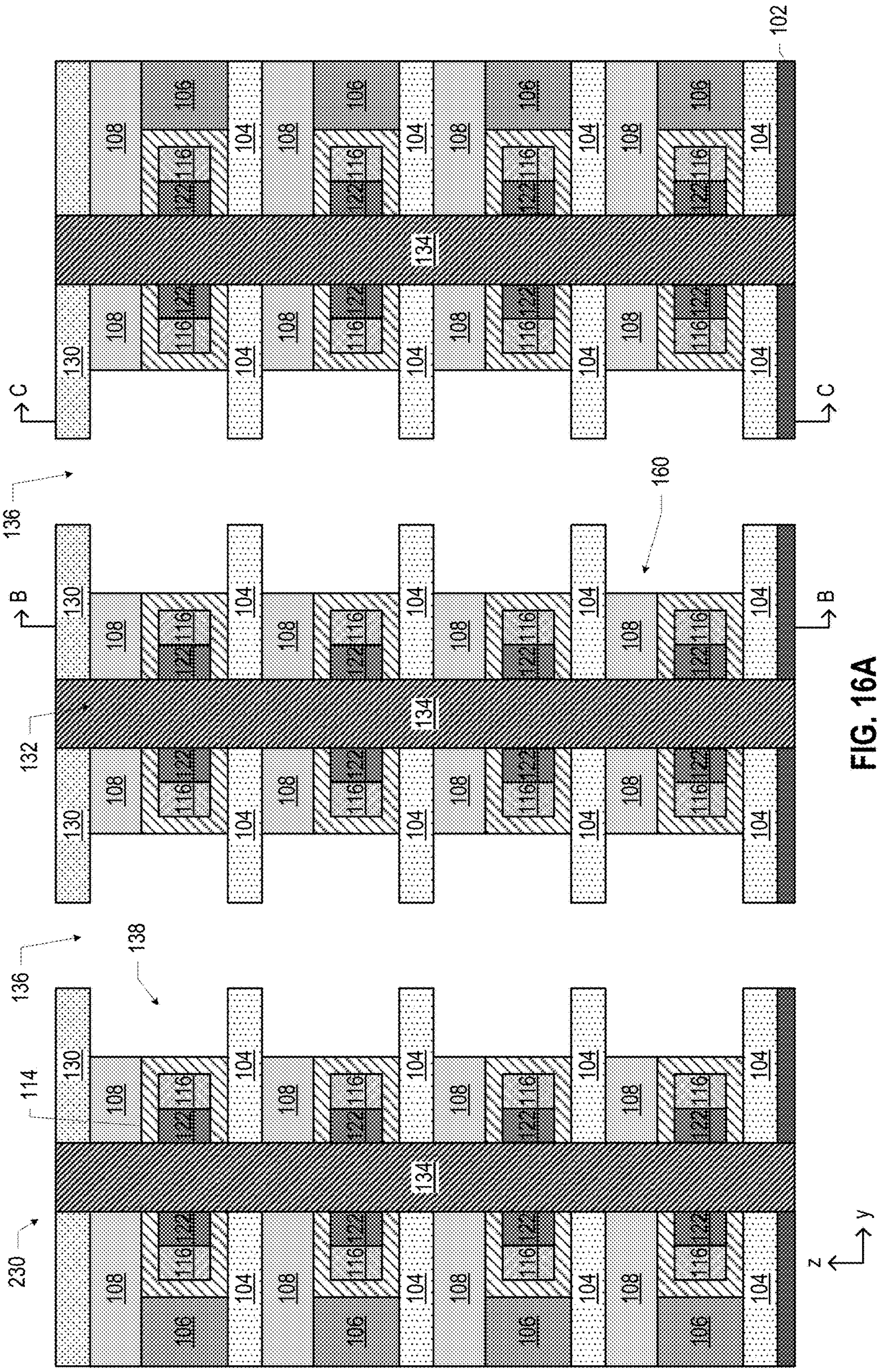
Figure 16B:
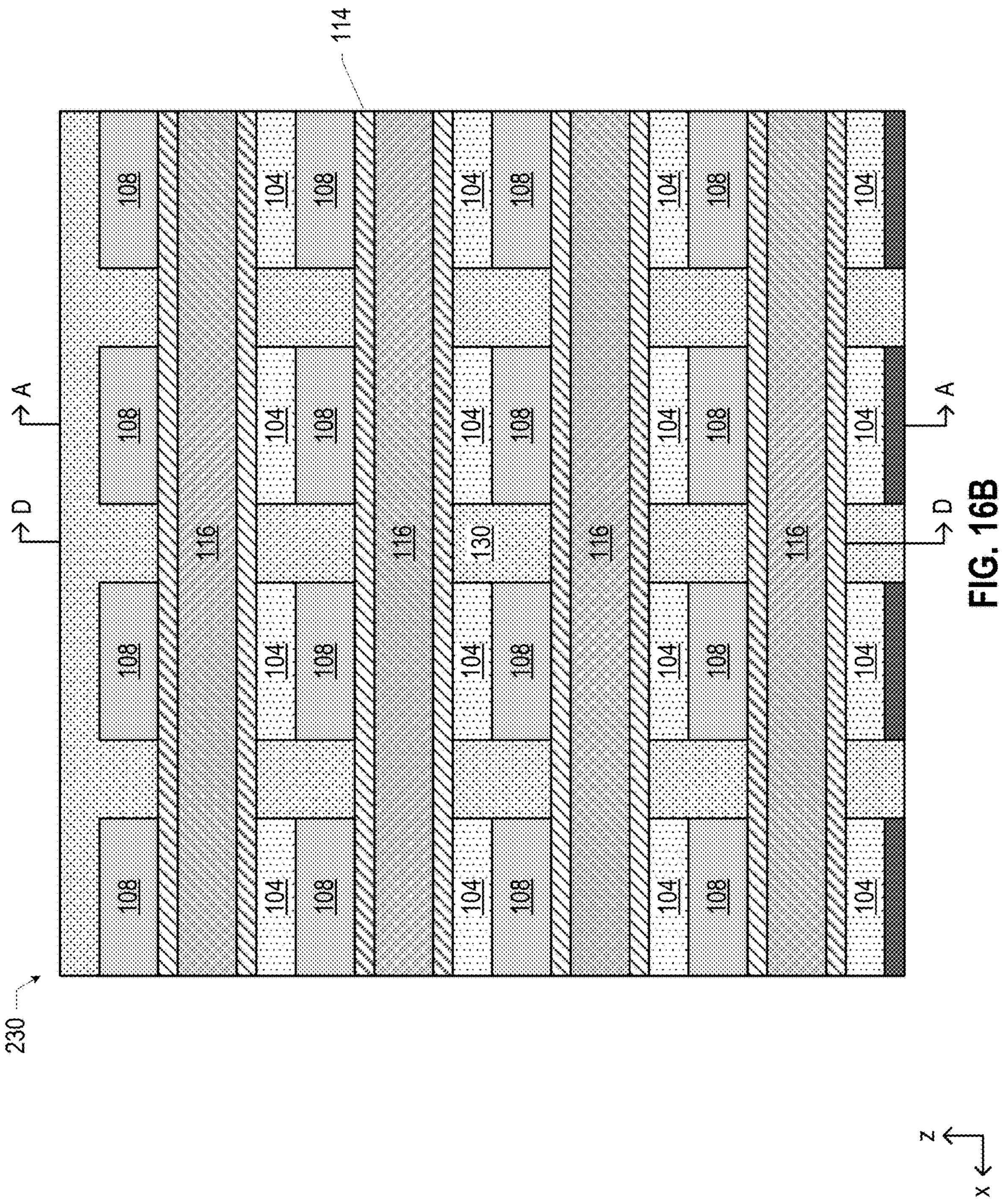
Figure 16C:
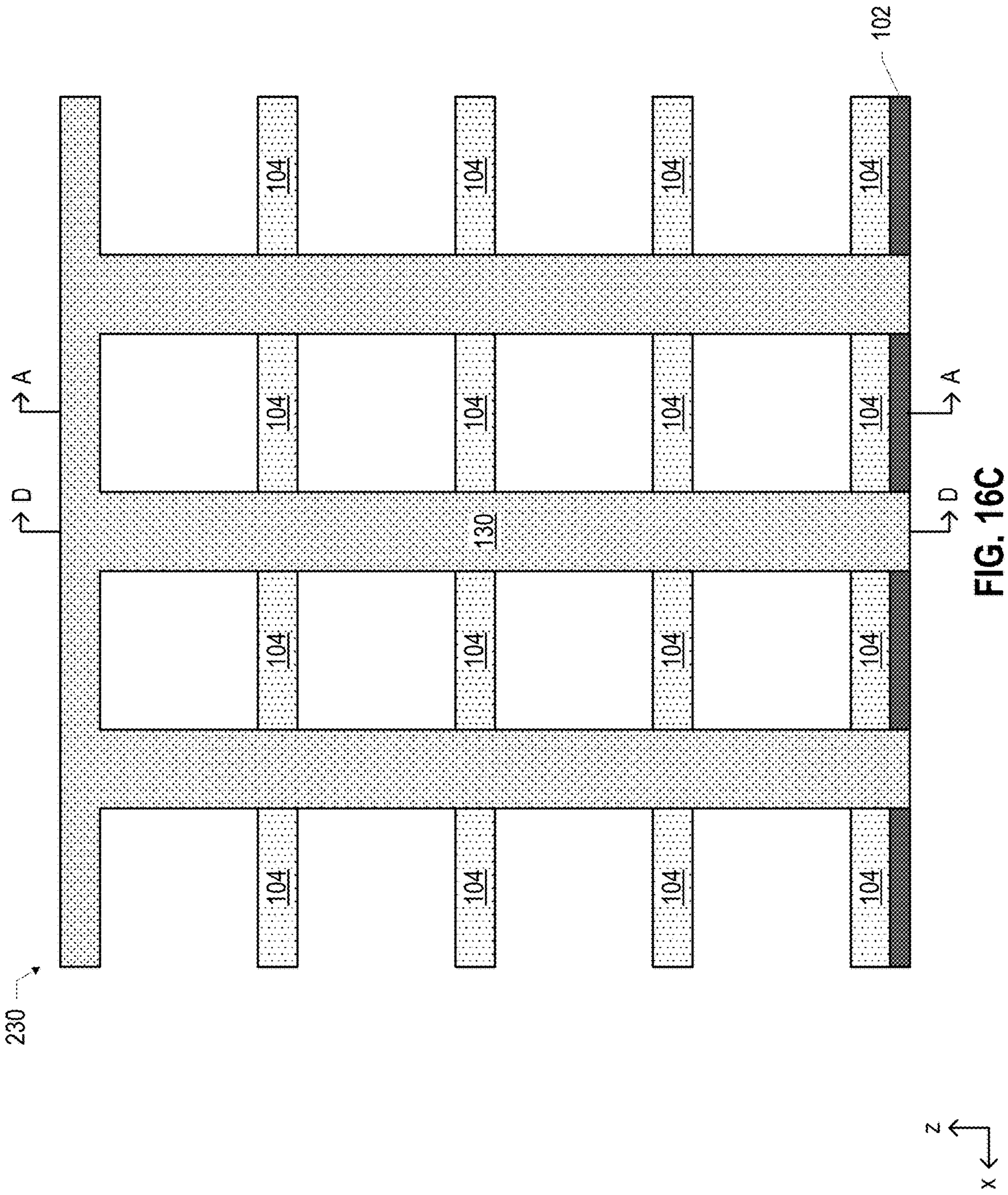
Figure 16D:
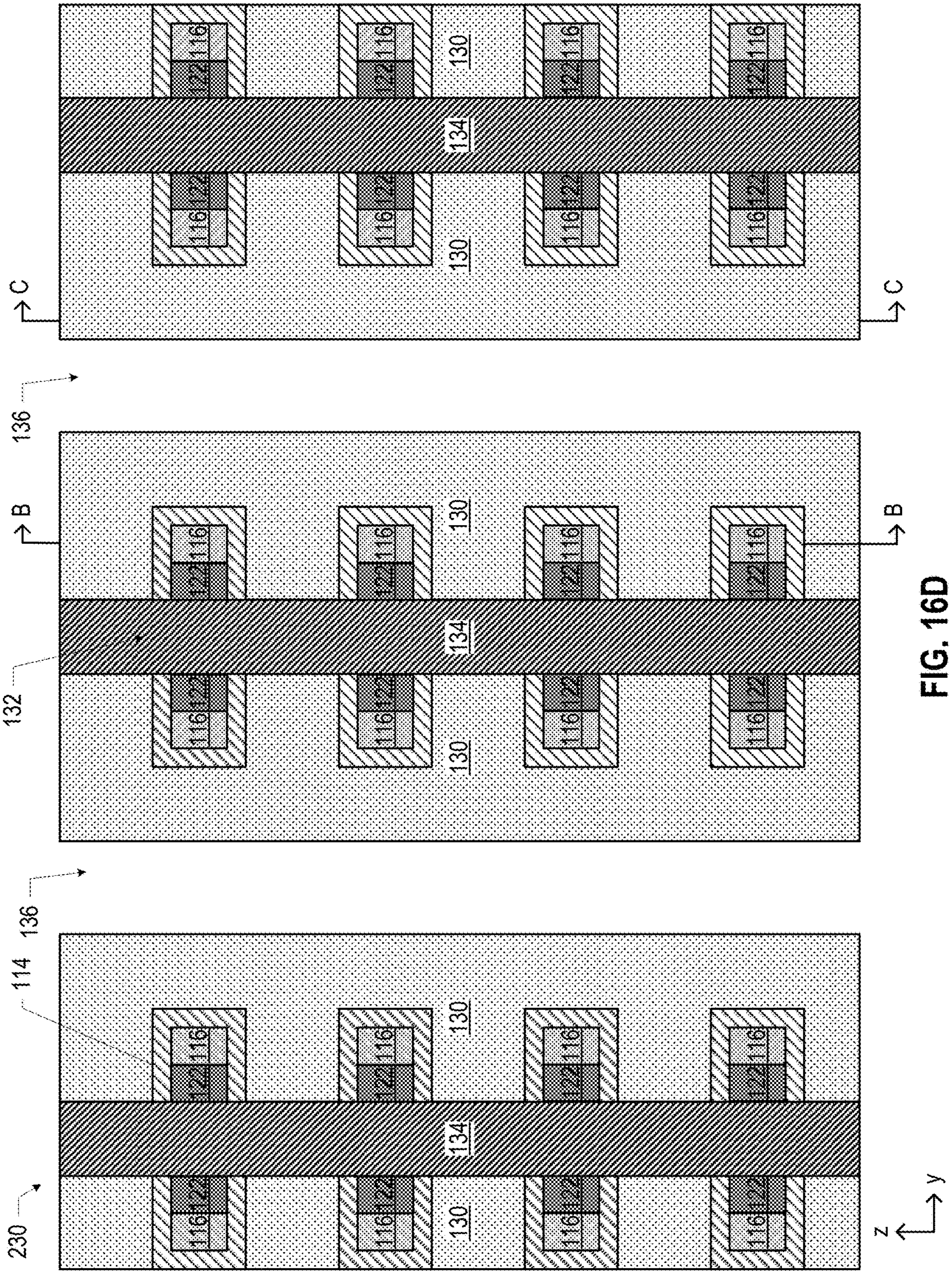
Figure 17A:
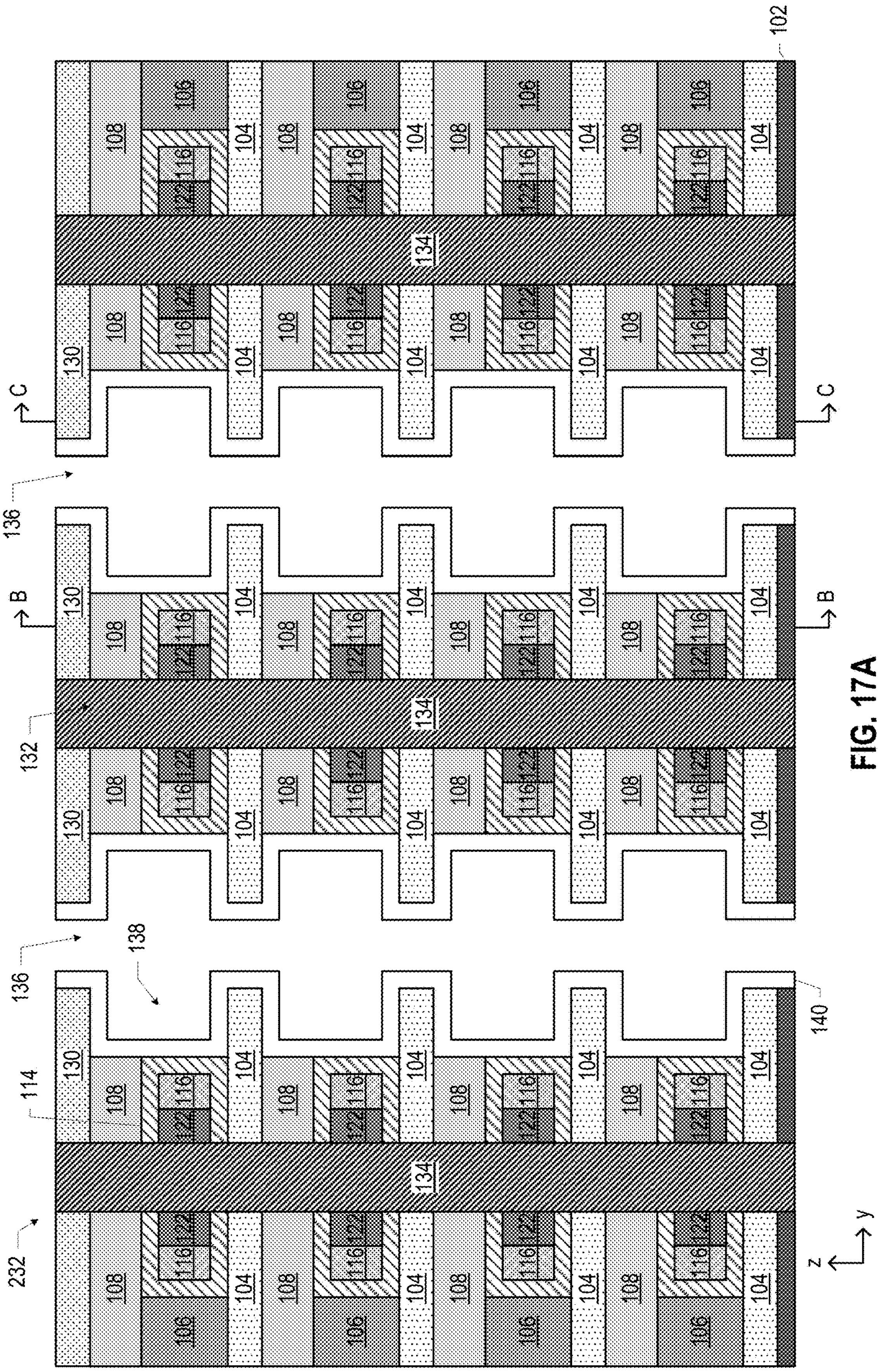
Figure 17B:
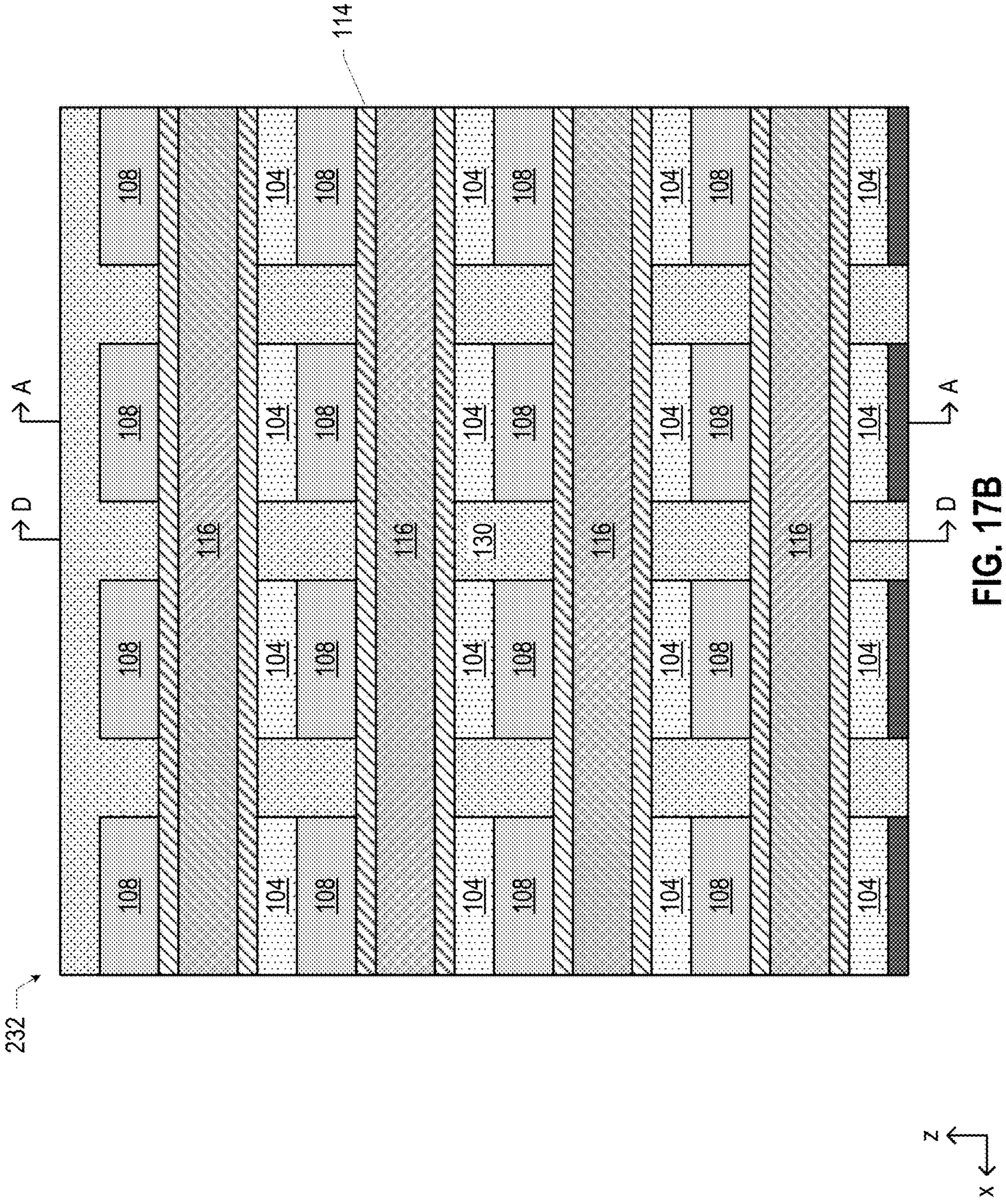
Figure 17C:
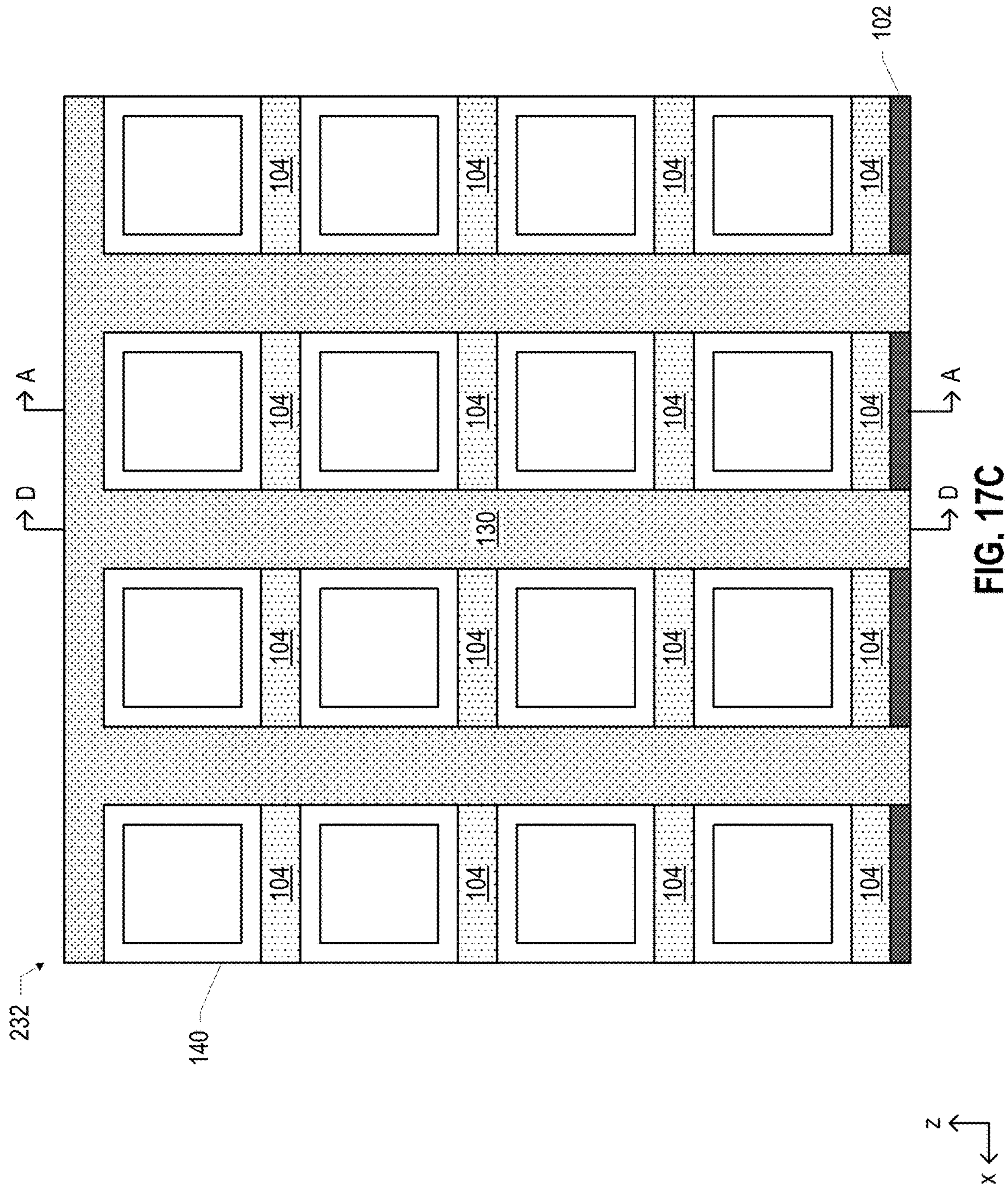
Figure 17D:
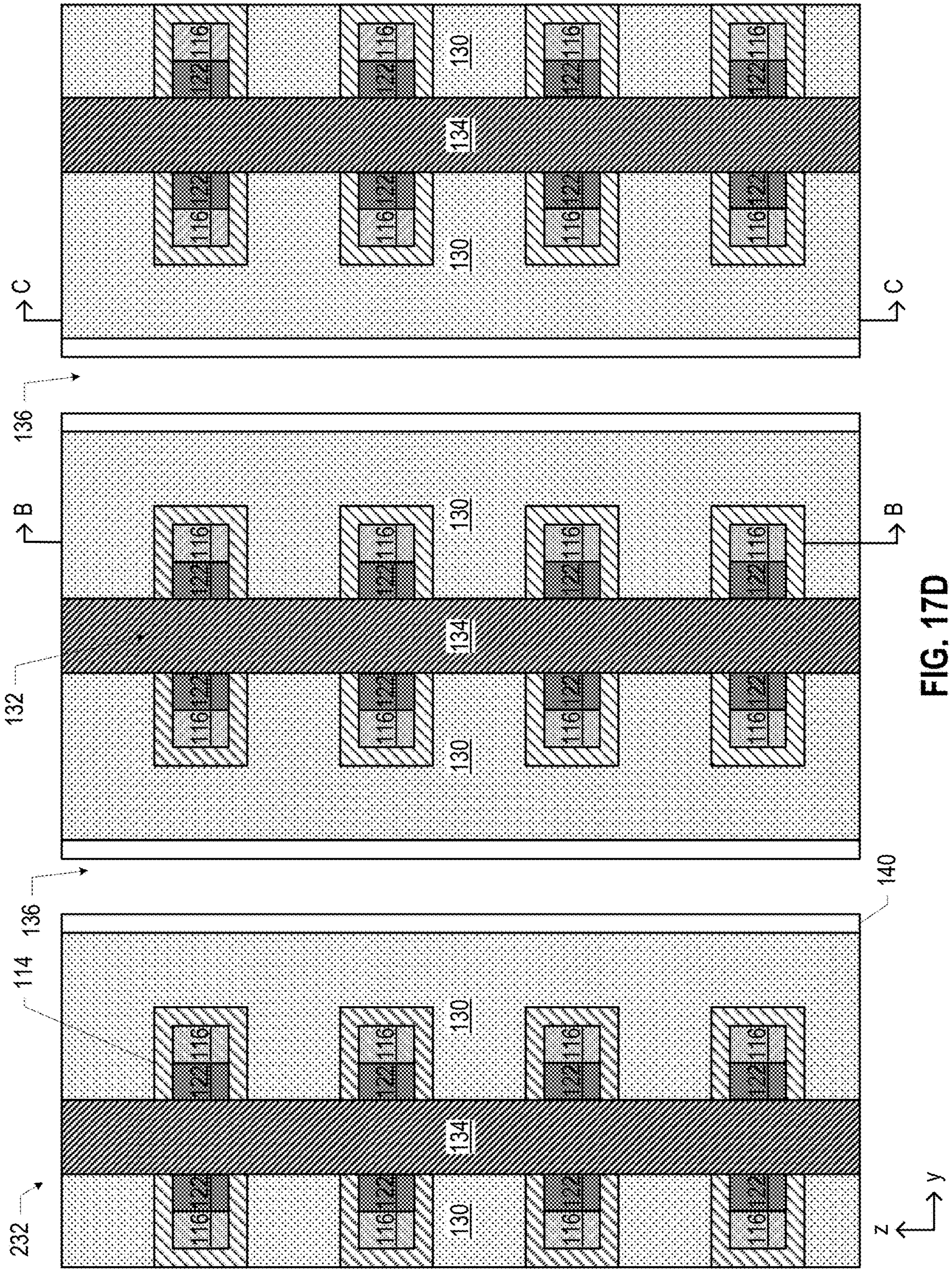
Figure 18A:
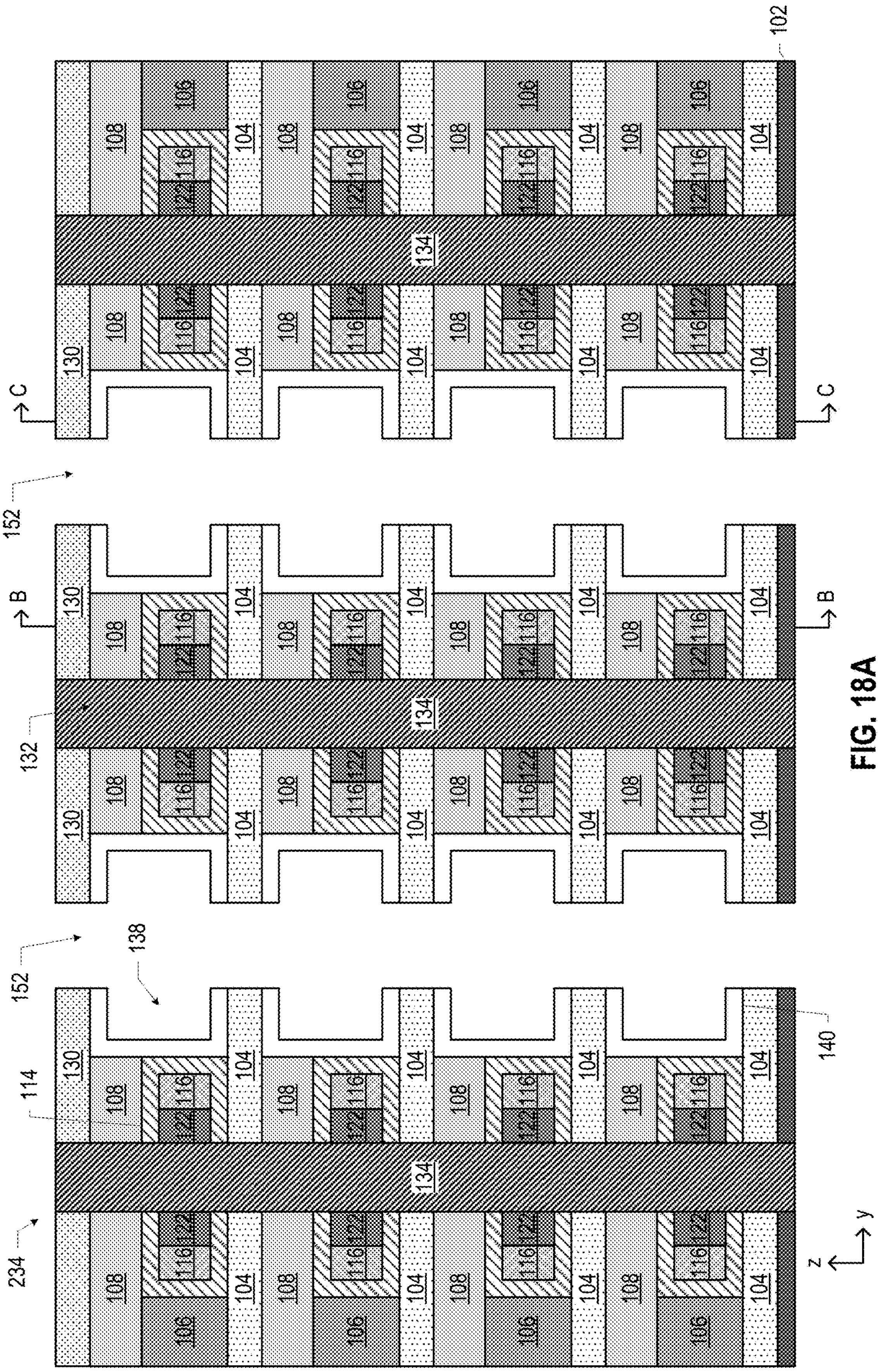
Figure 18B:
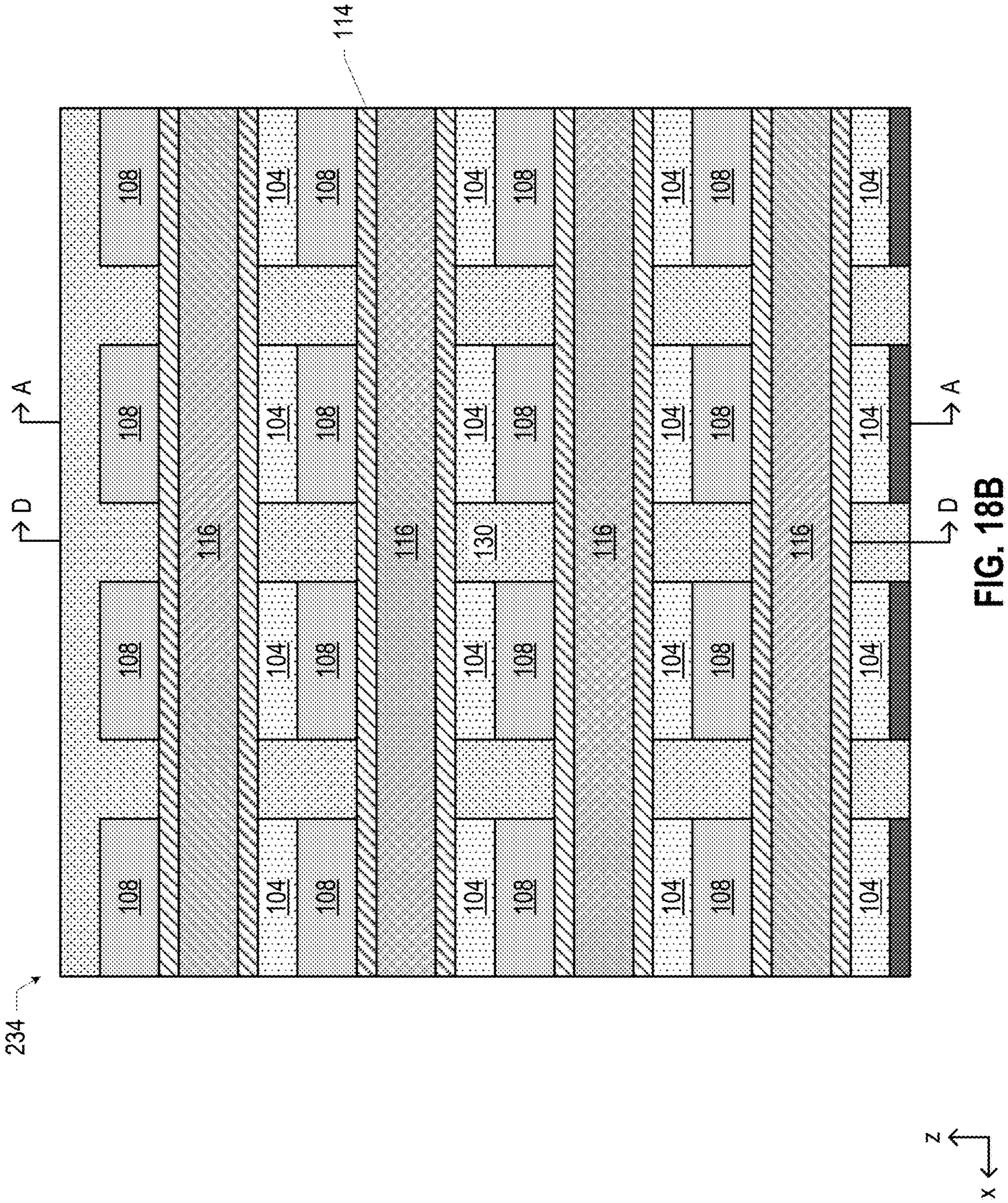
Figure 18C:
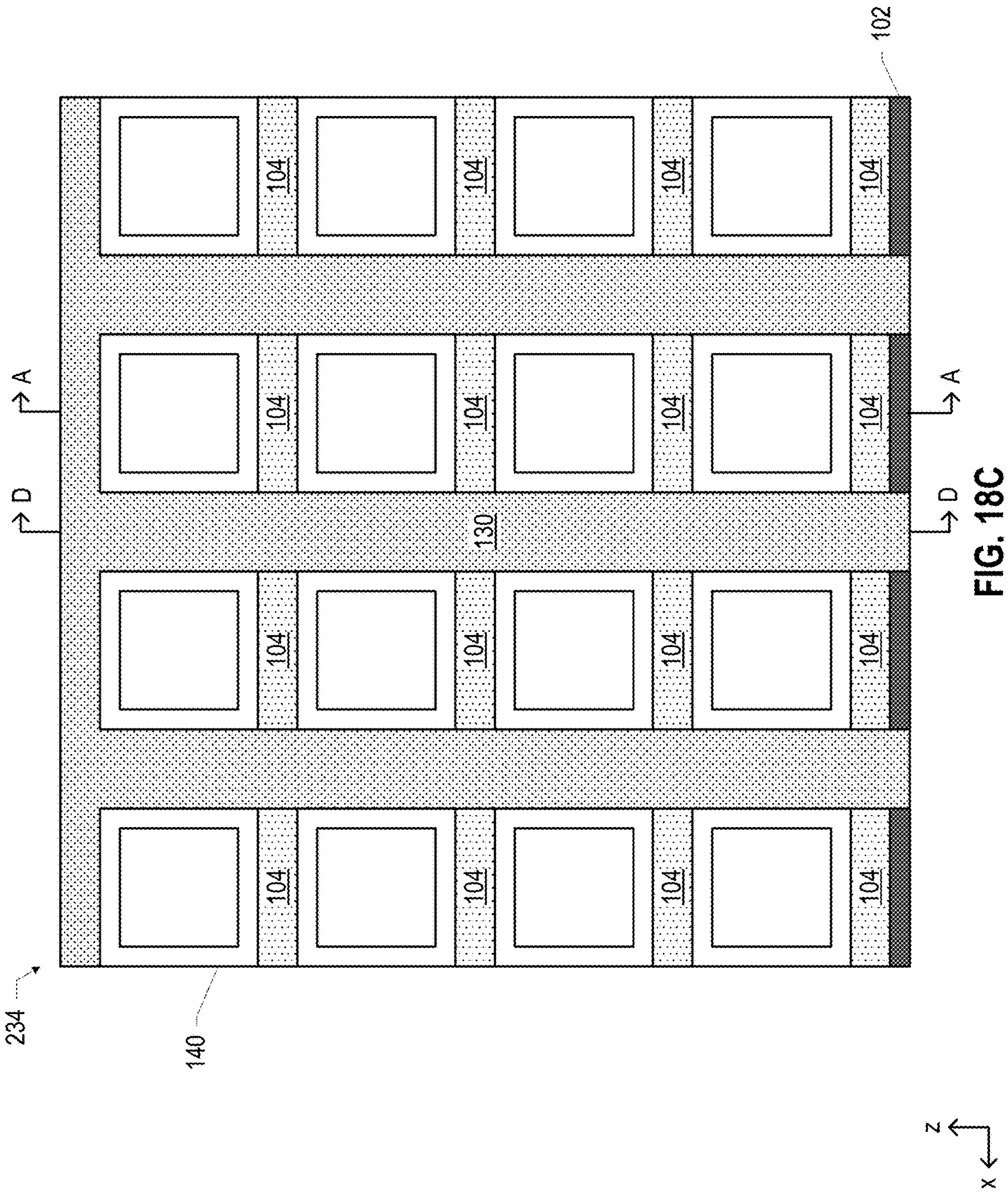
Figure 18D:
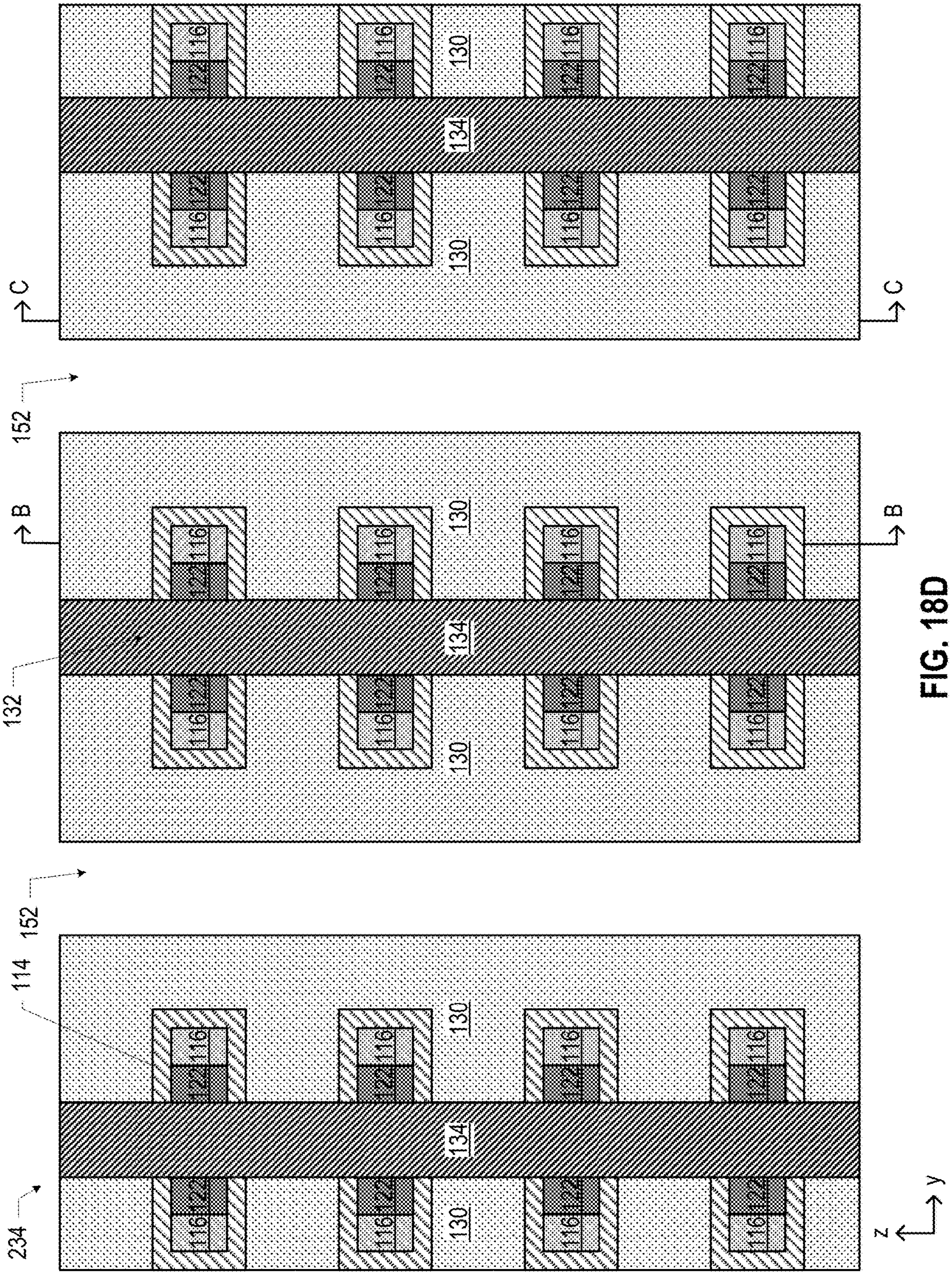
Figure 19A:
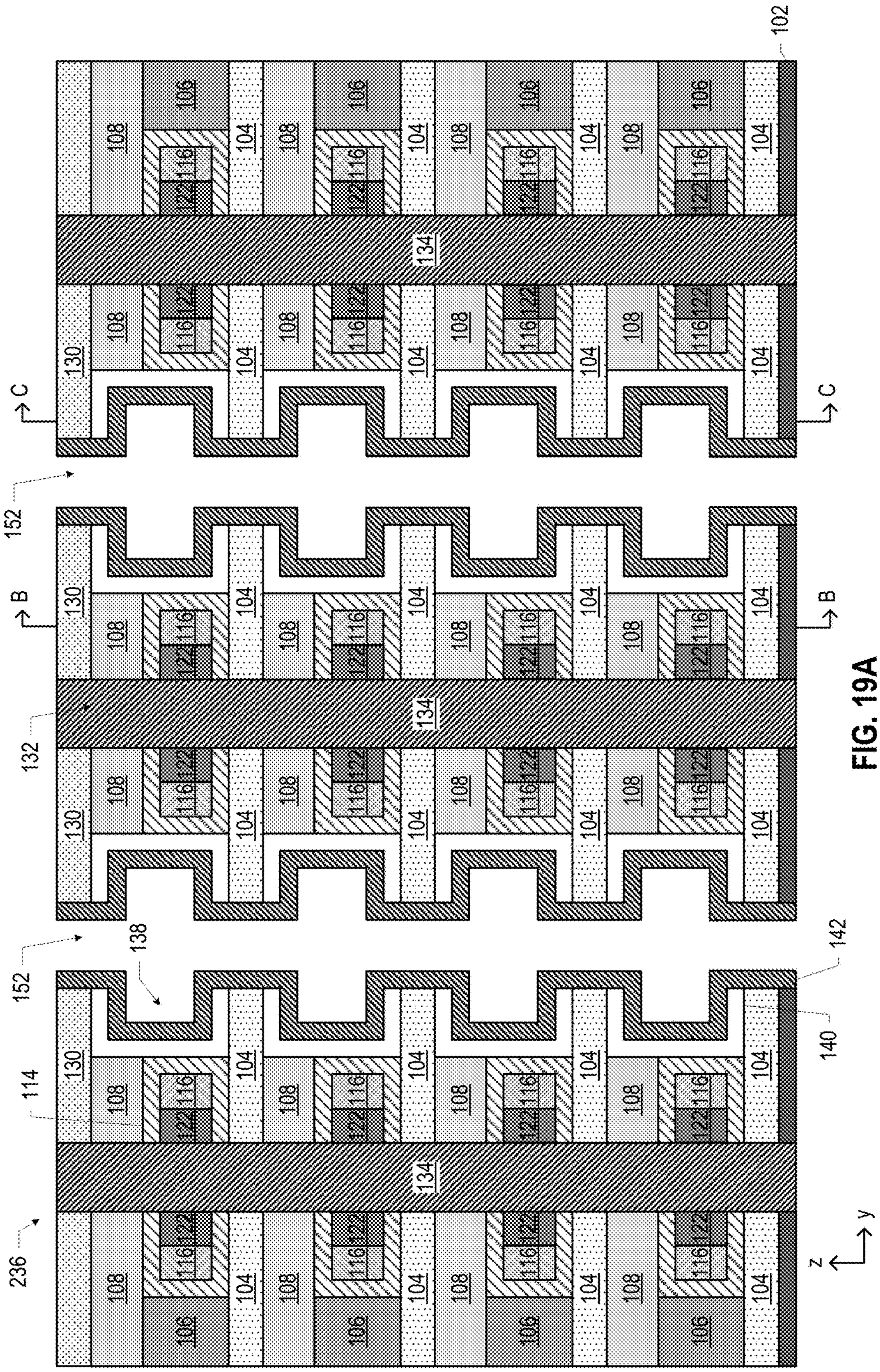
Figure 19B:
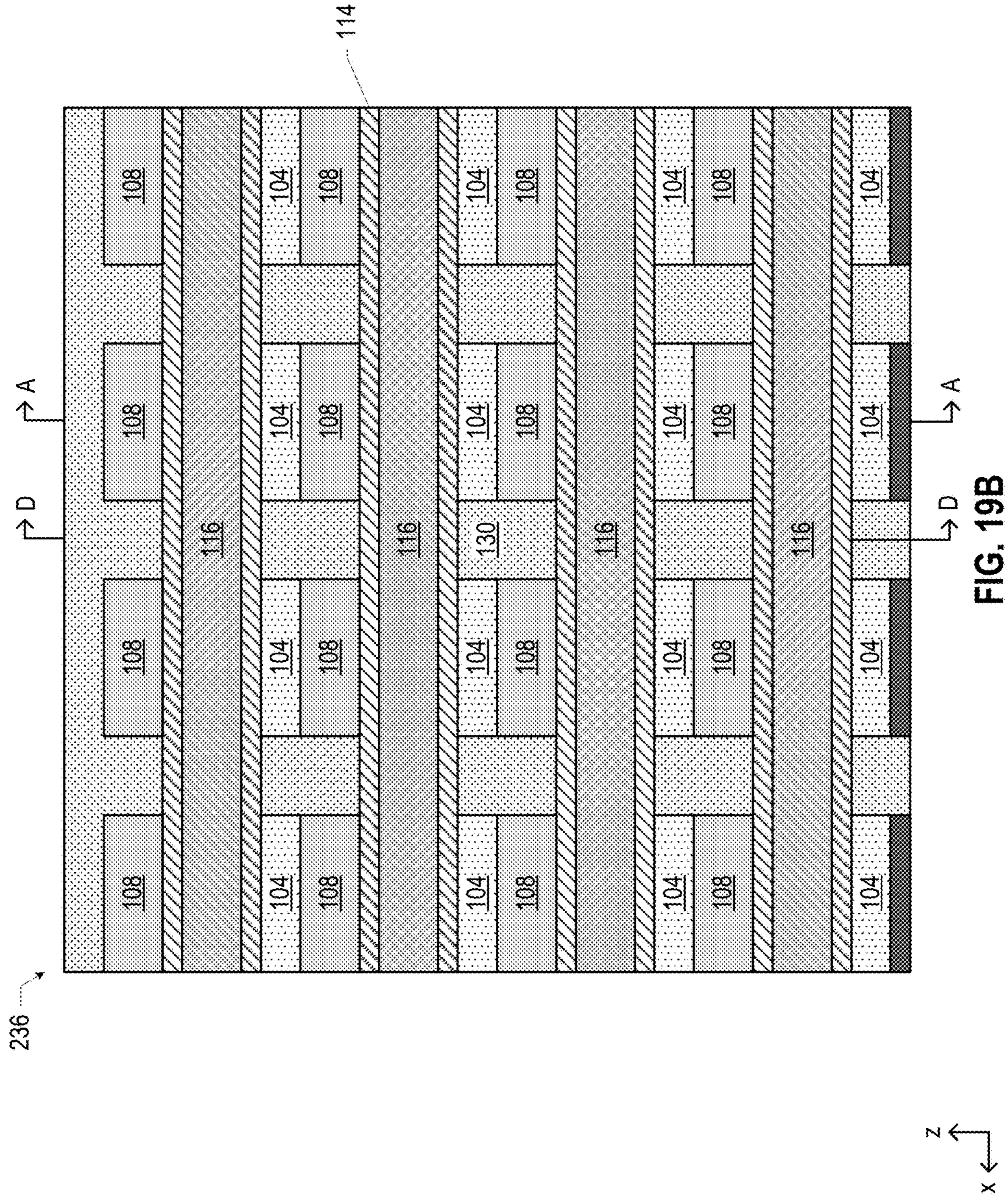
Figure 19C:
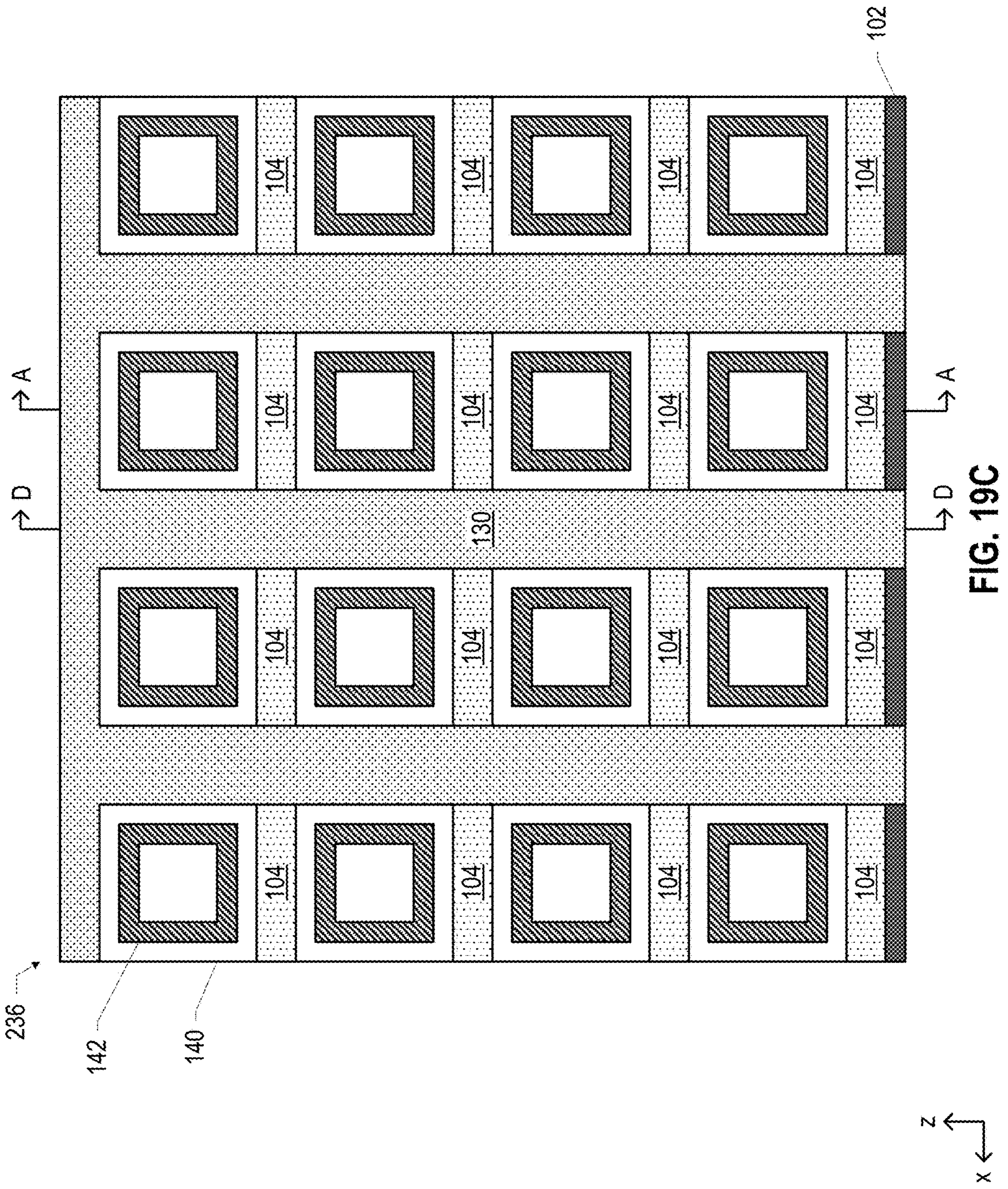
Figure 19D:
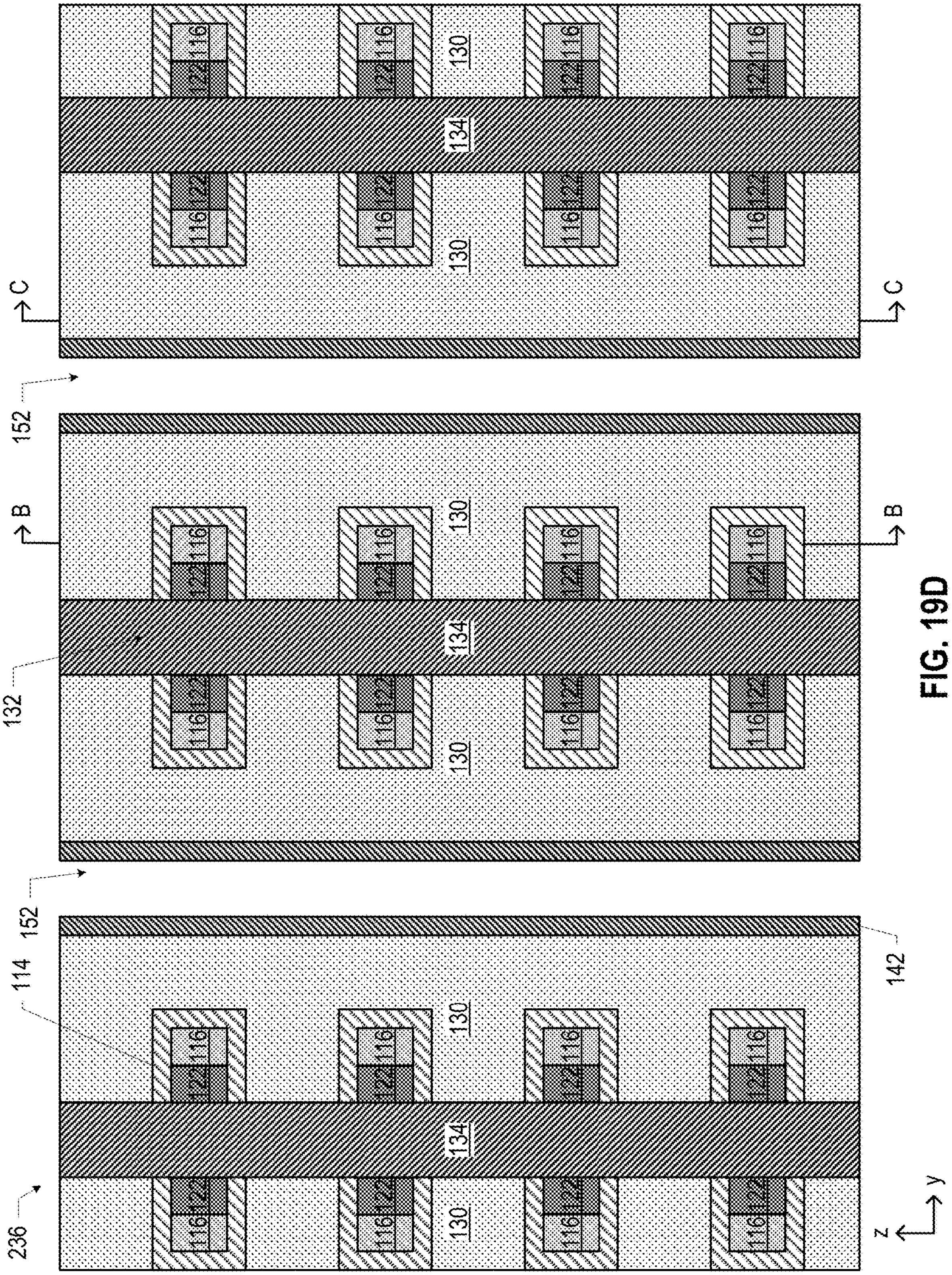
Figure 20A:
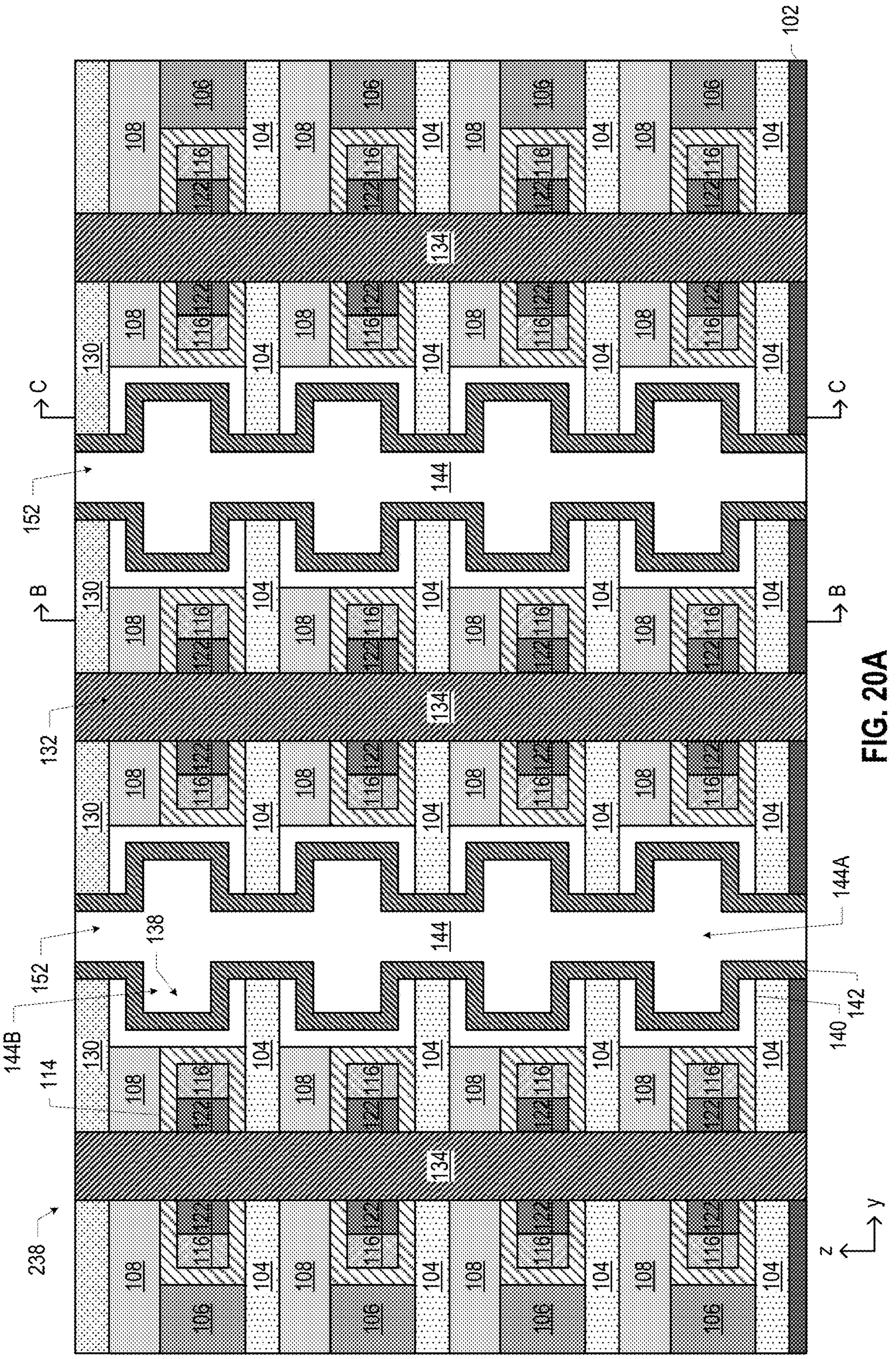
Figure 20B:
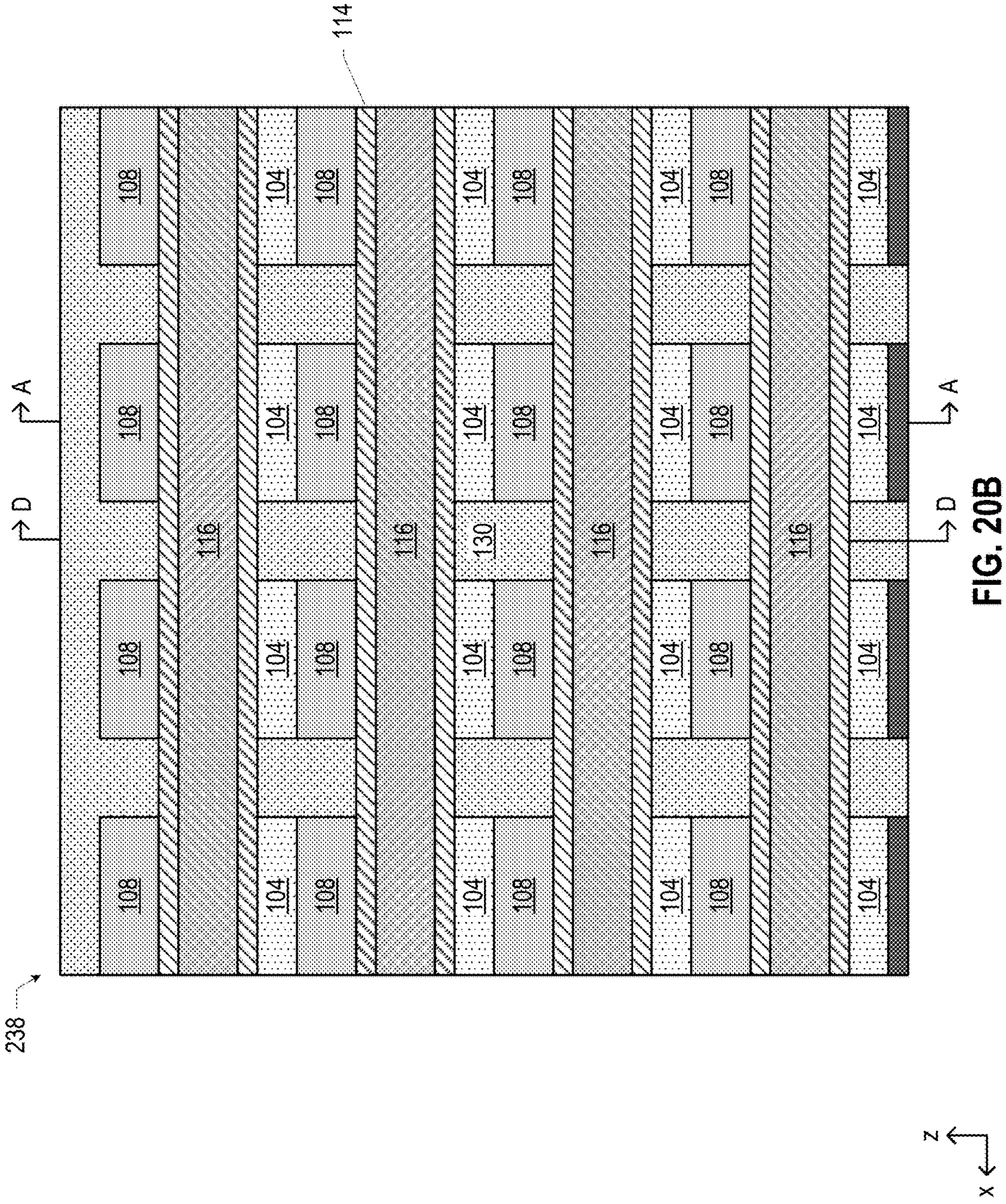
Figure 20C:
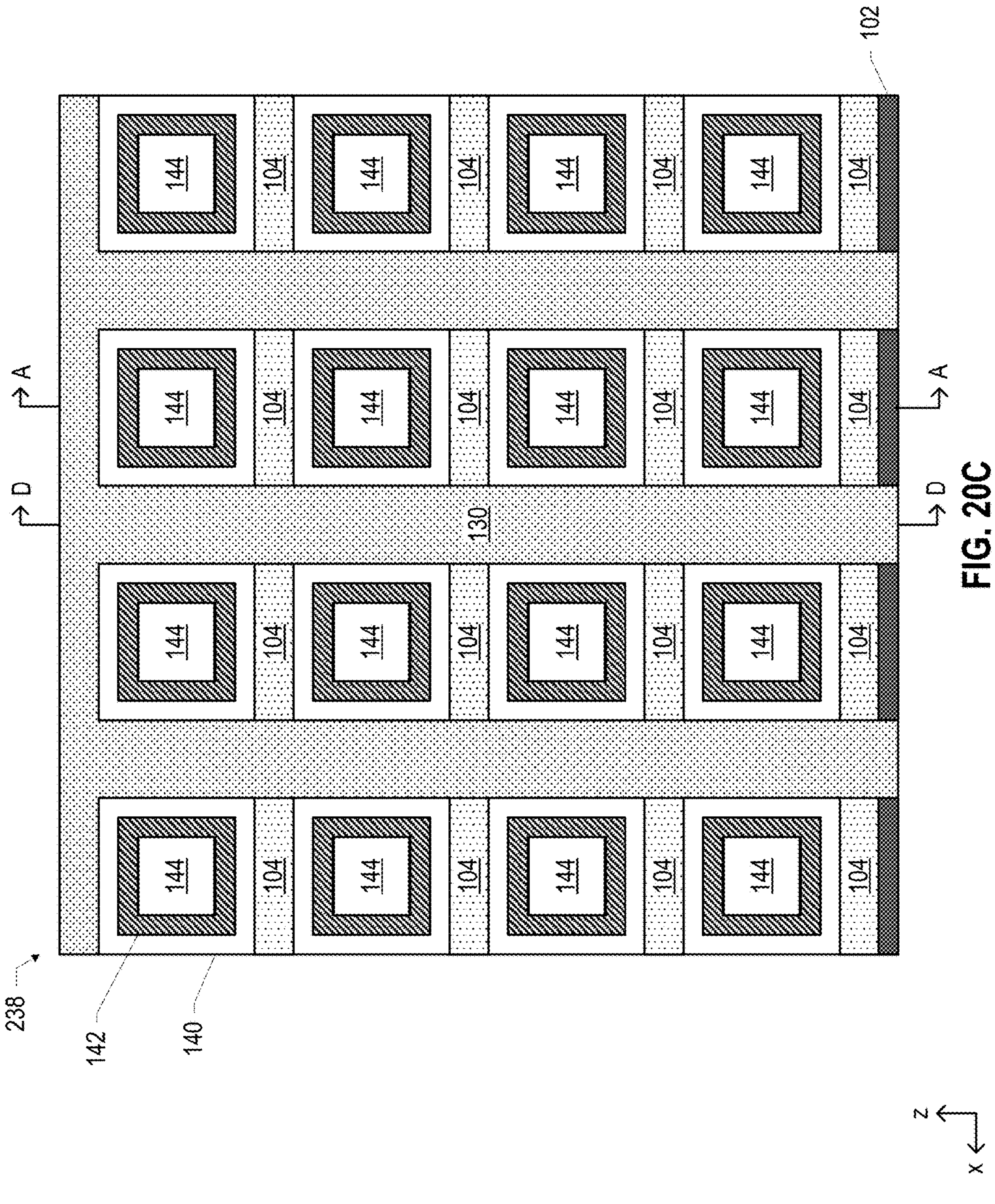
Figure 20D:
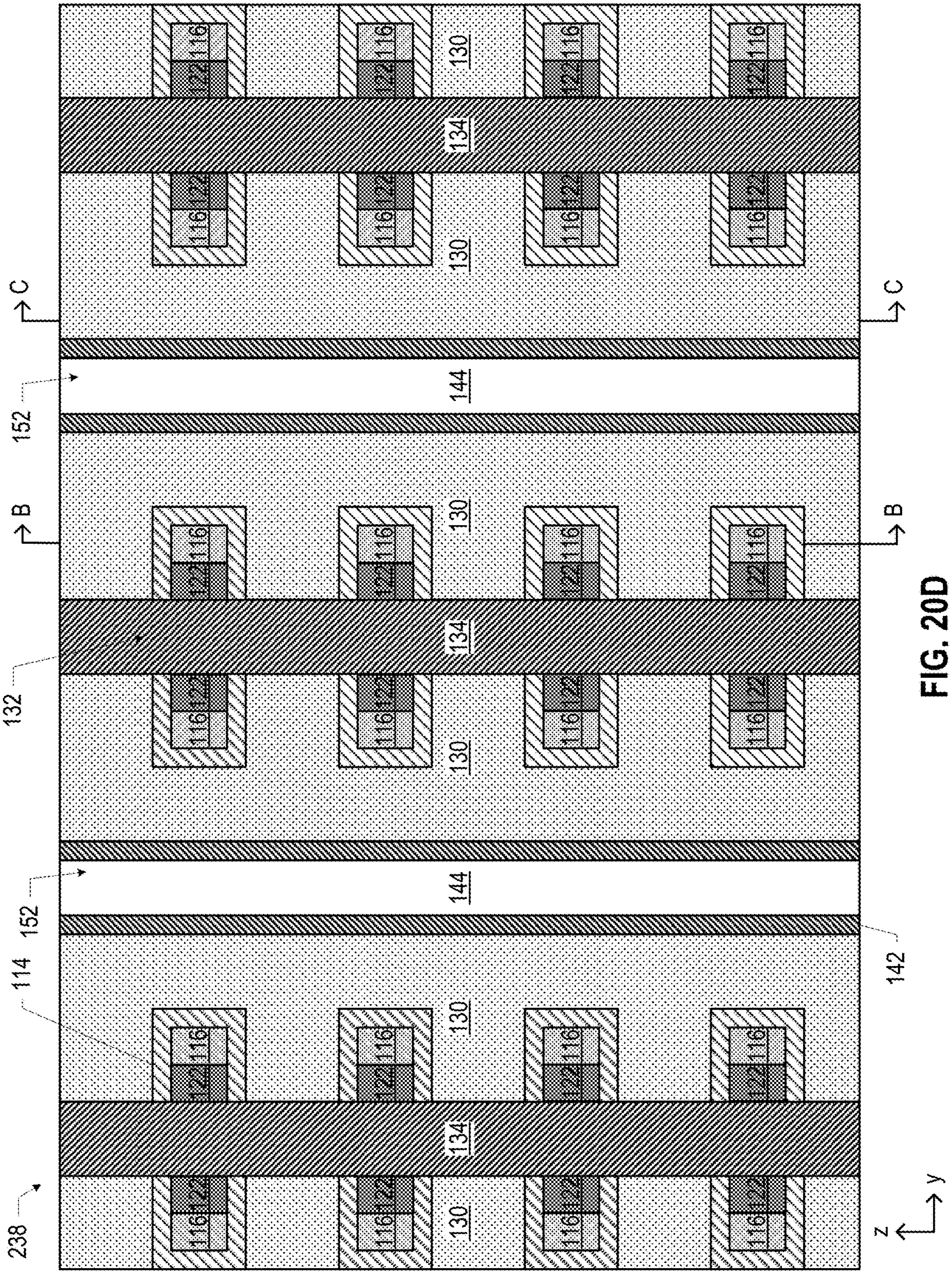
Figure 21A:
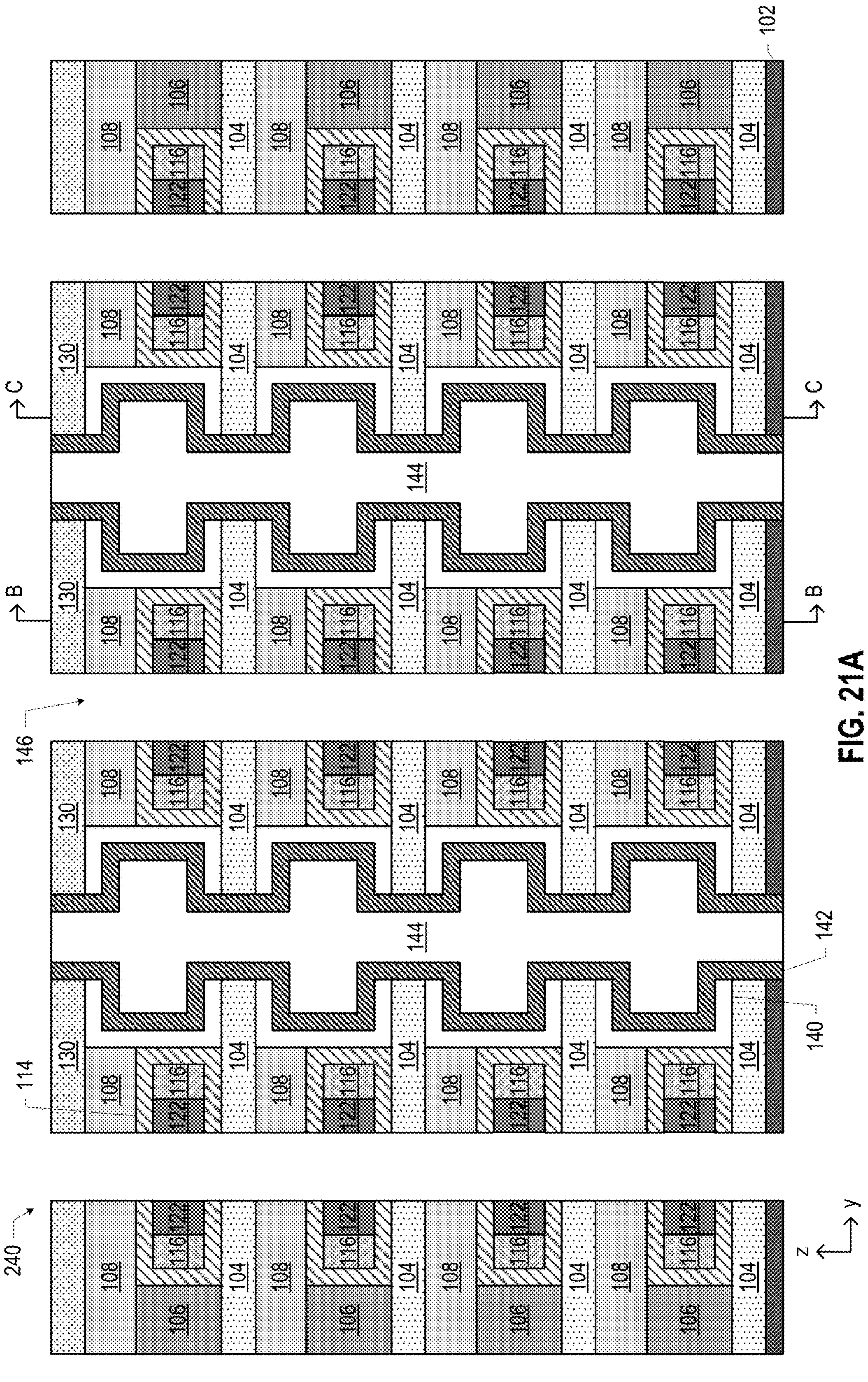
Figure 21B:
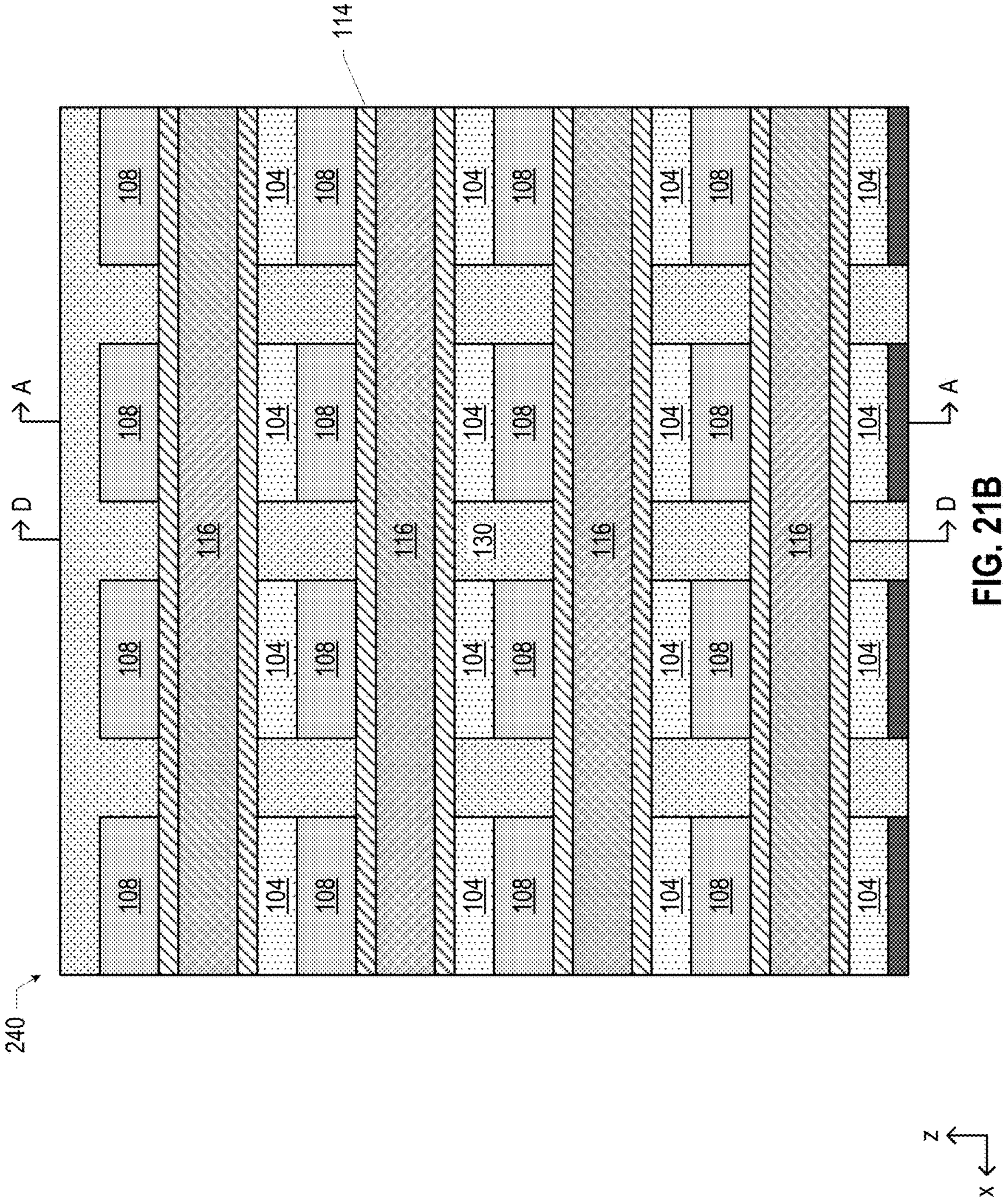
Figure 21C:
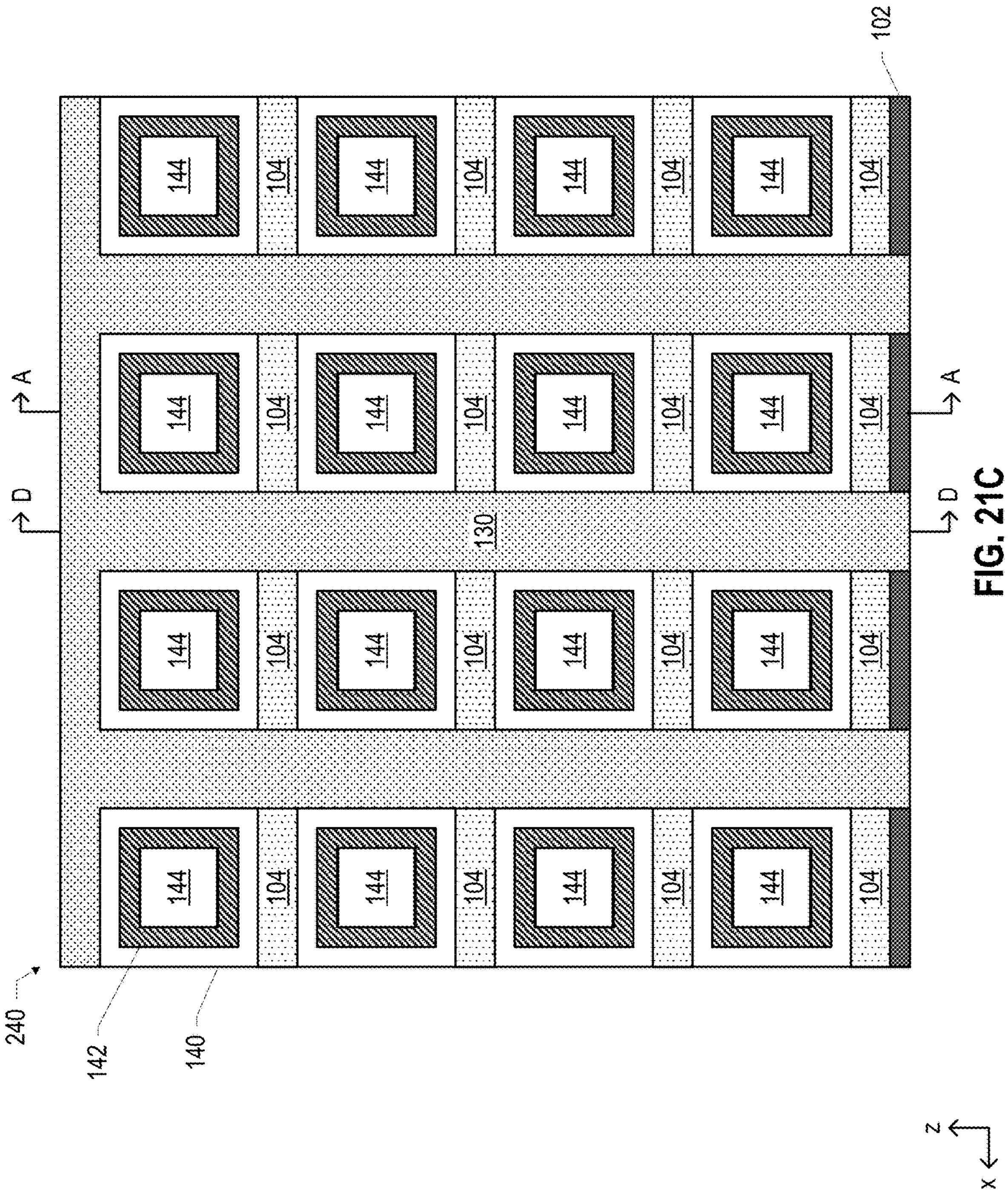
Figure 21D:
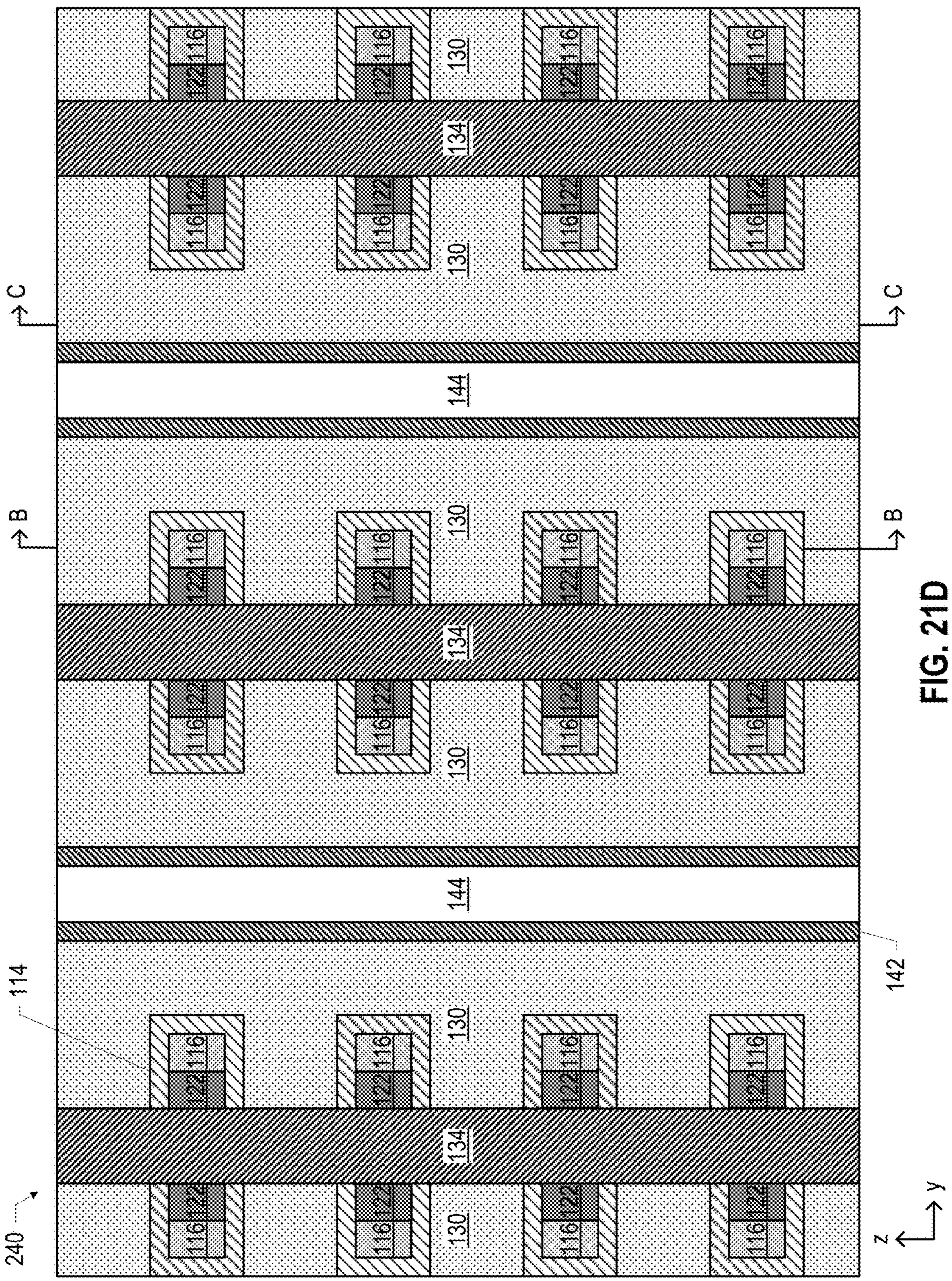
Figure 21E:
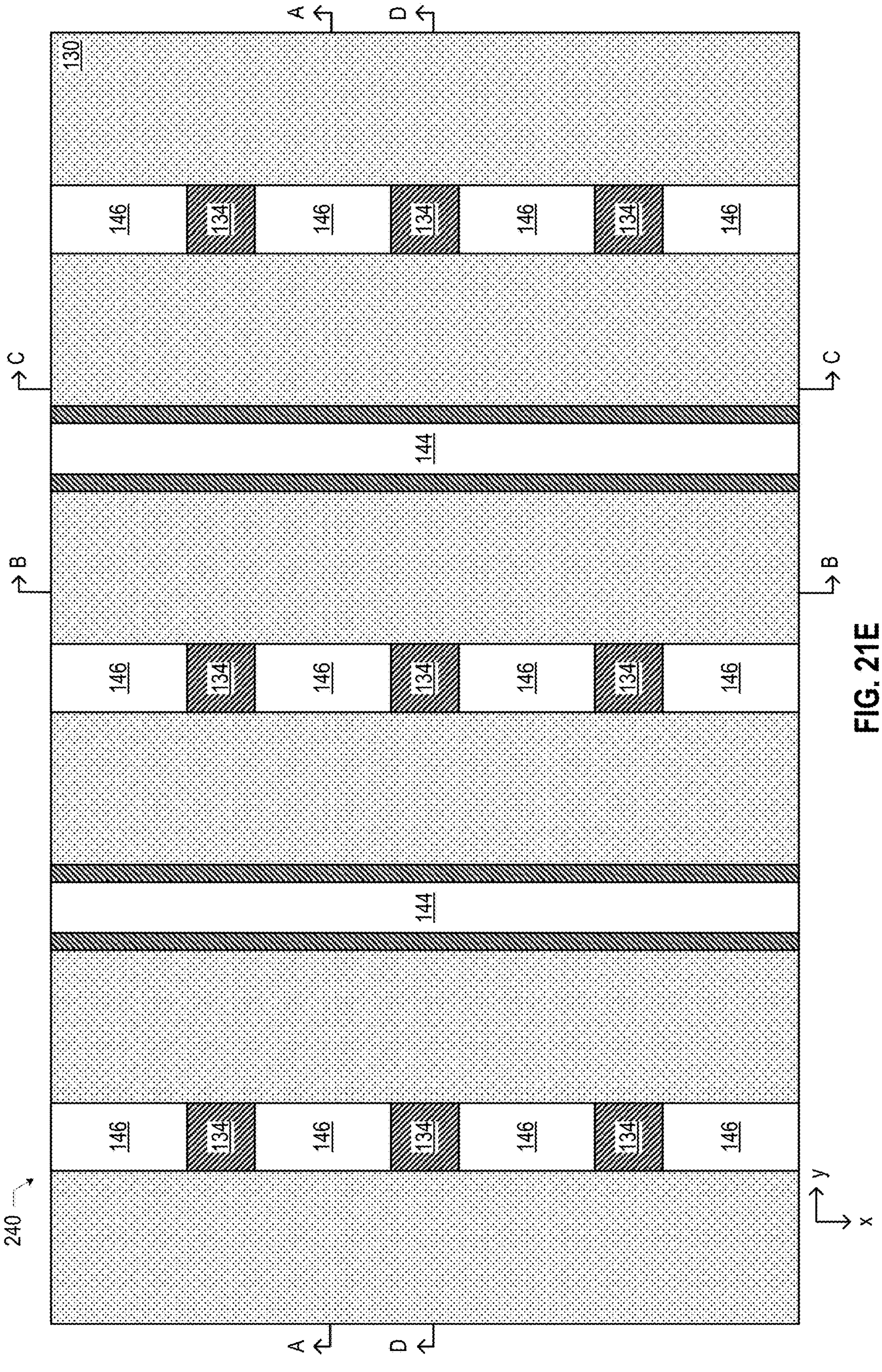
Figure 22A:
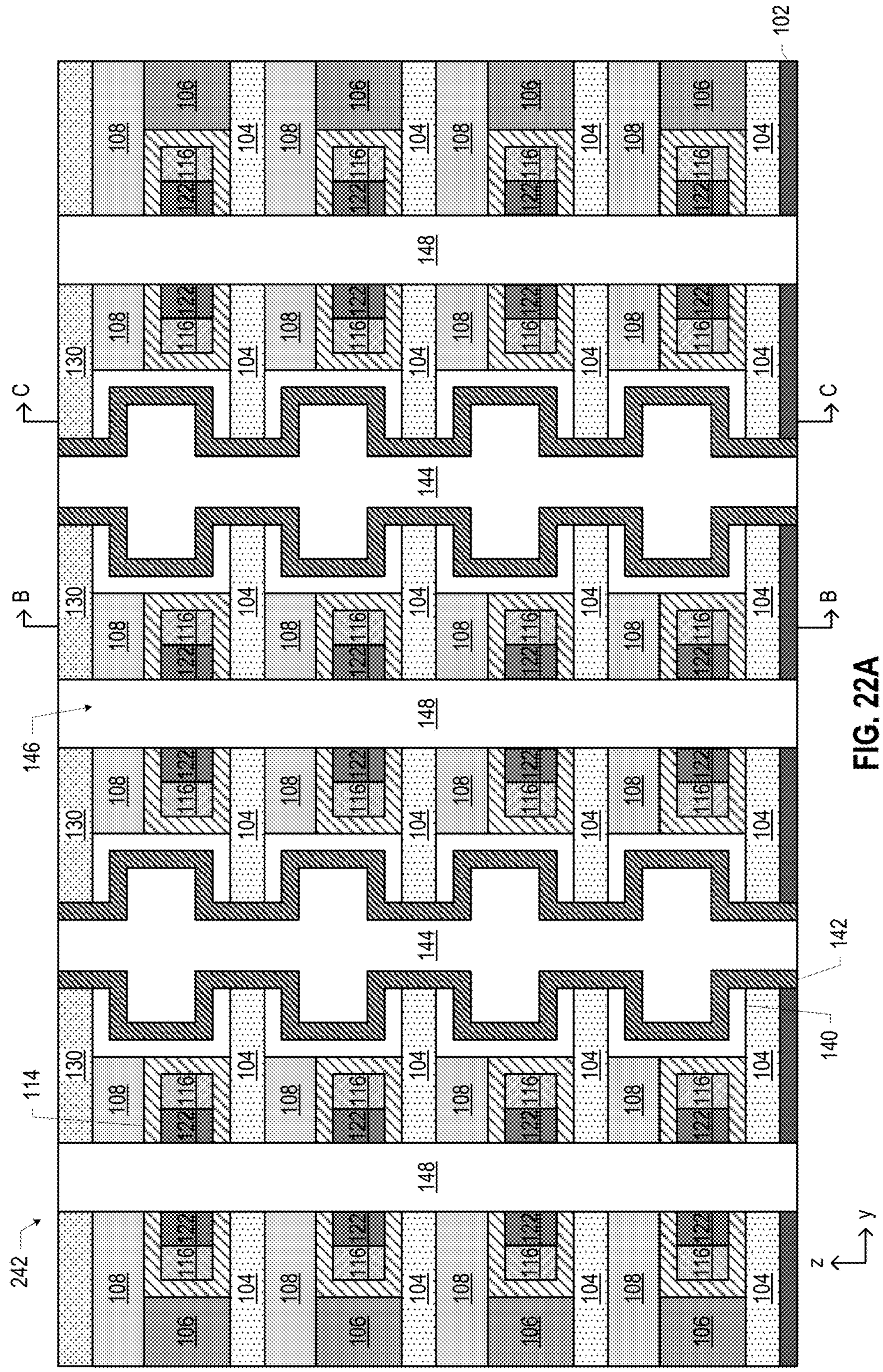
Figure 22B:
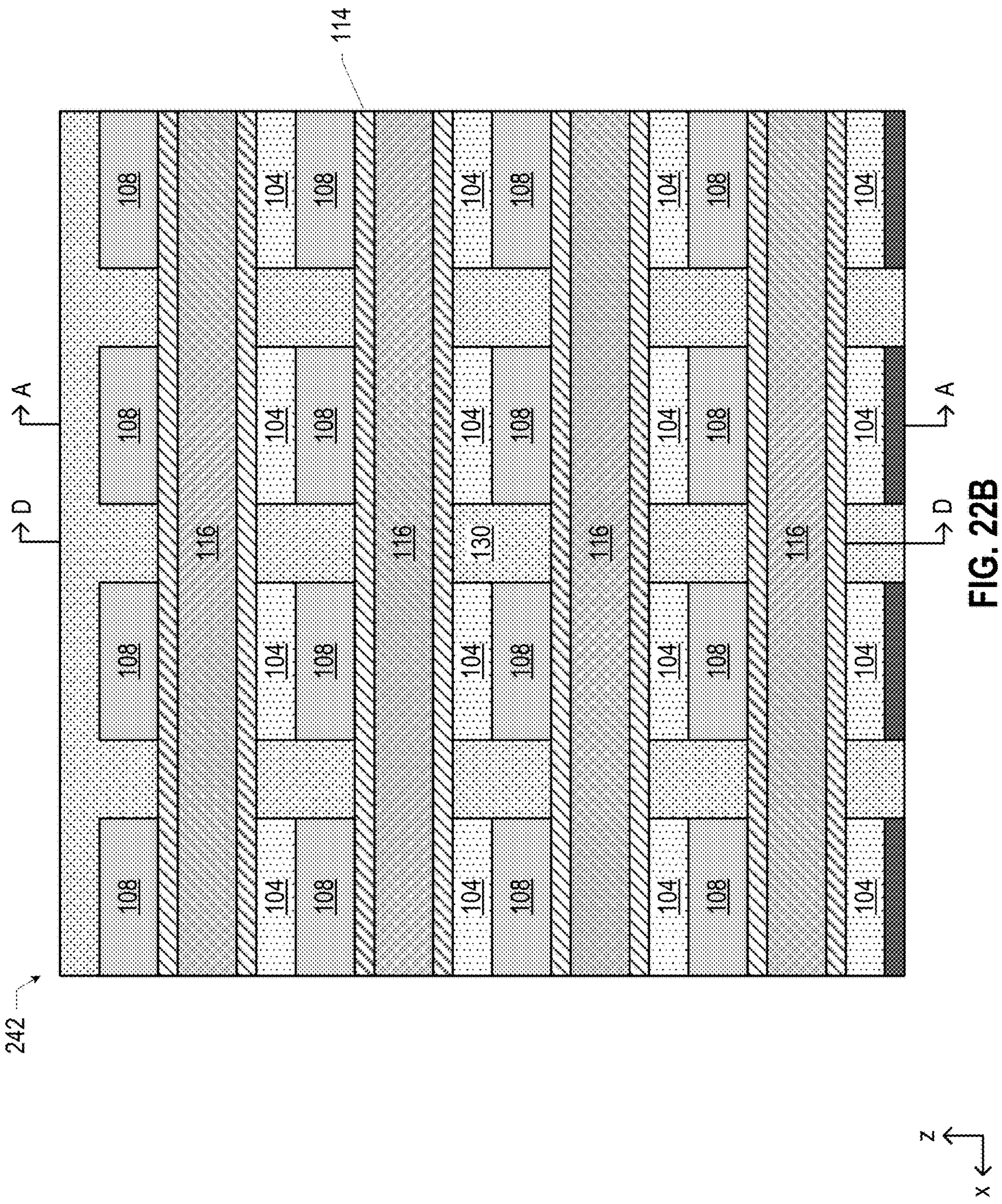
Figure 22C:
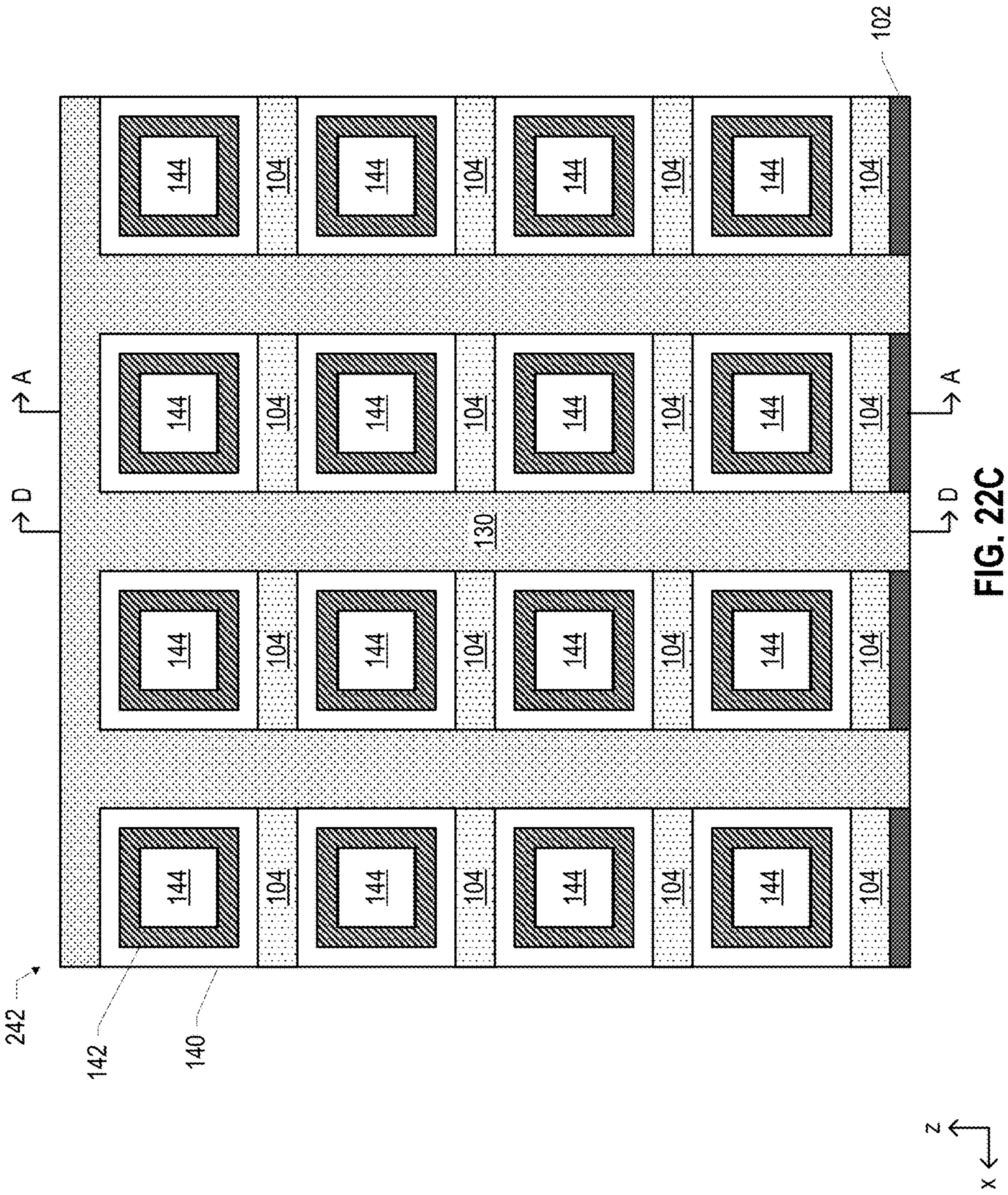
Figure 22D:
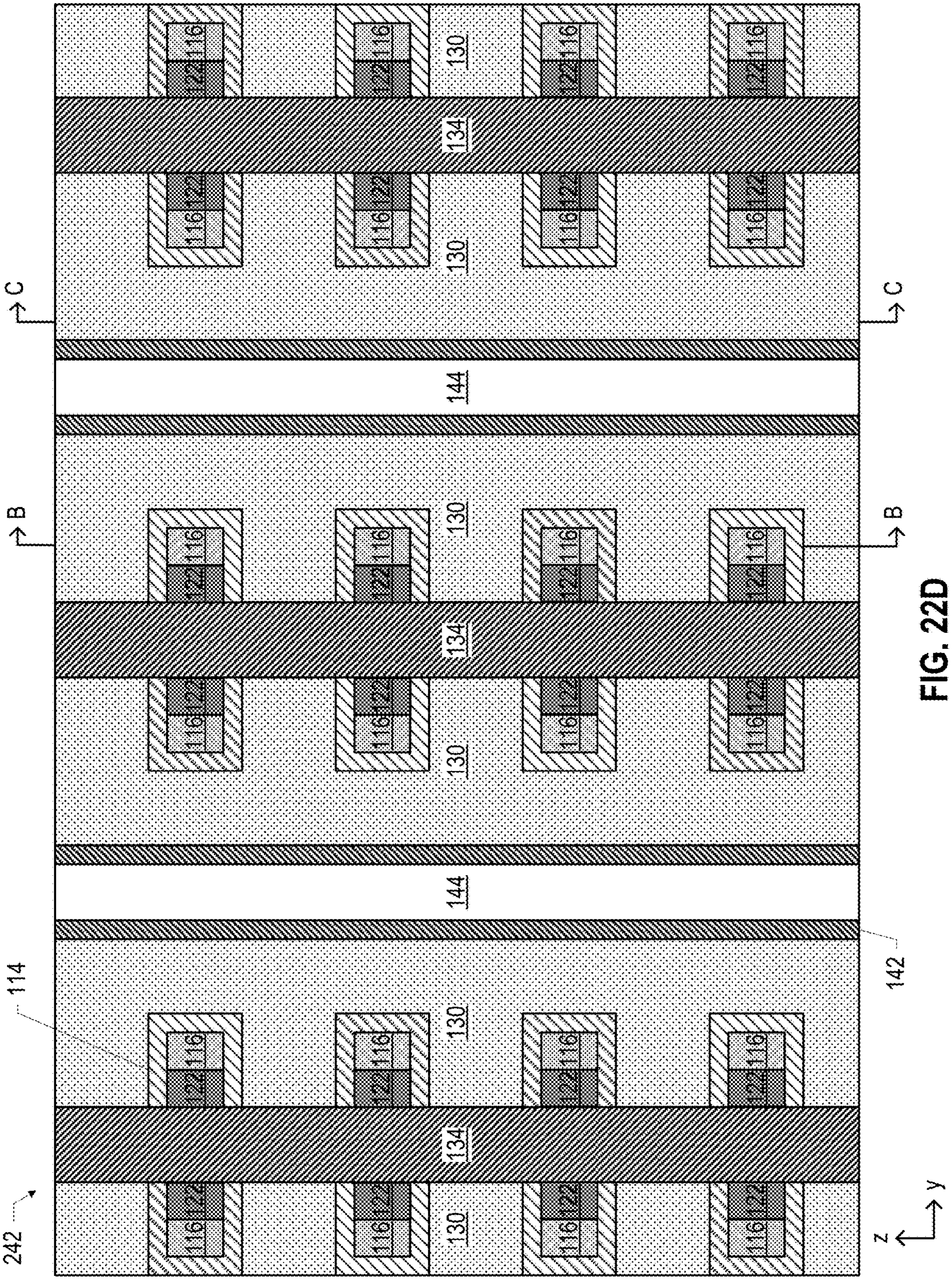
Figure 22E:
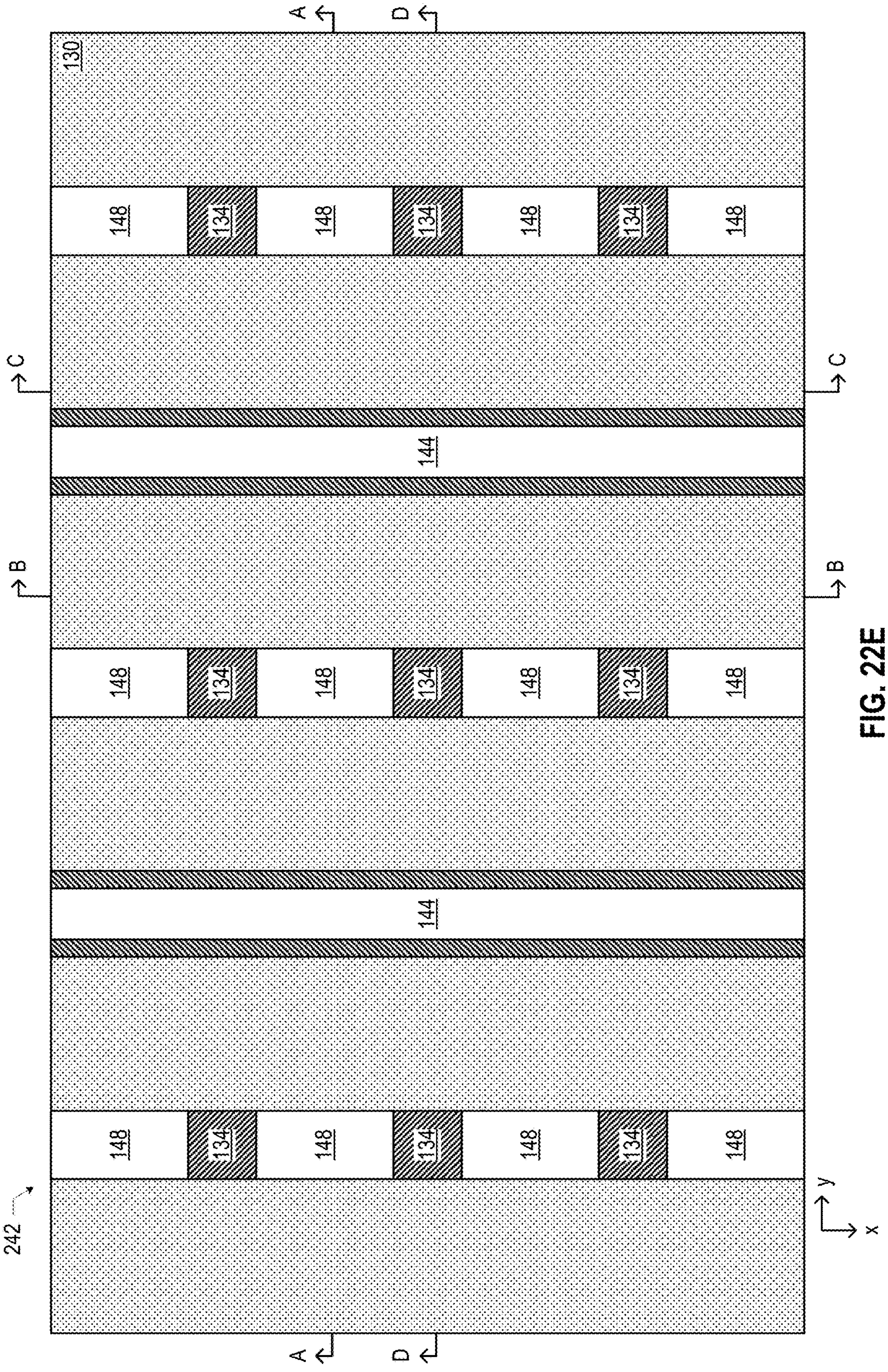

FIG. 10 illustrates an assembly 218 subsequent to forming trenches 124 in the assembly 216 (FIG. 9). The cross-sectional view through the section B-B of the assembly 218 is the same as that shown in FIG. 6B, the cross-sectional view through the section C-C of the assembly 218 is the same as that shown in FIG. 4C, and the cross-sectional view through the section D-D of the assembly 218 is the same as that shown in FIG. 10. The trenches 124 may extend through the assembly 218 in the z-direction, and may be parallel to the x-z plane. The trenches 124 may remove the spacer material 122 that is outside of the recesses 120, leaving isolated portions of the spacer material 122 in different ones of the recesses 120, as shown. Like the trenches 110/118, the trenches 124 may include the volumes in which the bit lines 148 will be located in the memory array 100 (as discussed further below). The remaining spacer material 122 may provide the spacers 122 discussed above with reference to FIG. 1.

FIG. 11 illustrates an assembly 220 subsequent to forming trenches 126 in the assembly 218 (FIG. 10). The trenches 126 may extend through the channel material 108 and the isolation material 104 of the assembly 220 in the z-direction, and may be parallel to the y-z plane (i.e., perpendicular to the trenches 124). The word lines 116 and the gate dielectric 114 may span the trenches 126, and may not be etched or otherwise removed during the formation of the trenches 126 (e.g., by using a selective etch process).

FIG. 12 illustrates an assembly 222 subsequent to filling (and overfilling) the trenches 124 and the trenches 126 of the assembly 220 (FIG. 11) with an isolation material 130. As shown in FIG. 12, an "overburden" of the isolation material 130 may extend over the "topmost" portions of the channel material 108.

FIG. 13 illustrates an assembly 224 subsequent to forming trenches 132 in the assembly 222 (FIG. 12). The trenches 132 may have the same dimensions and locations as the trenches 124 (discussed above with reference to FIG. 10). The trenches 132 may extend through the assembly 224 in the z-direction, and may be parallel to the x-z plane. Like the trenches 110/118/124, the trenches 132 may include the volumes in which the bit lines 148 will be located in the memory array 100 (as discussed further below).

FIG. 14 illustrates an assembly 226 subsequent to filling the trenches 132 of the assembly 224 (FIG. 13) with an isolation material 134.

FIG. 15 illustrates an assembly 228 subsequent to forming trenches 136 in the assembly 226 (FIG. 14). The trenches 136 may extend through the assembly 228 in the z-direction, and may be parallel to the x-z plane. The trenches 136 may be parallel to and offset from the trenches 132, running through the isolation material 130, channel material 108, isolation material 106, and isolation material 104 between the trenches 132. The width of the trenches 136 may be equal to twice the thickness 125 of the capacitor dielectric 142 plus the width 109 of the trunk portion 144A of the second capacitor plate 144 (as discussed further below).

FIG. 16 illustrates an assembly 230 subsequent to performing a cavity etch on the assembly 228 (FIG. 15) to remove the isolation material 106 and some of the channel material 108 exposed at the sidewalls of the trenches 136. The cavity etch may form recesses 138, in which the gate dielectric 114 and the remaining channel material 108 are exposed. The remaining channel material 108 may provide the channels 108, and thus the transistors 160, discussed above with reference to FIG. 1.

FIG. 17 illustrates an assembly 232 subsequent to conformally depositing a first capacitor plate material 140 on the sidewalls of the recessed trenches 136 of the assembly 230 (FIG. 16). The first capacitor plate material 140 may cover the walls of the recesses 138, and may extend along the side faces of the isolation material 104, as shown. The thickness of the deposition of the first capacitor plate material 140 may take the form of any of the embodiments of the thickness 121 disclosed herein. In some embodiments, the first capacitor plate material 140 may be deposited using an ALD technique.

FIG. 18 illustrates an assembly 234 subsequent to forming trenches 152 in the assembly 232 (FIG. 17). The trenches 118 may extend through the assembly 234 in the z-direction, and may be parallel to the x-z plane. The trenches 152 may have the same location and dimensions of the trenches 136 (FIG. 14), and may remove the first capacitor plate material 140 that is outside of the recesses 138, leaving isolated portions of the first capacitor plate material 140 in different ones of the recesses 138, as shown. The remaining first capacitor plate material 140 may provide the first capacitor plates 140 discussed above with reference to FIG. 1.

FIG. 19 illustrates an assembly 236 subsequent to conformally depositing a capacitor dielectric 142 on the sidewalls of the recessed trenches 152 of the assembly 234 (FIG. 18). The capacitor dielectric 142 may cover the first capacitor plates 140, and may extend along the side faces of the isolation material 104, as shown. The thickness of the deposition of the capacitor dielectric 142 may take the form of any of the embodiments of the thickness 125 disclosed herein. In some embodiments, the capacitor dielectric 142 may be deposited using an ALD technique.

FIG. 20 illustrates an assembly 238 subsequent to filling the recessed trenches 152 of the assembly 236 (FIG. 19) with a second capacitor plate material 144 to form the second capacitor plates 144. The portions of the second capacitor plate material 144 in the recesses 138 may provide the branch portions 144B, and the remaining second capacitor plate material 144 in a trench 152 may provide the trunk portion 144A.

FIG. 21 illustrates an assembly 240 subsequent to forming trenches 146 in the assembly 238 (FIG. 20). The trenches 146 may be arranged in linear arrays of trenches 146 through different portions of the isolation material 134, and the trenches 146 may be present between mirror-image ones of the transistors 160 (with the isolation material 134 remaining in other locations).

FIG. 22 illustrates an assembly 242 subsequent to filling the trenches 146 of the assembly 240 (FIG. 21) with a bit line material 148. The bit line material 148 in the trenches 146 may provide the bit lines 148 discussed above with reference to FIG. 1, and the assembly 242 may take the form of the memory array 100 of FIG. 1.

Figure 23:
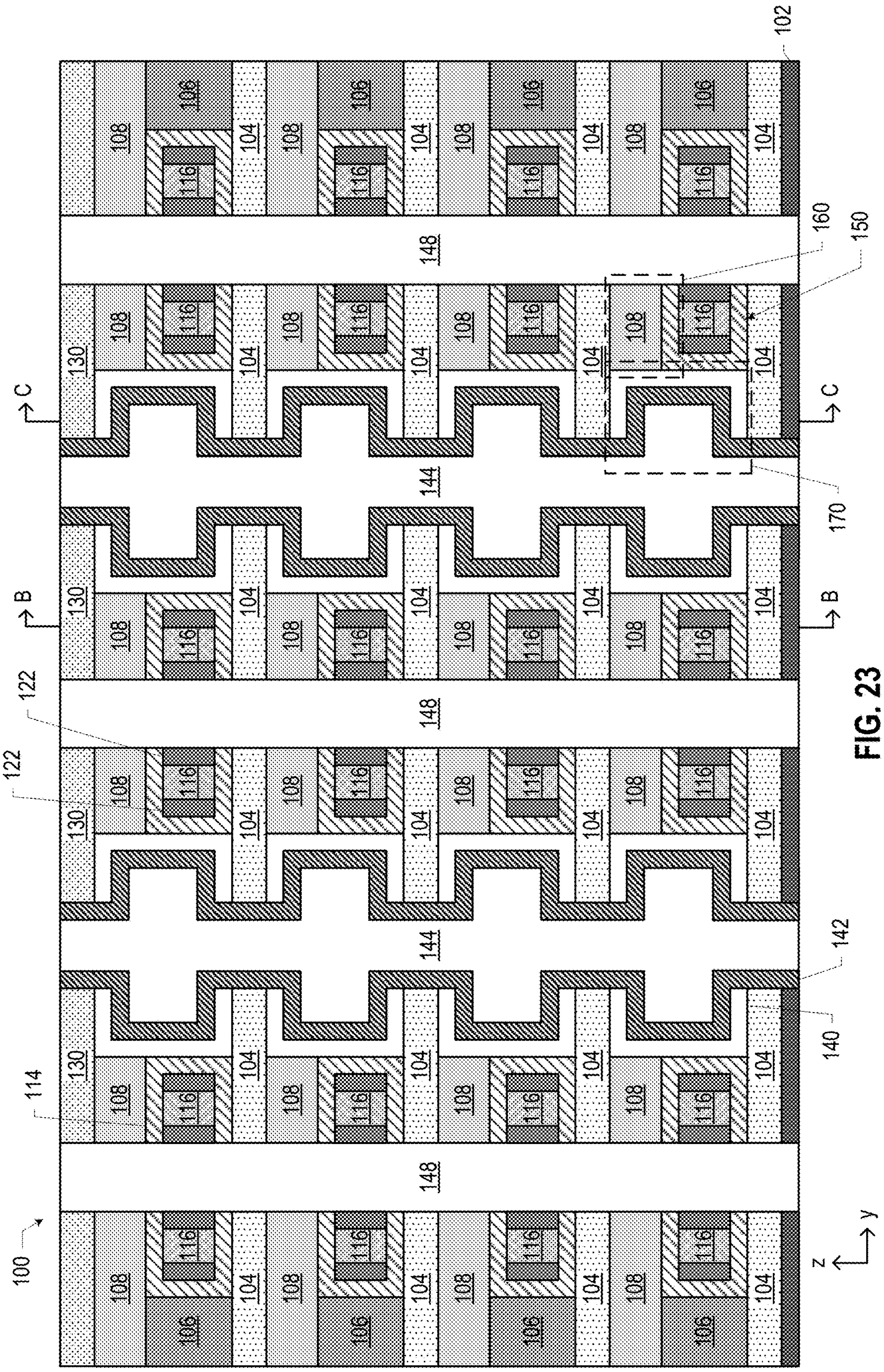
FIG. 23 is a view of another example memory array, in accordance with various embodiments.

In the embodiment illustrated in FIG. 1, a word line 116 is "sandwiched" between a spacer 122 and a portion of the gate dielectric 114 in the y-direction. In other embodiments, a word line 116 may be disposed between two spacers 122. An example of such an embodiment is illustrated in FIG. 23 (sharing the perspective of FIG. 1A). The memory array 100 of FIG. 23 may be manufactured using a process similar to that discussed above with reference to FIGS. 2-22, but which includes performing an extra spacer formation step (e.g., by spacer material deposition and recess, as discussed above with reference to FIGS. 9 and 10) after deposition of the gate dielectric 114 (FIG. 5) and before deposition of the word line material 116 (FIG. 6). Including an extra spacer 122 between the word line 116 and the proximate capacitor 170 may reduce leakage and/or crosstalk, and thus improve the isolation between the word line 116 and capacitor 170.

Figure 24:
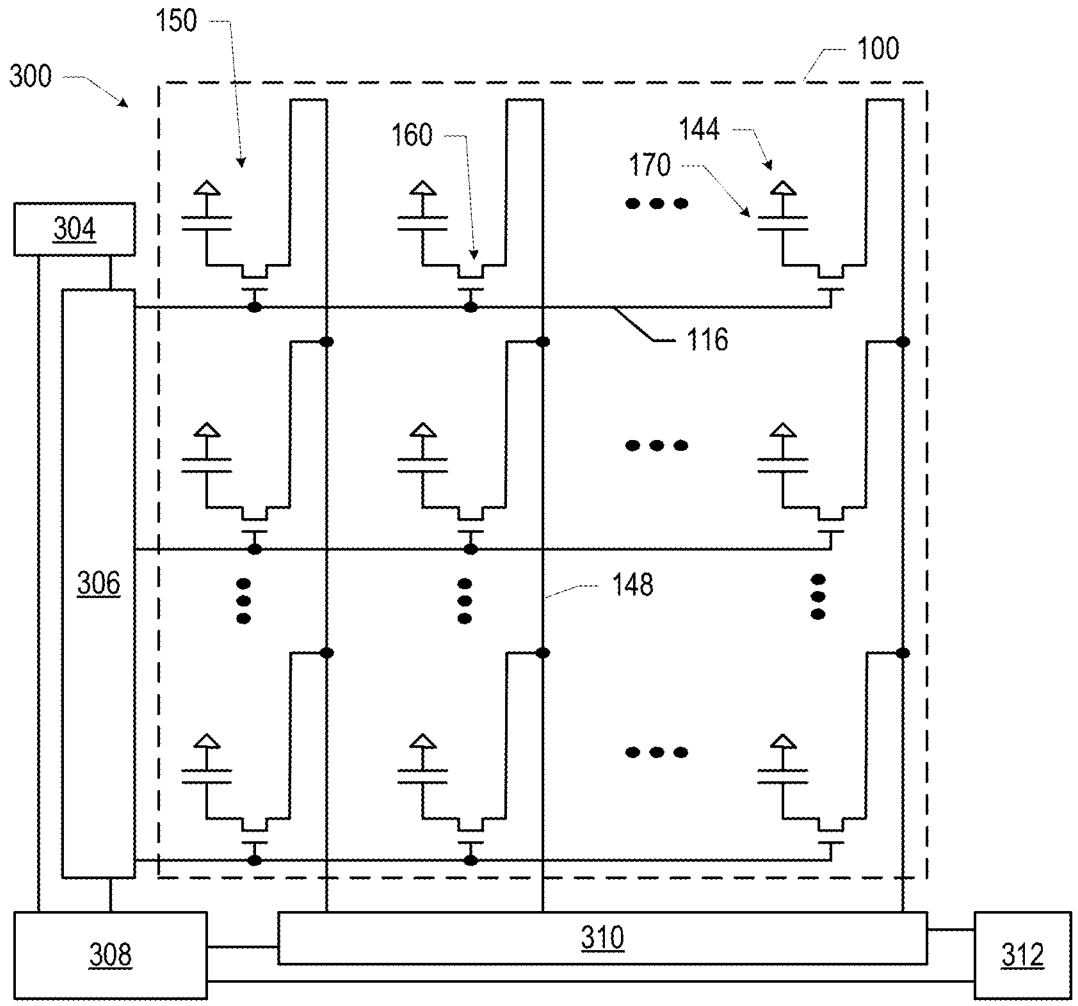
FIG. 24 is a schematic illustration of a memory device including a memory array in accordance with any of embodiments disclosed herein.

A memory array 100 may be controlled in any suitable manner. For example, FIG. 24 is a schematic illustration of a memory device 300 including a memory array 100 having memory cells 150 with capacitors 170 and transistors 160, in accordance with various embodiments. The memory cells 150, and their interconnections, may take the form of any of the embodiments disclosed herein. The memory device 300 of FIG. 24 may be a bidirectional cross-point array in which each column is associated with a bit line 148 driven by column select circuitry 310. Each row may be associated with a word line 116 driven by row select circuitry 306. During operation, read/write control circuitry 308 may receive memory access requests (e.g., from one or more processing devices or communication chips of an electrical device, such as the electrical device 1800 discussed below), and may respond by generating an appropriate control signal (e.g., read, write 0, or write 1), as known in the art. The read/write control circuitry 308 may control the row select circuitry 306 and the column select circuitry 310 to select the desired memory cell(s) 150. Voltage supplies 304 and 312 may be controlled to provide the voltage(s) necessary to bias the memory array 100 to facilitate the requested action on one or more memory cells 150. Row select circuitry 306 and column select circuitry 310 may apply appropriate voltages across the memory array 100 to access the selected memory cells 150 (e.g., by providing appropriate voltages to the memory cells 150 to allow the desired transistors 160 to conduct current). The read/write control circuit 308 may include sense amplifier circuitry, as known in the art. Row select circuitry 306, column select circuitry 310, and read/write control circuitry 308 may be implemented using any devices and techniques known in the art.

The memory cells 150, memory arrays 100, and memory devices 300 disclosed herein may be included in any suitable electronic component. FIGS. 25-29 illustrate various examples of apparatuses that may include any of the memory cells 150, memory arrays 100, or memory devices 300.

Figure 25:
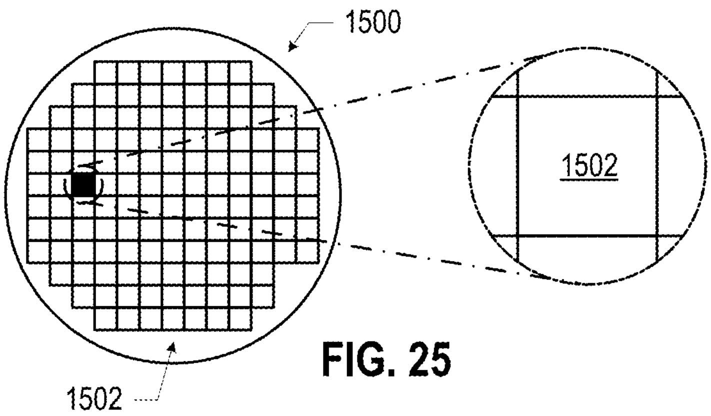
FIG. 25 is a top view of a wafer and dies that may include a memory array in accordance with any of the embodiments disclosed herein.

FIG. 25 is a top view of a wafer 1500 and dies 1502 that may include one or more memory cells 150, memory arrays 100, and/or memory devices 300, in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more memory cells 150 and/or memory arrays 100, one or more logic transistors (e.g., some of the transistors 1640 of FIG. 26, discussed below), any other IC components, and supporting circuitry to route electrical signals in the die 1502. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array (e.g., the memory array 100) may be formed on a same die 1502 as a processing device (e.g., the processing device 1802 of FIG. 29) or other logic that is configured to store information in the memory array or execute instructions stored in the memory array.

Figure 26:
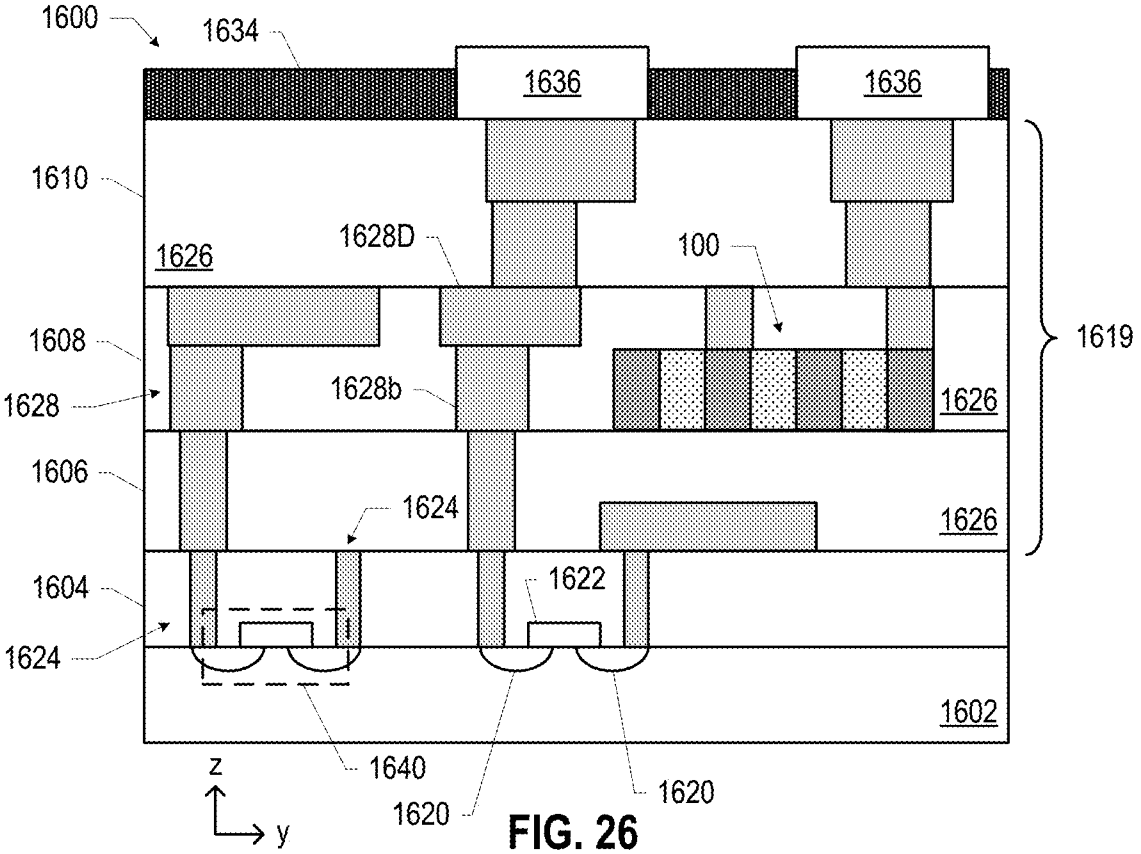
FIG. 26 is a side, cross-sectional view of an integrated circuit (IC) device that may include a memory array in accordance with any of the embodiments disclosed herein.

FIG. 26 is a side, cross-sectional view of an IC device 1600 that may include one or more memory cells 150, memory arrays 100, and/or memory devices 300 in accordance with any of the embodiments disclosed herein. One or more of the IC devices 1600 may be included in one or more dies 1502 (FIG. 25). The IC device 1600 may be formed on a substrate 1602 (e.g., the wafer 1500 of FIG. 25) and may be included in a die (e.g., the die 1502 of FIG. 25). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 25) or a wafer (e.g., the wafer 1500 of FIG. 25).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 26 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

In some embodiments, the device layer 1604 may include one or more memory array 100 (not shown), in addition to or instead of transistors 1640 used for computing logic. A memory array 100 included in a device layer 1604 may be referred to as a "front-end" memory array. In some embodiments, the IC device 1600 may not include any front-end memory arrays 100. One or more memory arrays 100 in the device layer 1604 may be coupled to any suitable other ones of the devices in the device layer 1604, to any devices in the metallization stack 1619 (discussed below), and/or to one or more of the conductive contacts 1636 (discussed below).

Electrical signals, such as power and/or input/output (I/O) signals, may be routed to and/or from the devices (e.g., the transistors 1640 and/or a memory array 100) of the device layer 1604 through one or more interconnect layers disposed on the device layer 1604 (illustrated in FIG. 26 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more memory arrays 100 may be disposed in one or more of the interconnect layers 1606-1610, in accordance with any of the techniques disclosed herein. FIG. 26 illustrates a single memory array 100 in the metallization stack 1619 for illustration purposes, but any number and structure of memory arrays 100 may be included in any one or more of the layers in a metallization stack 1619. A memory array 100 included in the metallization stack 1619 may be referred to as a "back-end" memory array 100. In some embodiments, the IC device 1600 may not include any back-end memory arrays 100; in some embodiments, the IC device 1600 may include both front- and back-end memory arrays 100. One or more memory array 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 26). Although a particular number of interconnect layers 1606-1610 is depicted in FIG. 26, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 26. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 26. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 26, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 27:
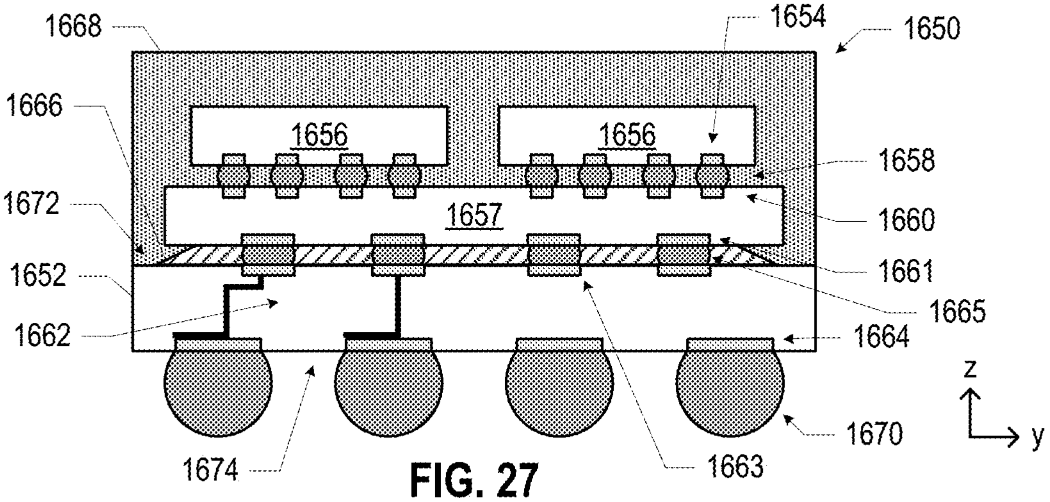
FIG. 27 is a side, cross-sectional view of an IC package that may include a memory array in accordance with various embodiments.

FIG. 27 is a side, cross-sectional view of an example IC package 1650 that may include one or more memory cells 150, memory arrays 100, or memory devices 300 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 26.

The package substrate 1652 may include conductive contacts 1663 that are coupled to conductive pathways 1662 through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 27 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 27 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 27 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 28.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, the die 1656 may include one or more memory arrays 100 or memory devices 300 (e.g., as discussed above with reference to FIG. 25 and FIG. 26). Other dies 1656 or other passive or active circuitry included in the IC package 1650 may include other components of a memory device 300, in some embodiments.

Although the IC package 1650 illustrated in FIG. 27 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 27, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 28:
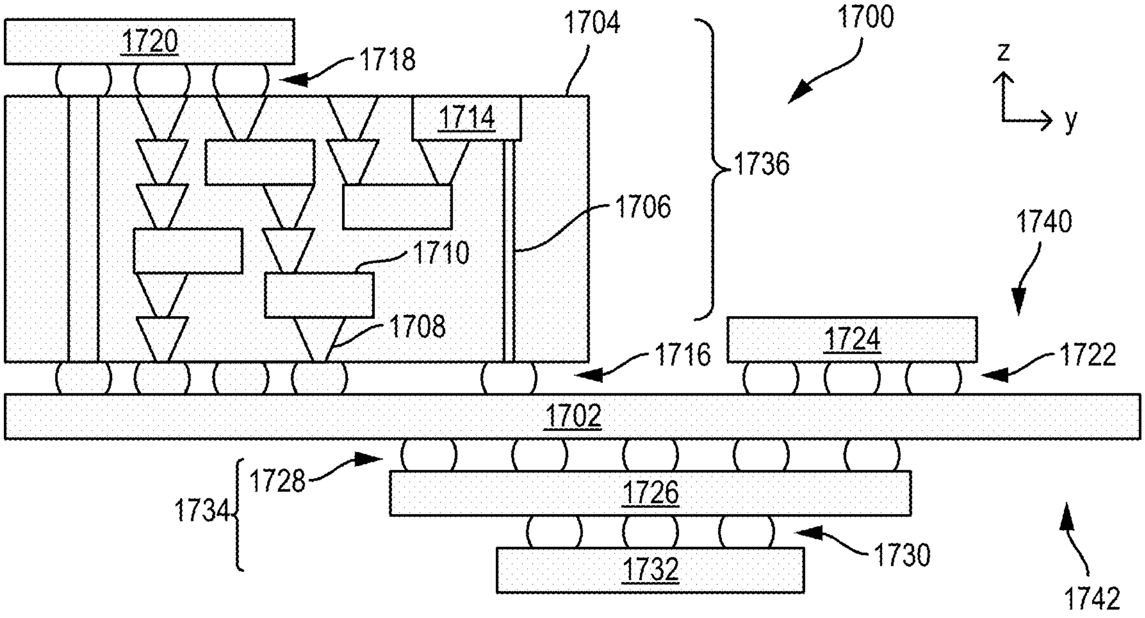
FIG. 28 is a side, cross-sectional view of an IC device assembly that may include a memory array in accordance with any of the embodiments disclosed herein.

FIG. 28 is a side, cross-sectional view of an IC device assembly 1700 that may include one or more IC packages or other electronic components (e.g., a die) including one or more memory cells 150, memory arrays 100, or memory devices 300 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 27 (e.g., may include one or more memory cells 150, memory arrays 100, or memory devices 300 in an IC package 1650 and/or or in a die 1502).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 28 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 28), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 28, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 25), an IC device (e.g., the IC device 1600 of FIG. 26), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 28, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 28 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 29:
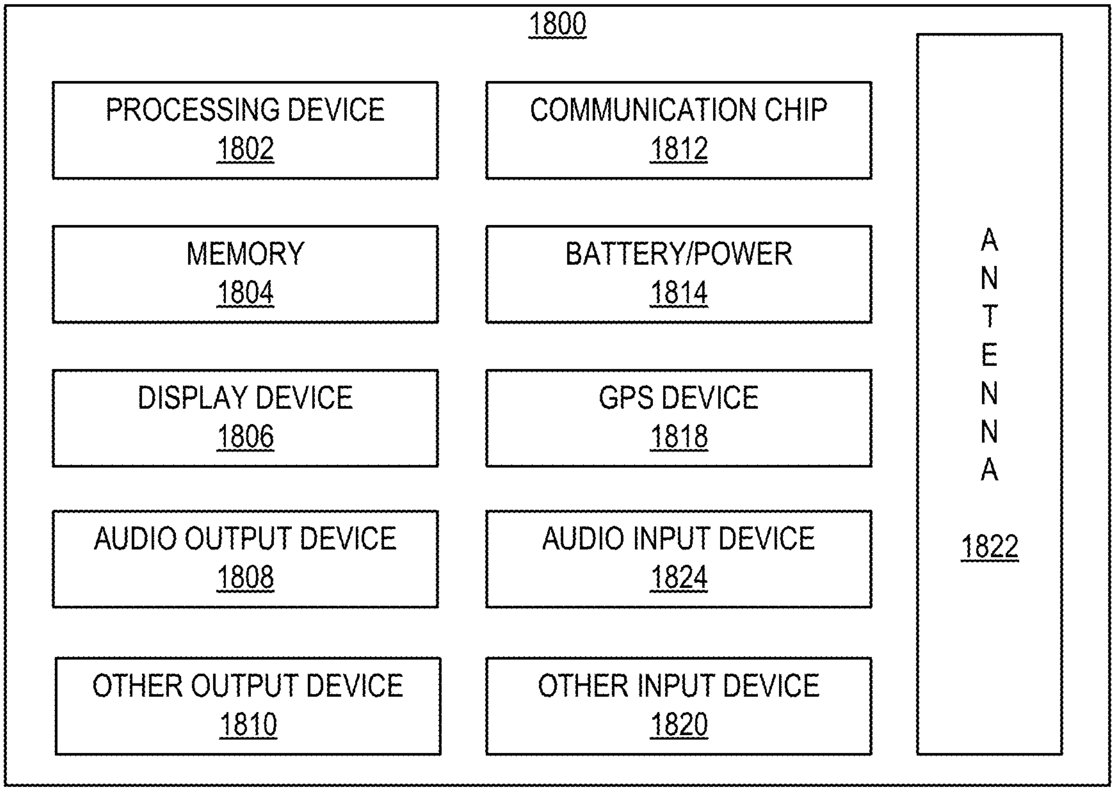
FIG. 29 is a block diagram of an example electrical device that may include a memory array in accordance with any of the embodiments disclosed herein.

FIG. 29 is a block diagram of an example electrical device 1800 that may include one or more memory cells 150, memory arrays 100, or memory devices 300 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 29 as included in the electrical device 1800, but any one or more of these components may be omitted or duplicated, as suitable for the application. In some embodiments, some or all of the components included in the electrical device 1800 may be attached to one or more motherboards.

In some embodiments, some or all of these components are fabricated onto a single system-on-a-chip (SoC) die.

Additionally, in various embodiments, the electrical device 1800 may not include one or more of the components illustrated in FIG. 29, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded DRAM (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a memory device, including: a support having a surface; and a three-dimensional array of memory cells on the surface of the support, wherein individual memory cells in the three-dimensional array include a transistor and a capacitor, and a channel of the transistor in an individual memory cell is oriented parallel to the surface.

Example 2 includes the subject matter of Example 1, and further specifies that the channel of the transistor has a length between 30 nanometers and 100 nanometers.

Example 3 includes the subject matter of any of Examples 1-2, and further specifies that the channel of the transistor has a thickness between 5 nanometers and 50 nanometers.

Example 4 includes the subject matter of any of Examples 1-3, and further specifies that a spacing between channels of adjacent transistors in a direction perpendicular to the surface of the support is between 15 nanometers and 60 nanometers.

Example 5 includes the subject matter of any of Examples 1-4, and further specifies that a first end of the channel of the transistor in an individual memory cell is in electrical contact with the capacitor of the individual memory cell, and a second end of the channel is in electrical contact with a bit line.

Example 6 includes the subject matter of Example 5, and further specifies that the bit line is oriented perpendicular to the surface.

Example 7 includes the subject matter of any of Examples 1-6, and further specifies that individual memory cells in the three-dimensional array are arranged into a two-dimensional array of columns oriented perpendicular to the surface, memory cells in an individual column are coupled by a common bit line, and a bit line associated with one column of memory cells is different than a bit line associated with a different column of memory cells.

Example 8 includes the subject matter of Example 7, and further specifies that individual memory cells in the three-dimensional array are arranged into a two-dimensional array of rows oriented parallel to the surface, memory cells in an individual row are coupled by a common word line, and a word line associated with one row of memory cells is different than a word line associated with a different row of memory cells.

Example 9 includes the subject matter of any of Examples 7-8, and further specifies that a bit line has a width between 10 nanometers and 50 nanometers.

Example 10 includes the subject matter of any of Examples 1-9, and further specifies that a word line is spaced apart from the channel of the transistor in an individual memory cell by a gate dielectric.

Example 11 includes the subject matter of Example 10, and further specifies that the gate dielectric at least partially wraps around the word line.

Example 12 includes the subject matter of any of Examples 10-11, and further specifies that the gate dielectric has a thickness between 2 nanometers and 20 nanometers.

Example 13 includes the subject matter of any of Examples 10-12, and further specifies that the word line has a width between 25 nanometers and 80 nanometers.

Example 14 includes the subject matter of any of Examples 10-13, and further specifies that the word line has a height between 5 nanometers and 20 nanometers.

Example 15 includes the subject matter of any of Examples 10-14, and further specifies that the gate dielectric is between the word line and the capacitor of the individual memory cell.

Example 16 includes the subject matter of any of Examples 10-15, and further specifies that the gate dielectric extends continuously between the word line and the channel of the transistor, between the word line and the capacitor, and between the word line and an insulating material, and the word line is between the insulating material and the channel of the transistor.

Example 17 includes the subject matter of any of Examples 16, and further specifies that the insulating material has a thickness between 10 nanometers and 20 nanometers.

Example 18 includes the subject matter of any of Examples 10-17, and further specifies that a spacer is adjacent to the word line, and the spacer is spaced apart from the channel of the transistor in the individual memory cells by the gate dielectric.

Example 19 includes the subject matter of Example 18, and further specifies that the spacer has a width between 5 nanometers and 20 nanometers.

Example 20 includes the subject matter of any of Examples 18-19, and further specifies that a height of the spacer is equal to a height of the word line.

Example 21 includes the subject matter of any of Examples 18-20, and further specifies that the spacer is in contact with a bit line.

Example 22 includes the subject matter of any of Examples 18-21, and further specifies that the gate dielectric extends continuously between the spacer and the channel of the transistor and between the spacer and an insulating material, and the spacer is between the insulating material and the channel of the transistor.

Example 23 includes the subject matter of any of Examples 10-22, and further specifies that the gate dielectric has a C-shaped cross-section.

Example 24 includes the subject matter of any of Examples 1-23, and further specifies that individual memory cells in the three-dimensional array are arranged into a two-dimensional array of columns oriented perpendicular to the surface, individual capacitors in individual memory cells include a first plate, a second plate, and a capacitor dielectric between the first plate and the second plate, and the capacitor dielectric of different ones of the capacitors in an individual column of memory cells is provided by a continuous portion of capacitor dielectric.

Example 25 includes the subject matter of Example 24, and further specifies that the first plate of a capacitor in a memory cell has a C-shaped cross-section.

Example 26 includes the subject matter of any of Examples 24-25, and further specifies that the second plates of different ones of the capacitors in an individual column of memory cells is provided by a common second plate.

Example 27 includes the subject matter of any of Examples 24-26, and further specifies that the second plate of a capacitor in a first memory cell is also a second plate of a capacitor in a second memory cell different from the first memory cell, wherein the second plate of the capacitor in the first memory cell is between a transistor of the first memory cell and a transistor of the second memory cell.

Example 28 includes the subject matter of any of Examples 24-27, and further specifies that the first plates of the capacitors in a first column of memory cells are mirror images of the first plates of the capacitors in a second column of memory cells, and the first column of memory cells shares the second plate of the capacitors with the second column of memory cells.

Example 29 includes the subject matter of any of Examples 24-28, and further specifies that the first plate has a thickness between 2 nanometers and 5 nanometers.

Example 30 includes the subject matter of any of Examples 24-29, and further specifies that the capacitor dielectric has a thickness between 2 nanometers and 5 nanometers.

Example 31 includes the subject matter of any of Examples 24-30, and further specifies that the second plate has a trunk portion and multiple branch portions.

Example 32 includes the subject matter of any of Examples 31, and further specifies that the trunk portion has a width between 3 nanometers and 18 nanometers.

Example 33 includes the subject matter of any of Examples 31-32, and further specifies that an individual branch portion has a height between 10 nanometers and 100 nanometers.

Example 34 includes the subject matter of any of Examples 31-33, and further specifies that an individual branch portion has a width between 45 nanometers and 400 nanometers.

Example 35 includes the subject matter of any of Examples 1-34, and further specifies that individual memory cells in the three-dimensional array are arranged into a two-dimensional array of columns oriented perpendicular to the surface, the transistors of a first column of memory cells are mirror images of the transistors of a second column of memory cells adjacent to the first column of memory cells.

Example 36 includes the subject matter of any of Examples 1-35, and further specifies that the three-dimensional array of memory cells is included in a front-end of an integrated circuit (IC) die.

Example 37 includes the subject matter of any of Examples 1-35, and further specifies that the three-dimensional array of memory cells is included in a back-end of an integrated circuit (IC) die.

Example 38 is a method of manufacturing a memory array, including: forming a stack of repeating layers of a first insulating material, a second insulating material, and a channel material; etching a first set of trenches through the stack; performing a cavity etch to remove portions of the second insulating material; conformally depositing a gate dielectric on walls of the first set of trenches; forming recessed word line material in the first set of trenches; after forming the recessed word line material, filling the first set of trenches with a spacer material; forming a second set of trenches through the spacer material; forming a third set of trenches perpendicular to the second set of trenches, wherein forming the third set of trenches preserves at least a portion of the recessed word line material; filling the third set of trenches with a third insulating material; forming a fourth set of trenches perpendicular to the third set of trenches; filling the fourth set of trenches with a dummy bit line material; forming a fifth set of trenches; recessing the channel material and the second insulating material in the fifth set of trenches; conformally depositing a first capacitor plate material on the recessed walls of the fifth set of trenches; removing portions of the first capacitor plate material; after removing portions of the first capacitor plate material, conformally depositing a capacitor dielectric; filling the fifth set of trenches with a second capacitor plate material; removing portions of the dummy bit line material to form bit line trenches; and filling the bit line trenches with a bit line material.

Example 39 includes the subject matter of Example 38, and further specifies that the channel material includes indium gallium zinc oxide (IGZO).

Example 40 includes the subject matter of any of Examples 38-39, and further specifies that the capacitor dielectric includes hafnium oxide or aluminum oxide.

Example 41 includes the subject matter of any of Examples 38-40, and further specifies that the second insulating material includes an oxide or a nitride.

Example 42 includes the subject matter of any of Examples 38-41, and further specifies that the first capacitor plate material and the second capacitor plate material have a same material composition.

Example 43 is an integrated circuit (IC) die, including: a memory device including a support having a surface, and a three-dimensional array of memory cells on the surface of the support, wherein individual memory cells include a transistor and a capacitor, and the transistor and capacitor of an individual memory cell are arranged along plane that is parallel to the surface of the support.

Example 44 includes the subject matter of Example 43, and further specifies that a channel of the transistor has a length between 30 nanometers and 100 nanometers.

Example 45 includes the subject matter of any of Examples 43-44, and further specifies that a channel of the transistor has a thickness between 5 nanometers and 50 nanometers.

Example 46 includes the subject matter of any of Examples 43-45, and further specifies that a spacing between channels of adjacent transistors in a direction perpendicular to the surface of the support is between 15 nanometers and 60 nanometers.

Example 47 includes the subject matter of any of Examples 43-46, and further specifies that a first end of a channel of the transistor in an individual memory cell is in electrical contact with the capacitor of the individual memory cell, and a second end of the channel is in electrical contact with a bit line.

Example 48 includes the subject matter of Example 47, and further specifies that the bit line is oriented perpendicular to the surface.

Example 49 includes the subject matter of any of Examples 43-48, and further specifies that individual memory cells in the three-dimensional array are arranged into a two-dimensional array of columns oriented perpendicular to the surface, memory cells in an individual column are coupled by a common bit line, and a bit line associated with one column of memory cells is different than a bit line associated with a different column of memory cells.

Example 50 includes the subject matter of Example 49, and further specifies that individual memory cells in the three-dimensional array are arranged into a two-dimensional array of rows oriented parallel to the surface, memory cells in an individual row are coupled by a common word line, and a word line associated with one row of memory cells is different than a word line associated with a different row of memory cells.

Example 51 includes the subject matter of any of Examples 49-50, and further specifies that a bit line has a width between 10 nanometers and 50 nanometers.

Example 52 includes the subject matter of any of Examples 43-51, and further specifies that a word line is spaced apart from a channel of the transistor in an individual memory cell by a gate dielectric.

Example 53 includes the subject matter of Example 52, and further specifies that the gate dielectric at least partially wraps around the word line.

Example 54 includes the subject matter of any of Examples 52-53, and further specifies that the gate dielectric has a thickness between 2 nanometers and 20 nanometers.

Example 55 includes the subject matter of any of Examples 52-54, and further specifies that the word line has a width between 25 nanometers and 80 nanometers.

Example 56 includes the subject matter of any of Examples 52-55, and further specifies that the word line has a height between 5 nanometers and 20 nanometers.

Example 57 includes the subject matter of any of Examples 52-56, and further specifies that the gate dielectric is between the word line and the capacitor of the individual memory cell.

Example 58 includes the subject matter of any of Examples 52-57, and further specifies that the gate dielectric extends continuously between the word line and a channel of the transistor, between the word line and the capacitor, and between the word line and an insulating material, and the word line is between the insulating material and the channel of the transistor.

Example 59 includes the subject matter of Example 58, and further specifies that the insulating material has a thickness between 10 nanometers and 20 nanometers.

Example 60 includes the subject matter of any of Examples 52-59, and further specifies that a spacer is adjacent to the word line, and the spacer is spaced apart from a channel of the transistor in the individual memory cells by the gate dielectric.

Example 61 includes the subject matter of Example 60, and further specifies that the spacer has a width between 5 nanometers and 20 nanometers.

Example 62 includes the subject matter of any of Examples 60-61, and further specifies that a height of the spacer is equal to a height of the word line.

Example 63 includes the subject matter of any of Examples 60-62, and further specifies that the spacer is in contact with a bit line.

Example 64 includes the subject matter of any of Examples 60-63, and further specifies that the gate dielectric extends continuously between the spacer and a channel of the transistor and between the spacer and an insulating material, and the spacer is between the insulating material and the channel of the transistor.

Example 65 includes the subject matter of any of Examples 52-64, and further specifies that the gate dielectric has a C-shaped cross-section.

Example 66 includes the subject matter of any of Examples 43-65, and further specifies that individual memory cells in the three-dimensional array are arranged into a two-dimensional array of columns oriented perpendicular to the surface, individual capacitors in individual memory cells include a first plate, a second plate, and a capacitor dielectric between the first plate and the second plate, and the capacitor dielectric of different ones of the capacitors in an individual column of memory cells is provided by a continuous portion of capacitor dielectric.

Example 67 includes the subject matter of Example 66, and further specifies that the first plate of a capacitor in a memory cell has a C-shaped cross-section.

Example 68 includes the subject matter of any of Examples 66-67, and further specifies that the second plates of different ones of the capacitors in an individual column of memory cells is provided by a common second plate.

Example 69 includes the subject matter of any of Examples 66-68, and further specifies that the second plate of a capacitor in a first memory cell is also a second plate of a capacitor in a second memory cell different from the first memory cell, wherein the second plate of the capacitor in the first memory cell is between a transistor of the first memory cell and a transistor of the second memory cell.

Example 70 includes the subject matter of any of Examples 66-69, and further specifies that the first plates of the capacitors in a first column of memory cells are mirror images of the first plates of the capacitors in a second column of memory cells, and the first column of memory cells shares the second plate of the capacitors with the second column of memory cells.

Example 71 includes the subject matter of any of Examples 66-70, and further specifies that the first plate has a thickness between 2 nanometers and 5 nanometers.

Example 72 includes the subject matter of any of Examples 66-71, and further specifies that the capacitor dielectric has a thickness between 2 nanometers and 5 nanometers.

Example 73 includes the subject matter of any of Examples 66-72, and further specifies that the second plate has a trunk portion and multiple branch portions.

Example 74 includes the subject matter of Example 73, and further specifies that the trunk portion has a width between 3 nanometers and 18 nanometers.

Example 75 includes the subject matter of any of Examples 73-74, and further specifies that an individual branch portion has a height between 10 nanometers and 100 nanometers.

Example 76 includes the subject matter of any of Examples 73-75, and further specifies that an individual branch portion has a width between 45 nanometers and 400 nanometers.

Example 77 includes the subject matter of any of Examples 43-76, and further specifies that individual memory cells in the three-dimensional array are arranged into a two-dimensional array of columns oriented perpendicular to the surface, the transistors of a first column of memory cells are mirror images of the transistors of a second column of memory cells adjacent to the first column of memory cells.

Example 78 includes the subject matter of any of Examples 43-77, and further specifies that the three-dimensional array of memory cells is included in a front-end of the IC die.

Example 79 includes the subject matter of any of Examples 43-77, and further specifies that the three-dimensional array of memory cells is included in a back-end of the IC die.

Example 80 includes the subject matter of any of Examples 43-79, and further specifies that the memory device includes a number of layers of memory cells stacked perpendicular to the surface of the support, and the number is between 20 and Example 64.

Example 81 includes the subject matter of any of Examples 43-80, and further includes: logic transistors.

Example 82 includes the subject matter of any of Examples 43-81, and further includes: sense amplifier circuitry.

Example 83 is a computing device, including: an integrated circuit (IC) package, including: a package substrate, and a die coupled to a surface of the package substrate, wherein the die includes a memory device, the memory device includes a support having a surface, the memory device also includes a three-dimensional array of memory cells on the surface of the support, wherein individual memory cells include a transistor and a capacitor, a stack of memory cells on the surface of the support includes a stack of capacitors and a stack of transistors, and the stack of capacitors is offset from the stack of transistors along the surface of the support.

Example 84 includes the subject matter of Example 83, and further specifies that a channel of the transistor has a length between 30 nanometers and 100 nanometers.

Example 85 includes the subject matter of any of Examples 83-84, and further specifies that a channel of the transistor has a thickness between 5 nanometers and 50 nanometers.

Example 86 includes the subject matter of any of Examples 83-85, and further specifies that a spacing between channels of adjacent transistors in a direction perpendicular to the surface of the support is between 15 nanometers and 60 nanometers.

Example 87 includes the subject matter of any of Examples 83-86, and further specifies that a first end of a channel of the transistor in an individual memory cell is in electrical contact with the capacitor of the individual memory cell, and a second end of the channel is in electrical contact with a bit line.

Example 88 includes the subject matter of Example 87, and further specifies that the bit line is oriented perpendicular to the surface.

Example 89 includes the subject matter of any of Examples 83-88, and further specifies that individual memory cells in the three-dimensional array are arranged into a two-dimensional array of columns oriented perpendicular to the surface, memory cells in an individual column are coupled by a common bit line, and a bit line associated with one column of memory cells is different than a bit line associated with a different column of memory cells.

Example 90 includes the subject matter of Example 89, and further specifies that individual memory cells in the three-dimensional array are arranged into a two-dimensional array of rows oriented parallel to the surface, memory cells in an individual row are coupled by a common word line, and a word line associated with one row of memory cells is different than a word line associated with a different row of memory cells.

Example 91 includes the subject matter of any of Examples 89-90, and further specifies that a bit line has a width between 10 nanometers and 50 nanometers.

Example 92 includes the subject matter of any of Examples 83-91, and further specifies that a word line is spaced apart from a channel of the transistor in an individual memory cell by a gate dielectric.

Example 93 includes the subject matter of Example 92, and further specifies that the gate dielectric at least partially wraps around the word line.

Example 94 includes the subject matter of any of Examples 92-93, and further specifies that the gate dielectric has a thickness between 2 nanometers and 20 nanometers.

Example 95 includes the subject matter of any of Examples 92-94, and further specifies that the word line has a width between 25 nanometers and 80 nanometers.

Example 96 includes the subject matter of any of Examples 92-95, and further specifies that the word line has a height between 5 nanometers and 20 nanometers.

Example 97 includes the subject matter of any of Examples 92-96, and further specifies that the gate dielectric is between the word line and the capacitor of the individual memory cell.

Example 98 includes the subject matter of any of Examples 92-97, and further specifies that the gate dielectric extends continuously between the word line and a channel of the transistor, between the word line and the capacitor, and between the word line and an insulating material, and the word line is between the insulating material and the channel of the transistor.

Example 99 includes the subject matter of Example 98, and further specifies that the insulating material has a thickness between 10 nanometers and 20 nanometers.

Example 100 includes the subject matter of any of Examples 92-99, and further specifies that a spacer is adjacent to the word line, and the spacer is spaced apart from a channel of the transistor in the individual memory cells by the gate dielectric.

Example 101 includes the subject matter of Example 100, and further specifies that the spacer has a width between 5 nanometers and 20 nanometers.

Example 102 includes the subject matter of any of Examples 100-101, and further specifies that a height of the spacer is equal to a height of the word line.

Example 103 includes the subject matter of any of Examples 100-102, and further specifies that the spacer is in contact with a bit line.

Example 104 includes the subject matter of any of Examples 100-103, and further specifies that the gate dielectric extends continuously between the spacer and a channel of the transistor and between the spacer and an insulating material, and the spacer is between the insulating material and the channel of the transistor.

Example 105 includes the subject matter of any of Examples 102-104, and further specifies that the gate dielectric has a C-shaped cross-section.

Example 106 includes the subject matter of any of Examples 83-105, and further specifies that individual memory cells in the three-dimensional array are arranged into a two-dimensional array of columns oriented perpendicular to the surface, individual capacitors in individual memory cells include a first plate, a second plate, and a capacitor dielectric between the first plate and the second plate, and the capacitor dielectric of different ones of the capacitors in an individual column of memory cells is provided by a continuous portion of capacitor dielectric.

Example 107 includes the subject matter of Example 106, and further specifies that the first plate of a capacitor in a memory cell has a C-shaped cross-section.

Example 108 includes the subject matter of any of Examples 106-107, and further specifies that the second plates of different ones of the capacitors in an individual column of memory cells is provided by a common second plate.

Example 109 includes the subject matter of any of Examples 106-108, and further specifies that the second plate of a capacitor in a first memory cell is also a second plate of a capacitor in a second memory cell different from the first memory cell, wherein the second plate of the capacitor in the first memory cell is between a transistor of the first memory cell and a transistor of the second memory cell.

Example 110 includes the subject matter of any of Examples 106-109, and further specifies that the first plates of the capacitors in a first column of memory cells are mirror images of the first plates of the capacitors in a second column of memory cells, and the first column of memory cells shares the second plate of the capacitors with the second column of memory cells.

Example 111 includes the subject matter of any of Examples 106-110, and further specifies that the first plate has a thickness between 2 nanometers and 5 nanometers.

Example 112 includes the subject matter of any of Examples 106-111, and further specifies that the capacitor dielectric has a thickness between 2 nanometers and 5 nanometers.

Example 113 includes the subject matter of any of Examples 106-112, and further specifies that the second plate has a trunk portion and multiple branch portions.

Example 114 includes the subject matter of any of Examples 113, and further specifies that the trunk portion has a width between 3 nanometers and 18 nanometers.

Example 115 includes the subject matter of any of Examples 113-114, and further specifies that an individual branch portion has a height between 10 nanometers and 100 nanometers.

Example 116 includes the subject matter of any of Examples 113-115, and further specifies that an individual branch portion has a width between 45 nanometers and 400 nanometers.

Example 117 includes the subject matter of any of Examples 83-116, and further specifies that individual memory cells in the three-dimensional array are arranged into a two-dimensional array of columns oriented perpendicular to the surface, the transistors of a first column of memory cells are mirror images of the transistors of a second column of memory cells adjacent to the first column of memory cells.

Example 118 includes the subject matter of any of Examples 83-117, and further specifies that the three-dimensional array of memory cells is included in a front-end of the die.

Example 119 includes the subject matter of any of Examples 83-117, and further specifies that the three-dimensional array of memory cells is included in a back-end of the die.

Example 120 includes the subject matter of any of Examples 83-119, and further specifies that the memory device includes a number of layers of memory cells stacked perpendicular to the surface of the support, and the number is between 20 and Example 64.

Example 121 includes the subject matter of any of Examples 83-120, and further specifies that the die further includes logic transistors.

Example 122 includes the subject matter of any of Examples 83-121, and further includes: a circuit board, wherein the IC package is coupled to the circuit board.

Example 123 includes the subject matter of Example 122, and further specifies that the circuit board is a motherboard.

Example 124 includes the subject matter of any of Examples 122-123, and further includes: a display device communicatively coupled to the circuit board.

Example 125 includes the subject matter of any of Examples 122-124, and further includes: wireless communication circuitry communicatively coupled to the circuit board.

Example 126 includes the subject matter of any of Examples 83-125, and further specifies that the computing device is a handheld computing device or a server computing device.

Example 127 includes the subject matter of any of Examples 83-125, and further specifies that the support includes a semiconductor substrate.

Example 128 includes the subject matter of any of Examples 83-125, and further specifies that the support includes one or more layers of a metallization stack.

The invention claimed is:

1. An integrated circuit (IC) device, comprising:

a substrate;

a stack of memory cells above one another over the substrate; and a conductive structure, wherein individual memory cells of the stack include a transistor and a capacitor comprising a capacitor electrode, a first end of a channel of the transistor in an individual memory cell is electrically coupled with the capacitor of the individual memory cell, the conductive structure is electrically coupled with a second end of the channel of different ones of the individual memory cells of the stack, the stack of memory cells includes a first memory cell and a second memory cell, the capacitor electrode of the capacitor of the first memory cell and the capacitor electrode of the capacitor of the second memory cell are portions of a materially continuous conductive material, and, wherein, in a cross-section of the IC device in a plane perpendicular to the substrate:

the capacitor electrode of the capacitor of the first memory cell has a first width in a first plane parallel to the substrate and a second width in a second plane parallel to the substrate, the first width of the capacitor electrode of the capacitor of the first memory cell is smaller than the second width of the capacitor electrode of the capacitor of the first memory cell, the capacitor electrode of the capacitor of the second memory cell has a first width in a third plane parallel to the substrate and a second width in a fourth plane parallel to the substrate, the first width of the capacitor electrode of the capacitor of the second memory cell is smaller than the second width of the capacitor electrode of the capacitor of the second memory cell, the first plane is between the substrate and the second plane, the second plane is between the first plane and the third plane, and the third plane is between the second plane and the fourth plane.

2. The IC device of claim 1, wherein the conductive structure is perpendicular to the substrate.

3. The IC device of claim 1, wherein a capacitor dielectric of different ones of the capacitors of the individual memory cells of the stack is a materially continuous capacitor dielectric.

4. The IC device of claim 3, wherein a dimension of the materially continuous capacitor dielectric measured in directions away from the substrate is larger than a dimension of the materially continuous capacitor dielectric measured in directions parallel to the substrate.

5. The IC device of claim 1, wherein a dimension of the materially continuous conductive material measured in directions away from the substrate is larger than a dimension of the materially continuous conductive material measured in directions parallel to the substrate.

6. The IC device of claim 1, further comprising a plurality of word lines, wherein:

different word lines of the plurality of word lines are electrically coupled to gates of different ones of the transistors of the individual memory cells of the stack, and the plurality of word lines are parallel to the substrate.

7. The IC device of claim 6, wherein the conductive structure is perpendicular to the substrate.

8. The IC device of claim 1, wherein:

the IC device is an IC package, the IC package includes a package substrate and a die coupled to the package substrate, and the die includes the substrate, the stack of memory cells, and the conductive structure.

9. The IC device of claim 8, further comprising:

a circuit board, wherein the IC package is coupled to the circuit board.

10. An integrated circuit (IC) device, comprising:

a substrate; and a stack of memory cells above one another over the substrate;

wherein individual memory cells of the stack include a transistor and a capacitor, a first end of a channel of the transistor in an individual memory cell is electrically coupled with the capacitor of the individual memory cell, a second end of the channel is electrically coupled with a conductive pillar, a capacitor electrode of different ones of the capacitors of the individual memory cells of the stack is a materially continuous capacitor electrode, and wherein:

the materially continuous capacitor electrode has a first dimension in a first plane parallel to the substrate, a second dimension in a second plane parallel to the substrate, and a third dimension in a third plane parallel to the substrate, the first plane is between the substrate and the second plane, the second plane is between the first plane and the third plane, and the second dimension is smaller than the first dimension and the third dimension.

11. The IC device of claim 10, wherein a dimension of the materially continuous capacitor electrode measured in directions away from the substrate is larger than a dimension of the materially continuous capacitor electrode measured in directions parallel to the substrate.

12. The IC device of claim 10, wherein the conductive pillar is perpendicular to the substrate.

13. The IC device of claim 10, wherein a capacitor dielectric of different ones of the capacitors of the individual memory cells of the stack is a materially continuous capacitor dielectric.

14. The IC device of claim 10, wherein:

the IC device is an IC package, the IC package includes a package substrate and a die coupled to a surface of the package substrate, and the die includes the substrate, the stack of memory cells, and the conductive pillar.

15. The IC device of claim 14, further comprising:

a circuit board, wherein the IC package is coupled to the circuit board.

16. An integrated circuit (IC) device, comprising:

a substrate having a surface; and a stack of memory cells above one another over the surface of the substrate;

wherein individual memory cells of the stack include a transistor and a capacitor, a channel of the transistor in an individual memory cell is electrically coupled with the capacitor of the individual memory cell, and the transistor includes a gate comprising a gate electrode and a gate insulator, and wherein, in a cross-section of the IC device along a plane perpendicular to the substrate and along a line parallel to the substrate, a portion of the gate insulator is between the capacitor and the gate electrode.

17. The IC device of claim 16, further comprising:

a word line coupled to the gate of the transistor of one of the individual memory cells, wherein a first plane of the two different planes includes the word line, a second plane of the two different planes does not include the word line, and a dimension of the electrically continuous capacitor electrode in the first plane is larger than a dimension of the electrically continuous capacitor electrode in the second plane.

18. The IC device of claim 16, wherein a capacitor electrode of different ones of the capacitors of the individual memory cells of the stack is an electrically continuous capacitor electrode, and the electrically continuous capacitor electrode has different dimensions in two different planes parallel to the surface of the substrate.

19. The IC device of claim 18, wherein:

the capacitor includes a capacitor insulator, the capacitor electrode is a first capacitor electrode, the capacitor further includes a second capacitor electrode, and in the cross-section of the IC device along the plane perpendicular to the substrate and along the line parallel to the substrate:

the portion of the gate insulator is between the second capacitor electrode and the gate electrode, and the capacitor insulator is between the first capacitor electrode and the second capacitor electrode.

20. The IC device of claim 16, wherein:

the IC device is an IC package, the IC package includes a package substrate and a die coupled to the package substrate, and the die includes the substrate and the stack of memory cells.

* * * * *